(12) United States Patent
Watanabe et al.

(10) Patent No.: US 7,074,544 B2
(45) Date of Patent: Jul. 11, 2006

(54) IMAGE RECORDING MATERIAL

(75) Inventors: Kotaro Watanabe, Shizuoka-ken (JP); Kazuto Kunita, Shizuoka-ken (JP); Kunihiko Kodama, Shizuoka-ken (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 82 days.

(21) Appl. No.: 11/018,259

(22) Filed: Dec. 22, 2004

(65) Prior Publication Data

US 2005/0142484 A1 Jun. 30, 2005

(30) Foreign Application Priority Data

Dec. 26, 2003 (JP) ............................. 2003-433712

(51) Int. Cl.
*G03F 7/039* (2006.01)
*G03F 7/11* (2006.01)
(52) U.S. Cl. ............................... 430/271.1; 430/270.1; 430/330; 430/905; 430/909; 430/910; 430/964
(58) Field of Classification Search ............ 430/270.1, 430/271.1, 330, 905, 909, 910, 964
See application file for complete search history.

(56) References Cited

U.S. PATENT DOCUMENTS

| | | | |
|---|---|---|---|
| 6,723,490 B1 * | 4/2004 | Patel et al. ............... | 430/271.1 |
| 6,733,951 B1 * | 5/2004 | Kodama ................... | 430/270.1 |
| 2003/0108814 A1 * | 6/2003 | Miyake et al. ............ | 430/271.1 |
| 2004/0152012 A1 * | 8/2004 | Iwato ....................... | 430/270.1 |

* cited by examiner

*Primary Examiner*—Richard L. Schilling
(74) *Attorney, Agent, or Firm*—Sughrue Mion, PLLC

(57) ABSTRACT

A positive image recording material applicable to infrared laser comprising a support whereon is formed a photosensitive/heatsensitive layer containing (A) an alkali-soluble resin, (B) a photothermal conversion substance, and (C) at least one compound selected from a group of compounds defined by the formulae (I), (II), (III), and (IV) exhibiting improved solubility to an alkaline developer following exposure with an infrared laser

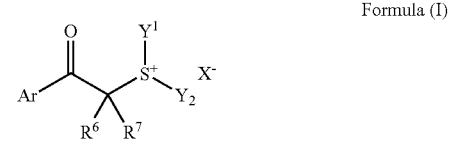

Formula (I)

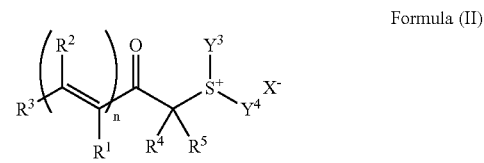

Formula (II)

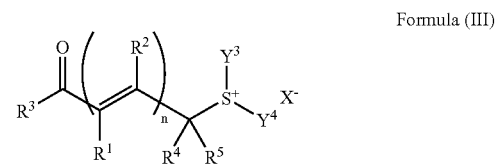

Formula (III)

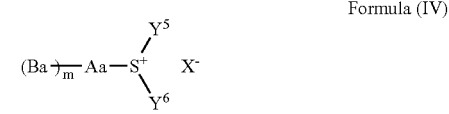

Formula (IV)

wherein the substituent groups of the formulae (I) to (IV) are specified in the specification for this invention.

19 Claims, No Drawings

IMAGE RECORDING MATERIAL

CROSS-REFERENCE TO RELATED APPLICATION

This application claims priority under 35 USC 119 from Japanese patent application, No. 2003-433712, the disclosure of which is incorporated by reference herein.

BACKGROUND OF THE INVENTION

1. Field of the Invention

The present invention relates to an image recording material, provided on a support and comprising a photosensitive/heat sensitive layer with improved solubility to an alkaline developer by exposure. More particularly it relates to a so-called direct plate-making positive image recording material usable for direct plate-making by scanning a laser beam with a high energy density, such as an infrared laser beam, based on digital signals from a computer or the like.

2. Description of the Related Art

Lasers have advanced remarkably recently, and especially compact and high powered solid lasers and semiconductor laser, having light emissions in the near infrared to infrared regions, have become readily available. Recording by changing the solubility of photosensitive resins by exposure using such high power lasers (generally, the exposure energy density is greater than 5 kW to 10 kW/cm$^2$) is called heat mode recording or thermal recording. This way of recording has recently been drawing attention in the field of planographic printing for recording in direct plate-making methods for directly producing master plates from digital data of a computer or the like.

Specifically, commercialized and made available are: thermal positive type planographic printing plate precursors, comprising photosensitive layers provided on a support and whose solubility is increased by high power laser exposure (called positive type photosensitive layers); or thermal negative type planographic printing plates comprising photosensitive layers provided on a support whose solubility is decreased by high power laser exposure (called negative type photosensitive layers).

Positive type image recording materials for infrared lasers for direct plate making are image recording materials obtained by adding to an alkali-soluble resin a substance which absorbs light and generates heat, and a positive type photosensitive compound, such as a quinonediazido compound. The positive type photosensitive compound works as a dissolution inhibitor by effectively decreasing the solubility of the aqueous alkaline solution-soluble resin in the image areas. And in the non-image areas, the photosensitive compound is decomposed by heat and-therefore does not show dissolution inhibition, and the aqueous alkaline solution-soluble resin becomes removable by development to form images. A variety of alkali-soluble resins and dissolution inhibitors are proposed (reference to Japanese Patent Application Laid-Open Nos. 7-285275, 10-268512, and Japanese Patent Application National Publication No. 11-506550).

However, known photosensitive compositions used as recording layers of known thermal positive type planographic printing plate precursors have insufficient difference of the solubility to developers between exposed portions and non-exposed portions (solubility discrimination) and excess development or defective development attributed to variation of conditions of use is easily caused and accordingly, problems often results where the contrast of images developed after exposure becomes insufficient.

As a method for improving the image discrimination of a positive type planographic printing plate material, techniques of adding phenolic hydroxyl-containing compounds have been proposed (reference to Japanese Patent Application Laid-Open (JP-A) No. 2000-241966). However, whilst the phenolic hydroxyl-containing compounds improve the removability (solubility) of the non-image portions to alkaline developers, on the other hand, the compounds also, at the same time, increase the solubility of the image portions. This means that the sharpness of images deteriorates and this tendency is particularly noticeable in the case of thin lines and dotted image regions with low density coverage. In such situations, an improvement in image recording materials in terms of contrast has been desired.

SUMMARY OF THE INVENTION

The present invention has been made in view of the above circumstances and provides a positive image recording material which makes possible producing a printing plate at a high sensitivity directly from digital data of a computer or the like, which material enables recording by infrared laser to be carried out and gives excellent latitude in development and high contrast even in portions which are doted or have thin lines.

Based on the results of investigations, inventors of the invention have found that the above mentioned aims can be satisfied by adding compounds having specific structures to the photosensitive/heat sensitive layers of image recording materials and thus have accomplished the invention.

That is, according to a first aspect of the invention, a positive image recording material of the invention for use with an infrared laser comprises a support and a photosensitive/heat sensitive layer formed on the support. The photosensitive/heat sensitive layer containing (A) an alkali-soluble resin, (B) a photothermal conversion substance, and (C) at least one compound selected from a group of compounds defined by the formulae (I), (II), (III), and (IV) and exhibiting improved solubility to an alkaline developer, following infrared laser exposure.

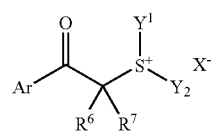

Formula (I)

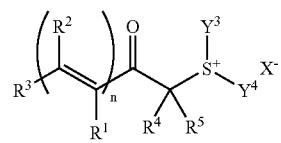

Formula (II)

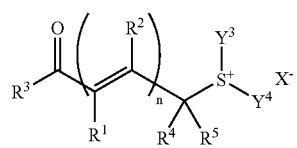

Formula (III)

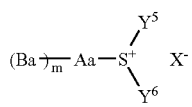

Formula (IV)

In the formula (I): Ar represents an aryl or an aromatic group containing a hetero atom; $R^6$ represents a hydrogen atom, a cyano group, an alkyl group, or an arylgroup; $R^7$ represents an alkyl group or an aryl group; $Y^1$ and $Y^2$ may be same as or different from each other and independently represent an alkyl group, an aryl group, an aralkyl group, or an aromatic group containing a hetero atom; $Y^1$ and $Y^2$ may be bonded to each other to form a ring; Ar may be bonded to at least one of $Y^1$ and $Y^2$ to form a ring; Ar and $R^6$ may be bonded to form a ring; and $X^-$ represents a non-nucleophilic anion. The compound may comprise two or more groups defined by the formula (I) bonded together through linking groups at the positions of Ar, $R^6$ or $R^7$ or at the positions of $Y^1$ or $Y^2$.

In the formulae (II) and (III): $R^1$ to $R^3$ may be same as or different from one another and independently represent a hydrogen atom, an alkyl, an alkenyl, an aryl, or an alkoxy; $R^4$ and $R^5$ may be same as or different from each other and independently represent a hydrogen atom, a cyano group, an alkyl, an aryl, or an alkoxy; $Y^3$ and $Y^4$ may be same as or different from each other and independently represent an alkyl, an aryl, an aralkyl, or an aromatic group containing a hetero atom; n represents an integer of 1 to 4; if n is 2 or higher, the plural groups represented by $R^1$ and $R^2$ may be respectively the same or different from each other; two or more groups represented by $R^1$ to $R^5$, $Y^3$ and $Y^4$ may be bonded together to form a ring structure; and $X^-$ represents a non-nucleophilic anion. The compound may comprise two or more groups defined by the formulae (II) and (III) bonded together through linking groups at the positions of $R^1$ to $R^5$, $Y^3$ or $Y^4$.

In the formula (IV): $Y^5$ and $Y^6$ independently represent an alkyl, an aryl, an aralkyl, a heterocyclic group, an oxoalkyl, or an oxoaralkyl; $Y^5$ and $Y^6$ may be bonded to each other to form a ring; Aa represents a single bond or an organic group; Ba represents a group having a —CON(Ra)— bond or a group having a —SO$_2$N(Ra)— bond; Ra represents a hydrogen atom or an alkyl; m represents an integer of 1 to 3; and $X^-$ represents a non-nucleophilic anion.

According to a second aspect of the invention, a positive image recording material comprises a support, an alkaline developer-soluble first layer formed on the support, and a second layer formed on the first layer exhibiting improved solubility to an alkaline developer following exposure to an infrared laser, wherein at least one of the first or the second layers contains at least one type compound selected from a group of compounds defined by the above-mentioned formulae (I), (II), (III), and (IV).

A preferable embodiment of the invention is that the alkaline developer-soluble first layer of recording layers with a multilayer structure (that is with a first and a second layer) contains at least one type compound selected from a group of compounds defined by the above-mentioned formulae (I), (II), (III), and (IV).

The functional mechanism of the invention is not clear, however it is assumed to be as follows.

The group of compounds defined by the above-mentioned formulae (I), (II), (III), and (IV) to be added to the photosensitive/heat sensitive layer in the image recording material of the invention may cause interactions between the sulfonium salt structure of the compounds and the acid group of the alkali-soluble resin. Accordingly, it is supposed that the alkali solubility is effectively suppressed in non-exposure portions (image portions) to provide dissolution resistance to an alkaline developer. Also, it is supposed that the interactions are easily released by heat in the exposed portions (non-image portions), and owing to a function of acid groups derived from active methylene structures, high alkali solubility is obtained.

Such effects stand out particularly with thin lines and ultrafine dots and as a result, conventional difficulties that accompany high sensitization, that is, low resolution and development discrimination deterioration, can be suppressed. Accordingly, high resolution and high development discrimination can be achieved while high sensitivity is maintained.

The image recording material of the invention makes possible producing printing plates at a high sensitivity directly based on digital data of a computer or the like by recording using infrared radiation from a solid laser or a semiconductor laser. Images with excellent development latitude and contrast, and having high resolution, can be made.

DETAILED DESCRIPTION OF THE INVENTION

A photosensitive/heat sensitive layer of a positive type image recording material of the present invention contains (A) an alkali-soluble resin, (B) a photothermal conversion substance, and (C) at least one compound selected from a group of compounds defined by the formulae (I), (II), (III), and (IV) (hereinafter, occasionally referred to as (C) specific compound) and exhibiting improved solubility to an alkaline developer following infrared laser exposure. Hereinafter, the respective components to be used for the image recording material of the invention will be described.

The photosensitive/heat sensitive layer of the image recording material of the invention may have a single layer structure as well as a multilayer structure. In the case of the recording layer with a multilayer structure, (C) the specific compound, which is a characteristic component of the invention, may be contained in any layer of the multilayer structure. However, the compound is preferably contained in the alkali developer soluble first layer formed between a support and the layer sensitive to infrared laser, in terms of the effect of the invention.

[(C) Specific Compound]

(C) The specific compound, which is a characteristic component of the invention, is at least one compound selected from a group of compounds defined by the formulae (I), (II), (III), and (IV). Hereinafter the respective compounds will be described in details.

At first, the compound defined by the formula (I) will be described.

Formula (I)

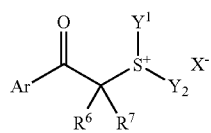

In the formula (I), Ar represents an aryl or an aromatic group containing a hetero atom; $R^6$ represents a hydrogen atom, a cyano group, an alkyl, or an aryl; $R^7$ represents an alkyl or an aryl; $Y^1$ and $Y^2$ may be same as or different from each other and independently represent an alkyl, an aryl, an aralkyl, or an aromatic group containing a hetero atom; $Y^1$ and $Y^2$ may be bonded to each other to form a ring; Ar and at least one of $Y^1$ and $Y^2$ may be bonded to form a ring; Ar and $R^6$ may be bonded to form a ring; the compound may comprise two or more groups defined by the formula (I) bonded together through linking groups at the positions of Ar, $R^6$ or $R^7$ or at the positions of $Y^1$ or $Y^2$; and $X^-$ represents a non-nucleophilic anion.

The compound defined by the formula (I) is preferably a compound defined by the following formula (Ia):

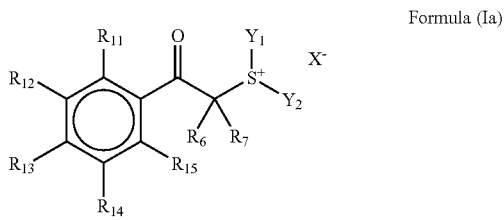

Formula (Ia)

wherein $R^{11}$ to $R^{15}$ may be same as or different from one another and independently represent a hydrogen atom, a nitro group, a halogen atom, an alkyl, an alkoxy, an alkyloxycarbonyl, an aryl or an acylamino group; at least two of $R^{11}$ to $R^{15}$ may be bonded to form a ring structure; $R^6$ represents a hydrogen atom, a cyano group, an alkyl, or an aryl; $R^7$ represents an alkyl or an aryl; $Y^1$ and $Y^2$ may be same as or different from each other and independently represent an alkyl, an aryl, an aralkyl, or an aromatic group containing a hetero atom; $Y^1$ and $Y^2$ may be bonded to each other to form a ring; at least one of $R^{11}$ to $R^{15}$ and at least one of $Y^1$ and $Y^2$ may be bonded to form a ring; at least one of $R^{11}$ to $R^{15}$ and $R^6$ may be bonded to form a ring; the compound may comprise two or more groups defined by the formula (Ia) bonded together through linking groups at the positions of $R^{11}$ to $R^{15}$, $R^6$ or $R^7$ or at the position of $Y^1$ or $Y^2$; and $X^-$ represents a non-nucleophilic anion.

The formula (I) and the formula (Ia) will be described more in details.

The aryl group represented by Ar is preferably an aryl having 6 to 18 carbon atoms such as phenyl, naphthyl and anthracenyl. Phenyl and naphthyl are preferable, and phenyl is more preferable.

The aromatic group containing a hetero atom represented by Ar is preferably an aryl having 6 to 18 carbon atoms containing a hetero atom such as a nitrogen atom, an oxygen atom, and a sulfur atom.

The alkyl (and the alkyl of the acylamino group) represented by $R^{11}$ to $R^{15}$, $R^6$, and $R^7$ are preferably an alkyl having 1 to 20 carbon atoms and examples of the alkyl include straight, branched, and cyclic alkyls such as methyl, ethyl, propyl, n-butyl, sec-butyl, tert-butyl, cyclobutyl, pentyl, neopentyl, cyclopentyl, hexyl, cyclohexyl, heptyl, octyl, nonyl, and decyl.

The alkoxy group and the alkoxy group of the alkyloxycarbonyl represented by $R^{11}$ to $R^{15}$ are preferably an alkoxy group having 1 to 10 carbon atoms and examples of the alkoxy include methoxy, ethoxy, propoxy, butoxy, pentyloxy, hexyloxy, cyclohexyloxy, heptyloxy, octyloxy, nonyloxy, and decyloxy.

The aryl represented by $R^{11}$ to $R^{15}$, $R^6$, and $R^7$ is preferably an aryl having 6 to 14 carbon atoms and examples are phenyl, tolyl, and naphthyl.

The halogen atom represented by $R^{11}$ to $R^{15}$ is fluorine atom, chlorine atom, bromine atom, and iodine atom.

The alkyl represented by $Y^1$ and $Y^2$ is preferably a straight chain or branched alkyl having 1 to 30 carbon atoms such as methyl, ethyl, propyl, n-butyl, sec-butyl, and tert-butyl and cyclic alkyl such as cyclopropyl, cyclopentyl, cyclohexyl, adamantyl, norbonyl and boronyl.

The aryl represented by $Y^1$ and $Y^2$ is preferably an aryl having 6 to 14 carbon atoms such as phenyl, tolyl, and naphthyl.

The aralkyl represented by $Y^1$ and $Y^2$ is preferably an aralkyl having 7 to 12 carbon atoms such as benzyl, phenethyl, and cumyl.

The heteroatom-containing aromatic group represented by $Y^1$ and $Y^2$ is preferably an aryl group having 6 to 14 carbon atoms and containing a heteroatom such as a nitrogen atom, an oxygen atom, and a sulfur atom. Examples thereof include heterocyclic hydrocarbon groups such as furan, thiophene, pyrrole, pyridine, and indole.

Ar may have two or more substituent groups and at least two substituent groups of them may be bonded to each other to form a ring.

In this case, the group formed by bonding at least two substituent groups is preferably an alkylene having 4 to 10 carbon atoms such as butylene, pentylene and hexylene.

At least two or more groups $R^{11}$ to $R^{15}$ may be bonded to each other to form a ring structure.

In this case, the group formed by bonding at least two groups $R^1$ to $R^5$ is preferably an alkylene having 4 to 10 carbon atoms such as butylene, pentylene and hexylene.

$Y^1$ and $Y^2$ may be bonded to $S^+$ to form a ring.

In this case the group formed by bonding $Y^1$ and $Y^2$ is preferably an alkylene having 4 to 10 carbon atoms and examples of them are preferably butylene, pentylene and hexylene, and more preferably butylene and pentylene.

Rings formed by bonding $Y^1$ and $Y^2$ together with $S^+$ may include a heteroatom.

The aryl, heteroatom-containing aromatic group, alkyl, alkoxy, alkoxycarbonyl, aralkyl, and acylamino group represented by Ar, $R^{11}$ to $R^{15}$, $R^6$, $R^7$, $Y^1$ and $Y^2$ may have no substituent group or may have substituent groups. Examples of the substituent groups which may be included in the aryl, alkyl, alkoxy, alkoxycarbonyl, and aralkyl represented by Ar, $R^{11}$ to $R^{15}$, $R^6$, $R^7$, $Y^1$ and $Y^2$ include a nitro group, a halogen atom, carboxyl, hydroxyl, an amino group, a cyano group, an alkoxy (preferably having 1 to 5 carbon atoms), an alkyl (preferably having 1 to 20 carbon atoms), an aryl (preferably having 6 to 14 carbon atoms), and an alkoxycarbonyloxy group (preferably having 2 to 7 carbon atoms).

As the substituent group for the alkyl a halogen atom is preferable and a fluoro atom is particularly preferable.

Ar and at least one of $Y^1$ and $Y^2$ may be bonded to form a ring or Ar and $R^6$ may be bonded to form a ring.

As the group formed by bonding Ar and at least one of $Y^1$ and $Y^2$ and as the group formed by bonding Ar and $R^6$, alkylene groups having 1 to 10 carbon atoms are preferable and examples of the groups include methylene group, ethylene group, propylene group, butylene group, pentylene group, and hexylene group. The group formed by bonding Ar and $R^6$ is preferably carbonyl.

At least one of $R^{11}$ to $R^{15}$ and at least one of $Y^1$ and $Y^2$ may be bonded to from a ring or at least one of $R^{11}$ to $R^{15}$ and $R^6$ may be bonded to form a ring.

As the group formed by bonding at least one of $R^{11}$ to $R^{15}$ and at least one of $Y^1$ and $Y^2$ and as the group at least one of $R^{11}$ to $R^{15}$ and $R^6$, alkylene groups having 1 to 10 carbon atoms are preferable and examples of the groups are methylene group, ethylene group, propylene group, butylene group, pentylene group, and hexylene group. The group formed by bonding at least one of $R^{11}$ to $R^{15}$ and $R^6$ may be also preferably carbonyl.

The compound may comprise two or more groups defined by the formula (I) bonded together through linking groups at the positions of Ar, $R^6$ or $R^7$ or at the positions of $Y^1$ or $Y^2$.

the compound may comprise two or more groups defined by the formula (Ia) bonded together through linking groups at the positions of $R^{11}$ to $R^{15}$, $R^6$ or $R^7$ or at the position of $Y^1$ or $Y^2$;

The compounds defined by the formula (I) are preferably those comprising alkyl groups for both $R^6$ and $R^7$, preferably C2–C20 alkyl for $R^7$ and more preferably C4–C20 alkyl for $R^7$. Also, in the case $R^5$ and $R^6$ are bonded to form a ring, $R^7$ is preferably an alkyl having 1 to 20 carbon atoms.

As a non-nucleophilic anion represented by $X^-$, sulfonic acid anion, carboxylic acid anion, sulfonylimido anion, bis(alkylsulfonyl)imido anion, and tris(alkylsulfonyl)methyl anion can be exemplified. Herein, the non-nucleophilic anion is an anion with considerably low ability to cause a nucleophilic reaction, that is, an anion capable of suppressing decomposition with age attributable to an intramolecular nucleophilic reaction.

As the sulfonic acid anion, alkylsulfonic anion, arylsulfonic acid anion, and camphor sulfonic acid anion can be exemplified.

As the carboxylic acid anion, alkylcarboxylic acid anion, arylcarboxylic acid anion, and aralkylcarboxylic acid anion can be exemplified.

The alkyl in the alkylsulfonic acid anion is preferably an alkyl having 1 to 30 carbon atoms, and methyl, ethyl, propyl, isopropyl, n-butyl, isobutyl, sec-butyl, pentyl, neopentyl, hexyl, heptyl, octyl, nonyl, decyl, undecyl, dodecyl, tridecyl, tetradecyl, pentadecyl, hexadecyl, heptadecyl, octadecyl, nonadecyl, eicosyl, cyclopropyl, cyclopentyl, cyclohexyl, adamantyl, norbonyl, and boronyl can be exemplified.

The aryl in the arylsulfonic acid anion is preferably an aryl having 6 to 14 carbon atoms, and phenyl, tolyl, and naphthyl can be exemplified.

The above alkyl and the aryl in the alkylsulfonic acid anion and the arylsulfonic acid anion may comprise substituent groups. As the substituent groups, a halogen atom, an alkyl, an alkoxy group, and an alkylthio group can be exemplified.

As the halogen atom to be introduced as the above-mentioned substituent group, a chlorine atom, a bromine atom, a fluorine atom, and an iodine atom can be exemplified.

As the alkyl to be introduced as the above-mentioned substituent group, an alkyl having 1 to 15 carbon atoms such as methyl, ethyl, propyl, isopropyl, n-butyl, isobutyl, sec-butyl, pentyl, neopentyl, hexyl, heptyl, octyl, nonyl, decyl, undecyl, dodecyl, tridecyl, tetradecyl, pentadecyl, hexadecyl, heptadecyl, octadecyl, nonadecyl, and eicosyl can be exemplified.

As the alkoxy group to be introduced as the above-mentioned substituent group, an alkoxy having 1 to 5 carbon atoms such as methoxy, ethoxy, propoxy, and butoxy can be exemplified.

As the alkylthio to be introduced as the above-mentioned substituent group, an alkylthio having 1 to 15 carbon atoms such as methylthio, ethylthio, propylthio, isopropylthio, n-butylthio, isobutylthio, sec-butylthio, pentylthio, neopentylthio, hexylthio, heptylthio, octylthio, nonylthio, decylthio, undecylthio, dodecylthio, tridecylthio, tetradecylthio, pentadecylthio, hexadecylthio, heptadecylthio, octadecylthio, nonadecylthio, and eicosylthio can be exemplified. Additionally, the alkyl, alkoxy group and alkylthio may be substituted further with a halogen atom (preferably a fluorine atom).

The alkyl in the alkylcarboxylic acid anion may be same as those exemplified for the alkyl in alkylsulfonic acid anion.

The aryl in the arylcarboxylic acid anion may be same as those exemplified for the aryl in arylsulfonic acid anion.

The aralkyl in the aralkylcarboxylic acid anion may be preferably an aralkyl having 6 to 12 carbon atoms and benzyl, phenethyl, naphthylmethyl, naphthylethyl, and naphthylmethyl can be exemplified.

The alkyl, aryl, and aralkyl of the above-mentioned alkylcarboxylic acid anion, arylcarboxylic acid anion, and aralkylcarboxylic acid anion may comprise substituent groups. As the substituent groups, the halogen atom, the alkyl, the alkoxy, and the alkylthio exemplified for the arylsulfonic acid anion can be exemplified.

As the sulfonylimido anion, saccharine anion can be exemplified.

As the alkyl in bis(alkylsulfonyl)imido anion and tris(alkylsulfonyl)methyl anion, alkyl having 1 to 5 carbon atoms is preferable. Examples of the alkyl are methyl, ethyl, propyl, isopropyl, n-butyl, isobutyl, sec-butyl, pentyl, and neopentyl. These alkyl groups may comprise substituent groups and as the substituent groups, a halogen atom, a halogen-substituted alkyl, an alkoxy, and alkylthio group can be exemplified and the fluoride-substituted alkyl is preferable.

As other non-nucleophilic anion, phosphorus fluoride, boron fluoride, and antimony fluoride can be exemplified.

As the non-nucleophilic anion represented by $X^-$, preferable examples are an alkanesulfonic acid anion having a fluorine atom as a substituent at $\alpha$-position of the sulfonic acid, an arylsulfonic acid anion having a fluorine atom or a group comprising a fluorine as a substituent, a bis(alkylsulfonyl)imido anion having a fluorine atom as a substituent for the alkyl, and a tris(alkylsulfonyl)methide anion having a fluorine atom as a substituent for the alkyl. More preferable example of the non-nucleophilic anion represented by $X^-$ is a perfluoroalkanesulfonic acid anion having 1 to 8 carbon atoms and even more preferable examples of the non-nucleophilic anion represented by $X^-$ are nonafluorobutanesulfonic acid anion and perfluorooctanesulfonic acid anion.

Practical examples (I-1 to I-66) of preferable compound defined by the above-mentioned formula (I) of the invention are as follows, however the compound of the invention should not be limited to these examples.

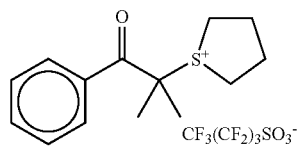

(I-1)

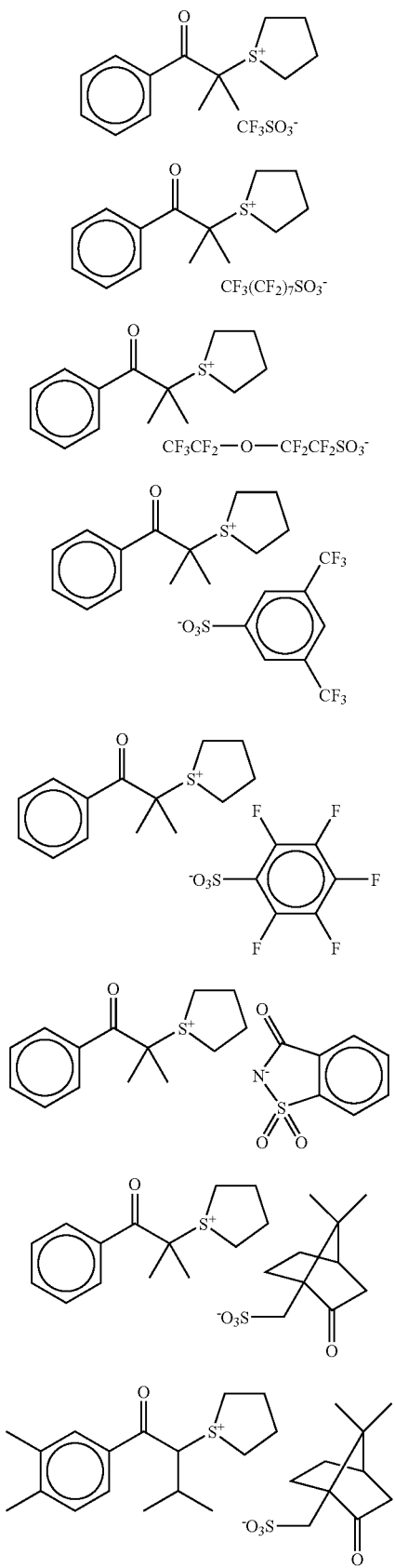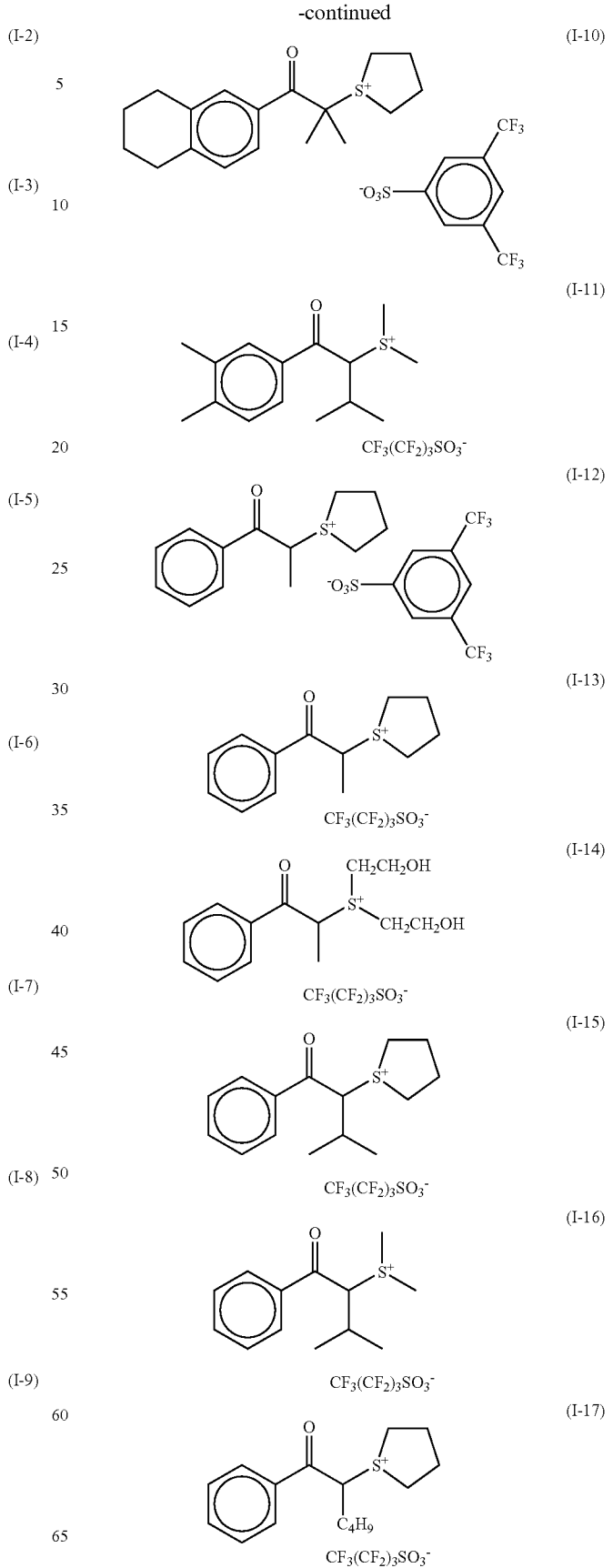

-continued (I-18) (I-25) (I-19) (I-26) (I-20) (I-27) (I-21) (I-28) (I-22) (I-29) (I-23) (I-30) (I-24) (I-31) (I-32)

-continued (I-33) through (I-46): chemical structures with counterions as labeled in the figure.

-continued
(I-47)
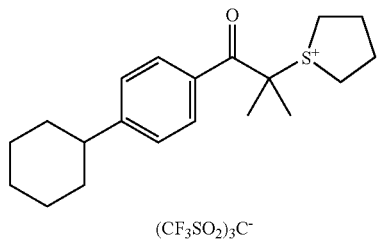
(CF₃SO₂)₃C⁻
(I-48)
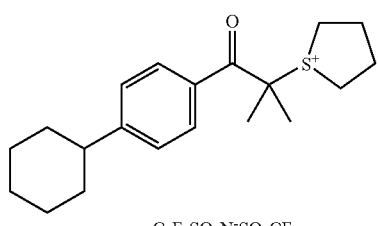
C₄F₉SO₂N⁻SO₂CF₃
(I-49)
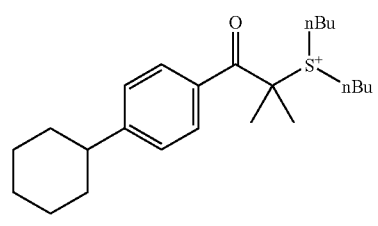
CF₃(CF₂)₃SO₃⁻
(I-50)
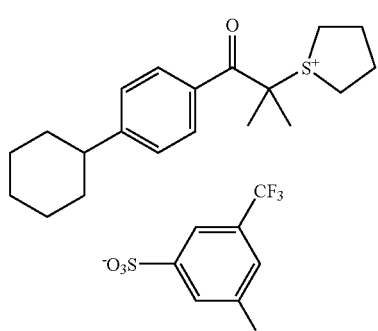
(I-51)
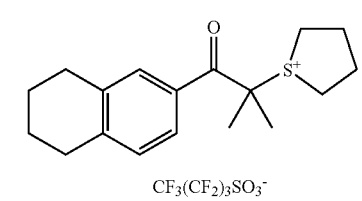
CF₃(CF₂)₃SO₃⁻
(I-52)
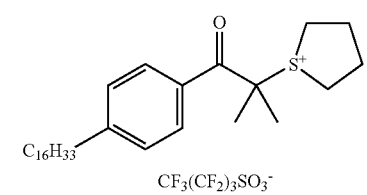
CF₃(CF₂)₃SO₃⁻
-continued
(I-53)
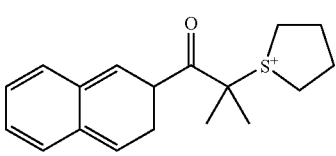
CF₃(CF₂)₃SO₃⁻
(I-54)
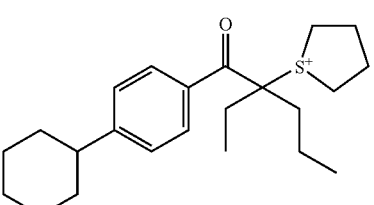
CF₃(CF₂)₃SO₃⁻
(I-55)
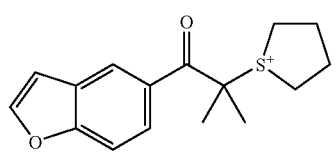
CF₃(CF₂)₃SO₃⁻
(I-56)
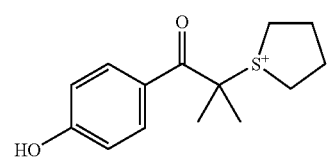
CF₃(CF₂)₃SO₃⁻
(I-57)
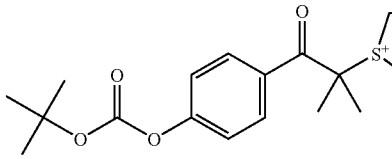
CF₃(CF₂)₃SO₃⁻
(I-58)
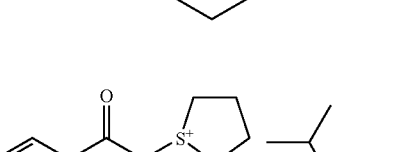
CF₃(CF₂)₃SO₃⁻
(I-59)

-continued

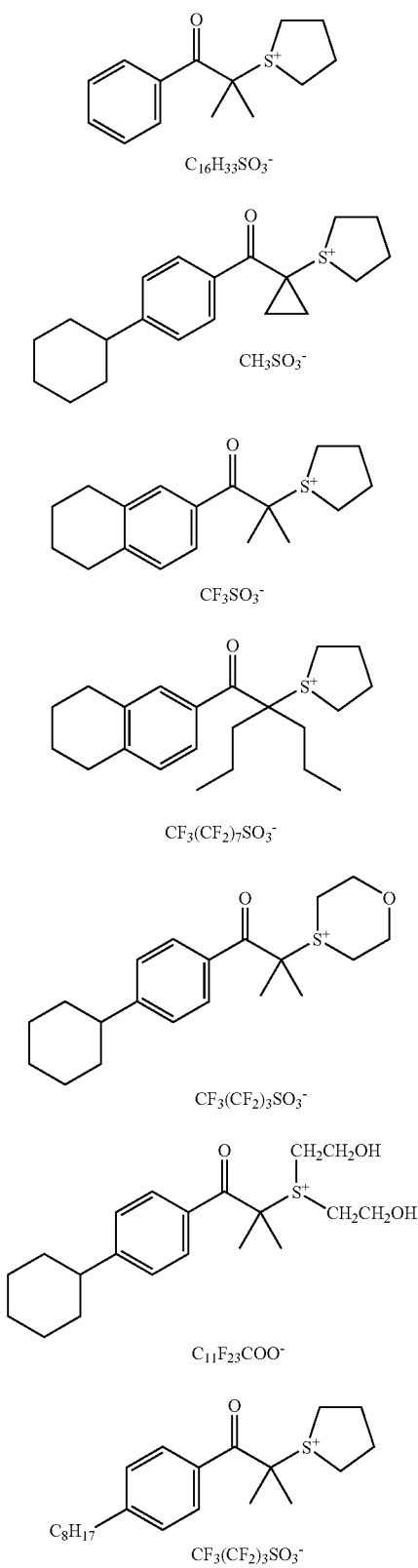

Next, the compounds defined by the formulae (II) and (III) will be described.

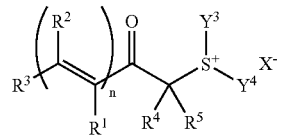

Formula (II)

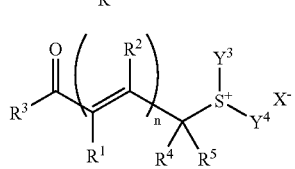

Formula (III)

In the formulae (II) and (III), $R^1$ to $R^3$ may be same as or different from one another and independently represent a hydrogen atom, an alkyl, an alkenyl, an aryl, or an alkoxyl which may have a substituent; $R^4$ and $R^5$ may be same as or different from each other and independently represent a hydrogen atom, a cyano group, an alkyl, an aryl, or an alkoxyl which may have a substituent; $Y^3$ and $Y^4$ may be same as or different from each other and independently represent an alkyl, an aryl, an aralkyl which may have a substituent, or an aromatic group including a hetero atom; n represents an integer of 1 to 4; if n is 2 or higher, a plurality of groups represented by $R^1$ and $R^2$ may be same or different; two or more groups represented by $R^1$ to $R^5$, $Y^3$ and $Y^4$ may be bonded to form a ring structure; the compound may comprise two or more groups defined by the formulae (II) and (III) bonded together through linking groups at the positions of $R^1$ to $R^5$, $Y^3$ or $Y^q$; and $X^-$ represents a non-nucleophilic anion.

The alkyl represented by $R^1$ to $R^5$, $Y^3$ and $Y^4$ may be a straight, branched, or cyclo-alkyl having 1 to 10 carbon atoms such as methyl, ethyl, propyl, n-butyl, sec-butyl, tert-butyl, pentyl, cyclopentyl, hexyl, and cyclohexyl. The alkyl may have an oxygen atom, a sulfur atom, and a carbon group in an alkyl chain.

The aryl represented by $R^1$ to $R^5$, $Y^3$ and $Y^4$ may be an aryl having 6 to 14 carbon atoms such as phenyl, tolyl, and naphthyl.

The alkenyl represented by $R^1$ to $R^3$ may be an alkenyl having 2 to 6 carbon atoms such as vinyl, propenyl, allyl, butenyl, pentenyl, hexenyl, cyclopentenyl, cyclohexenyl, 3-oxocyclopentenyl, and 3-oxocyclohexenyl.

The alkoxy group represented by $R^1$ to $R^5$ may be preferably an alkoxy having 1 to 8 carbon atoms such as methoxy, ethoxy, n-propoxy, iso-propoxy, butoxy, pentoxy, allyloxy, and octoxy.

The aralkyl represented by $Y^3$ and $Y^4$ may be an aralkyl having 7 to 12 carbon atoms such as benzyl, phenethyl, and cumyl.

The heteroatom-containing aromatic group may be aromatic group having 4 to 14 carbon atoms such as aryl and comprising a heteroatom such as a nitrogen atom, an oxygen atom, and a sulfur atom.

The heteroatom-containing aromatic group represented by $Y^3$ and $Y^4$ may be a heterocyclic aromatic hydrocarbon such as furan, thiophene, pyrrole, pyridine, and indole.

The ring structure formed by bonding two or more groups represented by $R^1$ to $R^3$, $R^4$, $R^5$, $Y^3$ and $Y^4$ may be, for example, the ring structure formed by bonding $R^1$ or $R^2$ to $R^3$; the ring structure formed by bonding $R^1$ or $R^2$ to $R^4$ or $R^5$; the ring structure formed by bonding $R^3$ to $R^4$ or $R^5$; and the ring structure formed by bonding $R^1$ to $R^2$ and to $R^4$ or $R^5$; the ring structure formed by bonding $R^1$ to $R^2$ to $R^3$ and to $R^4$ or $R^5$; and the ring structure formed by bonding $Y^3$ and $Y^4$ to $S^+$ in the formula (II) or (III).

In the case the ring structure is formed by bonding $R^1$ or $R^2$ to $R^3$, the group formed by bonding $R^1$ or $R^2$ to $R^3$ is preferably an alkylene having 1 to 10 carbon atoms such as methylene group, ethylene group, propylene group, butylene group, pentylene group, and hexylene group.

In the case the ring structure is formed by bonding $R^1$ or $R^2$ to $R^4$ or $R^5$, the group formed by bonding $R^1$ or $R^2$ to $R^4$ or $R^5$ is preferably an alkylene group and carbonyl. As the alkylene group, alkylene group having 1 to 10 carbon atoms such as methylene group, ethylene group, propylene group, butylene group, pentylene group, and hexylene group are preferable.

In the case the ring structure is formed by bonding $R^3$ to $R^4$ or $R^5$, the group formed by bonding $R^3$ to $R^4$ or $R^5$ is preferably alkylene group having 1 to 10 carbon atoms such as methylene group, ethylene group, propylene group, butylene group, pentylene group, and hexylene group.

In the case the ring structure is formed by bonding $R^1$ to $R^2$ to $R^4$ or $R^5$, and the ring structure formed by bonding $R^1$ to $R^2$ to $R^3$ and to $R^4$ or $R^5$ may be condensed to dicyclic ring structure having 5 to 15 carbon atoms which may have a hetero atom in the ring.

$Y^3$ and $Y^4$ may be bonded to form a ring structure together with $S^+$ in the formula (II) or (III).

In this case, the group formed by bonding $Y^3$ and $Y^4$ may be alkylene having 4 to 10 carbon atoms, and preferably butylene, pentylene, and hexylene and particularly preferably butylene and pentylene.

The ring formed by bonding $Y^3$ and $Y^4$ together with $S^+$ in the formula (II) or (III) may comprise a heteroatom.

The above-mentioned alkyl, alkenyl, aryl, aralkyl, aromatic group, and cyclic structure may have a substituent group such as a nitro group, a halogen, carboxyl, hydroxyl, an oxo group, an amino group, a cyano group, and an alkoxy (preferably having 1 to 5 carbon atoms). Further, the aryl and aralkyl may have a substituent group such as alkyl (preferably having 1 to 5 carbon atoms).

As the substituent group for alkyl, a halogen atom, hydroxyl, and an alkoxy group are preferable.

As the non-nucleophilic anion represented by $X^-$, sulfonic acid anion, carboxylic acid anion, bis(alkylsulfonyl)imido anion, and tris(alkylsulfonyl)methyl anion can be exemplified.

Herein, the non-nucleophilic anion is an anion with considerably low ability to cause a nucleophilic reaction, that is, an anion capable of suppressing decomposition with age attributable to an intramolecular nucleophilic reaction.

Examples of the sulfonic acid anion include alkylsulfonic acid anion, arylsulfonic acid anion, and camphor sulfonic acid anion.

Examples of the carboxylic acid anion include alkylcarboxylic acid anion, arylcarboxylic acid anion and aralkylcarboxylic acid anion.

Examples of the alkyl of the alkylsulfonic acid anion include preferably alkyl groups having 1 to 30 carbon atoms such as methyl, ethyl, propyl, isopropyl, n-butyl, isobutyl, sec-butyl, pentyl, neopentyl, hexyl, heptyl, octyl, nonyl, and decyl, undecyl, dodecyl, tridecyl, tetradecyl, pentadecyl, hexadecyl, heptadecyl, octadecyl, nonadecyl, eicosyl, cyclopropyl, cyclopentyl, cyclohexyl, adamantyl, norbonyl, and boronyl.

Examples of the aryl in the arylsulfonic acid anion are preferably aryl groups having 6 to 14 carbon atoms such as phenyl, tolyl, and naphthyl.

The alkyl and aryl in the alkylsulfonic acid anion and the arylsulfonic acid anion may have substituent groups. Examples of the substituent groups are a halogen atom, an alkyl, an alkoxy group, and an alkylthio.

As the halogen atom to be introduced into as the above-mentioned substituent group, a chlorine atom, a bromine atom, a fluorine atom, and an iodine atom can be exemplified.

As the alkyl to be introduced into as the above-mentioned substituent group, alkyl group having 1 to 15 carbon atoms such as methyl, ethyl, propyl, isopropyl, n-butyl, isobutyl, sec-butyl, pentyl, neopentyl, hexyl, heptyl, octyl, nonyl, and decyl, undecyl, dodecyl, tridecyl, tetradecyl, pentadecyl, hexadecyl, heptadecyl, octadecyl, nonadecyl, and eicosyl can be exemplified.

Preferable examples as the alkoxy group to be introduced into as the above-mentioned substituent group are alkoxy groups having 1 to 5 carbon atoms such as methoxy, ethoxy, propoxy, and butoxy.

Preferable examples as the alkylthio group to be introduced into as the above-mentioned substituent group are alkylthio groups having 1 to 15 carbon atoms such as methylthio, ethylthio, propylthio, isopropylthio, n-butylthio, isobutylthio, sec-butylthio, pentylthio, neopentylthio, hexylthio, heptylthio, octylthio, nonylthio, decylthio, undecylthio, dodecylthio, tridecylthio, tetradecylthio, pentadecylthio, hexadecylthio, heptadecylthio, octadecylthio, nonadecylthio, and eicosylthio. Additionally, the alkyl, alkoxy group, and the alkylthio may further comprise a halogen atom (preferably fluorine atom) substituent.

As the alkyl in the alkylcarboxylic acid anion, alkyl groups same as those exemplified in the alkylsulfonic acid amino can be exemplified.

As the aryl in the arylcarboxylic acid anion, aryl groups same as those exemplified in the arylsulfonic acid amino can be exemplified.

As the aralkyl in the aralkylcarboxylic acid anion, preferably examples are aralkyl groups having 6 to 12 carbon atoms such as benzyl, phenethyl, naphthylmethyl, naphthylethyl, and naphthylmethyl.

The alkyl, aryl, and aralkyl in the above-mentioned alkylcarboxylic acid anion, arylcarboxylic acid anion, and aralkylcarboxylic acid anion may comprise substituent groups and examples of the substituent groups include a halogen atom, an alkyl, an alkoxy group, and an alkylthio similarly to those of the arylsulfonic acid anion.

The alkyl groups in the bis(alkylsulfonyl)imido anion and tris(alkylsulfonyl)methyl anion are preferably alkyl groups having 1 to 5 carbon atoms such as methyl, ethyl, propyl, isopropyl, n-butyl, isobutyl, sec-butyl, pentyl, and neopentyl. These alkyl groups may comprise substituent groups such as a halogen atom, an alkoxy group, and an alkylthio group.

As other non-nucleophilic anion, phosphorus fluoride, boron fluoride, and antimony fluoride can be exemplified.

As the non-nucleophilic anion represented by $X^-$, preferable examples are an alkanesulfonic acid anion having a fluorine atom as a substituent at α-position of the sulfonic acid, an arylsulfonic acid anion having a fluorine atom or a group comprising a fluorine as a substituent, a bis(alkylsulfonyl)imido anion having a fluorine atom as a substituent for the alkyl, and a tris(alkylsulfonyl)methide anion having a fluorine atom as a substituent for the alkyl. More preferable example of the non-nucleophilic anion represented by $X^-$ is a perfluoroalkanesulfonic acid anion having 1 to 8 carbon atoms and even more preferable examples of the non-nucleophilic anion represented by X⁻ are nonafluorobutanesulfonic acid anion and perfluorooctanesulfonic acid anion.

Regarding the formulae (II) and (III), the compound may comprise two or more groups defined by the formula (II) and (IIA) bonded together through linking groups at the positions of $R^1$ to $R^3$, $R^4$, $R^5$, $Y^3$ or $Y^4$.

In the formulae (II) and (III), n is preferably 1 or 2 and n is more preferably 1.

It is preferable to form a 5- to 7-member ring or a polycyclic ring structure comprising 5 to 7 members by bonding two groups represented by $R^1$ to $R^5$ through an alkylene group.

$R^4$ and $R^5$ are preferably hydrogen or an alkyl.

$Y^3$ and $Y^4$ are preferable to form a 5- to 7-member ring by bonding through an alkylene group.

Practical preferable examples of the compounds defined by the above-mentioned formulae (II) and (III) of the invention are shown as follows (II-1 to II-70 and III-1 to III-64), however the compounds of the invention are not limited to these examples.

CF₃SO₃⁻
(II-1)

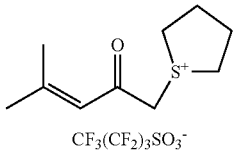
CF₃(CF₂)₃SO₃⁻
(II-2)

CF₃(CF₂)₇SO₃⁻
(II-3)

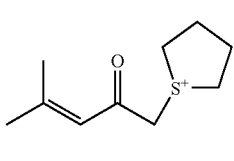
CF₃CF₂—O—CF₂CF₂SO₃⁻
(II-4)

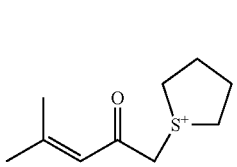
⁻N(SO₂CF₃)₂
(II-5)

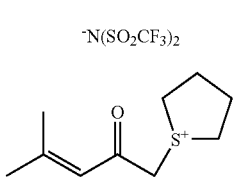
⁻N(SO₂C₄F₉)₂
(II-6)

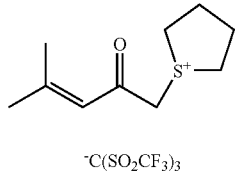
⁻C(SO₂CF₃)₃
(II-7)

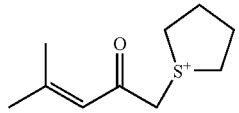
CF₃OCF₃CF₂OCF₃CF₂OCF₂SO₃⁻
(II-8)

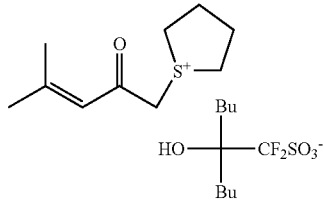
(II-9)

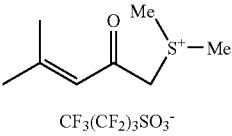
CF₃(CF₂)₃SO₃⁻
(II-10)

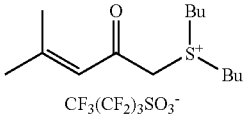
CF₃(CF₂)₃SO₃⁻
(II-11)

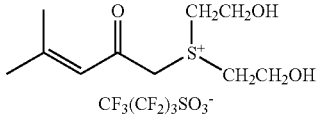
CF₃(CF₂)₃SO₃⁻
(II-12)

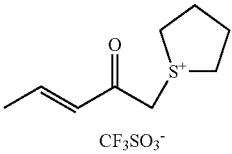
CF₃SO₃⁻
(II-13)

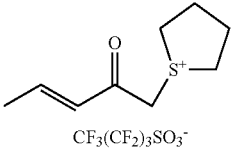
CF₃(CF₂)₃SO₃⁻
(II-14)

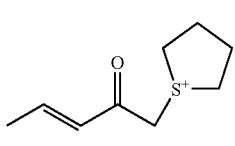
(II-15)
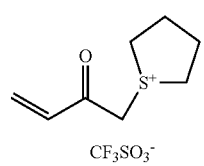
(II-16)
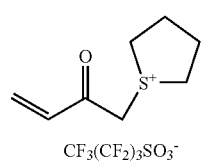
(II-17)
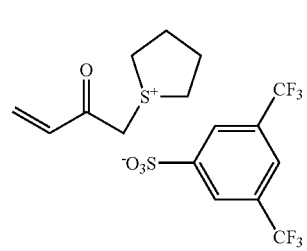
(II-18)
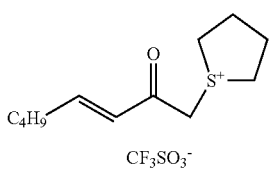
(II-19)
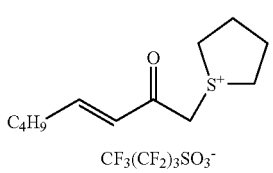
(II-20)
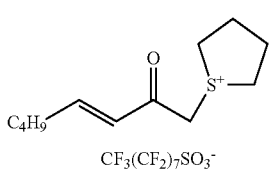
(II-21)
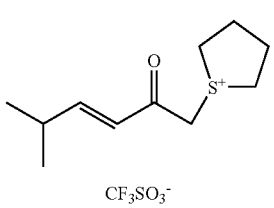
(II-22)
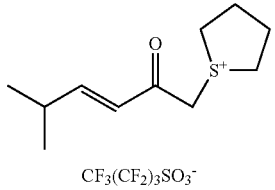
(II-23)
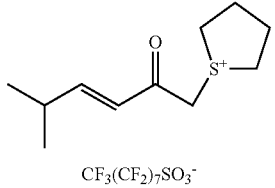
(II-24)
(II-25)
(II-26)
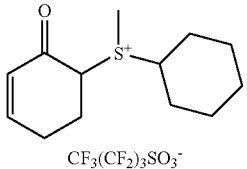
(II-27)
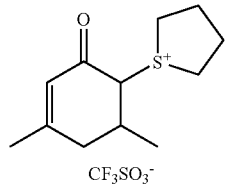
(II-28)
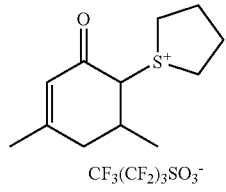
(II-29)

-continued
(II-30)
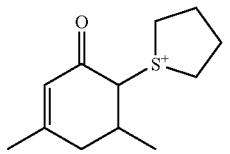
CF₃OCF₃CF₂OCF₃CF₂OCF₂SO₃⁻
(II-31)
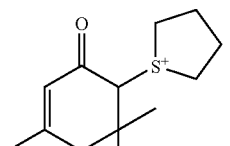
CF₃SO₃⁻
(II-32)
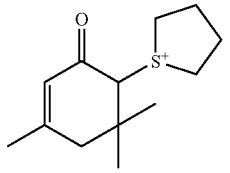
CF₃(CF₂)₃SO₃⁻
(II-33)
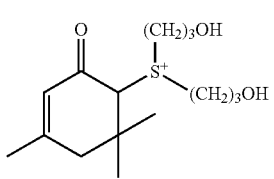
CF₃(CF₂)₃SO₃⁻
(II-34)
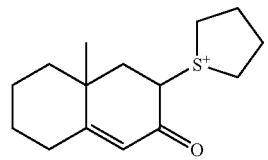
CF₃SO₃⁻
(II-35)
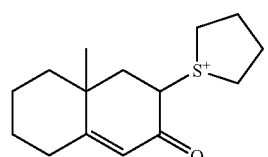
CF₃(CF₂)₃SO₃⁻
(II-36)
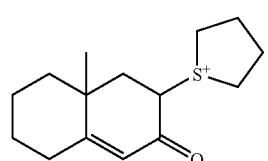
CF₃CF₂—O—CF₂CF₂SO₃⁻
-continued
(II-37)
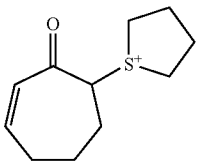
CF₃SO₃⁻
(II-38)
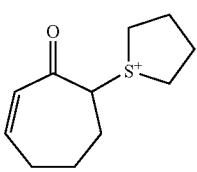
CF₃(CF₂)₃SO₃⁻
(II-39)
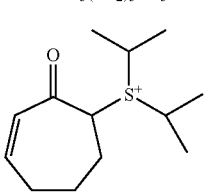
CF₃(CF₂)₃SO₃⁻
(II-40)
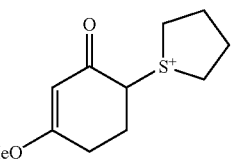
CF₃SO₃⁻
(II-41)
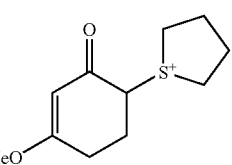
CF₃(CF₂)₃SO₃⁻
(II-42)
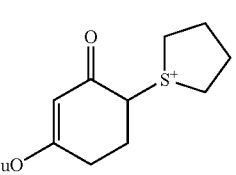
CF₃(CF₂)₃SO₃⁻
(II-43)
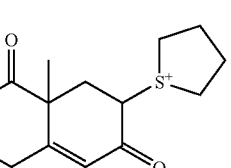
CF₃SO₃⁻

-continued
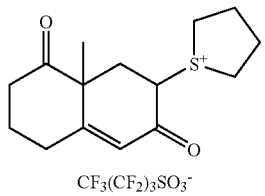
(II-44)
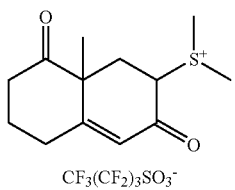
(II-45)
(II-46)
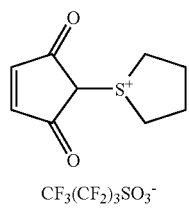
(II-47)
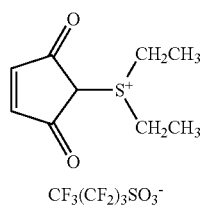
(II-48)
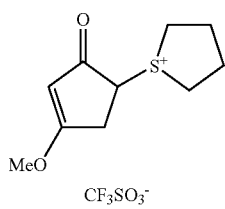
(II-49)
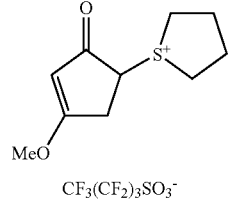
(II-50)
-continued
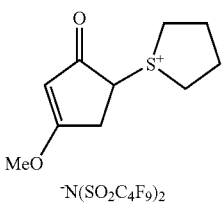
(II-51)
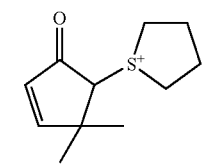
(II-52)
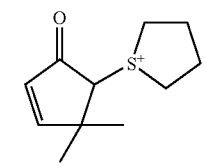
(II-53)
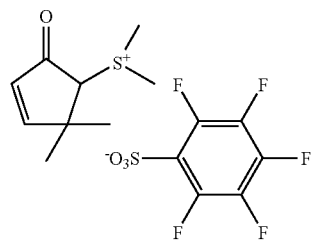
(II-54)
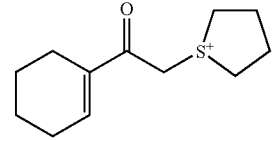
(II-55)
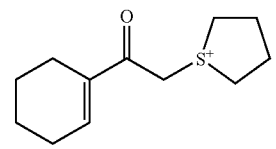
(II-56)
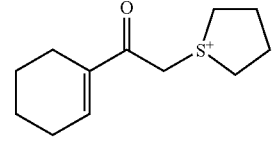
(II-57)

-continued
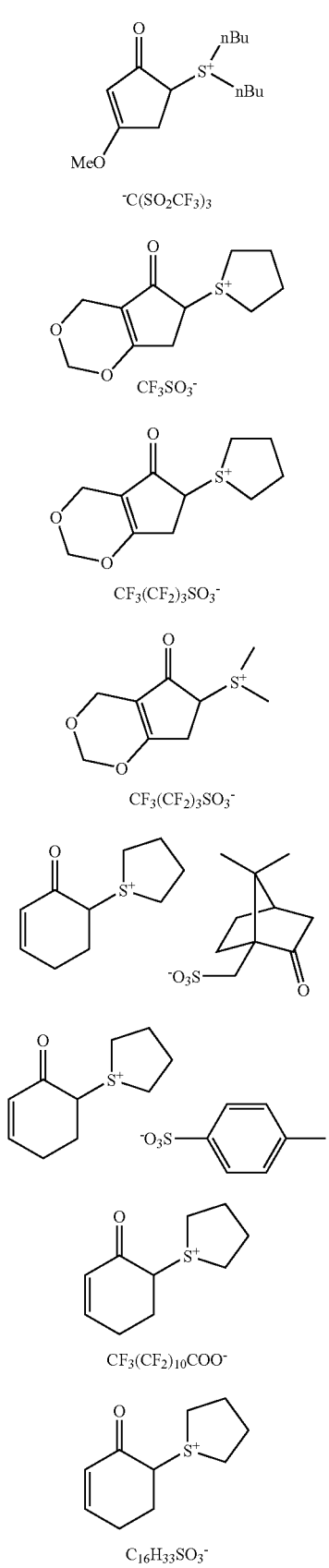
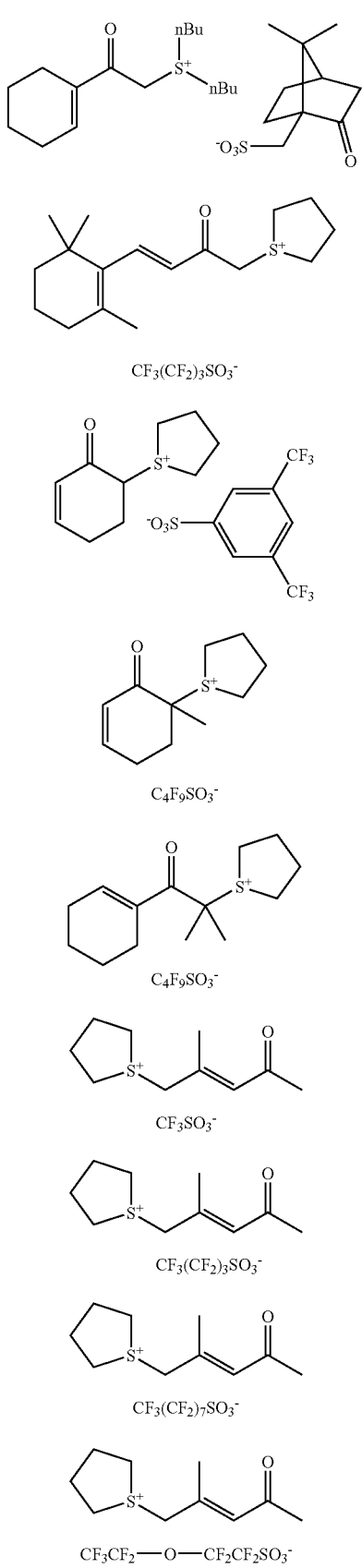

-continued
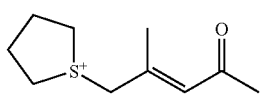
(III-5)
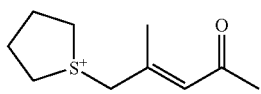
(III-6)
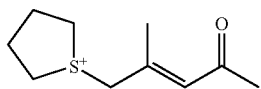
(III-7)
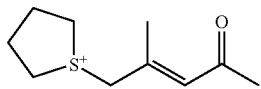
(III-8)
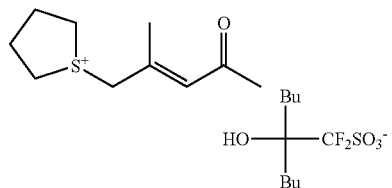
(III-9)
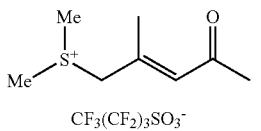
(III-10)
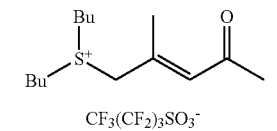
(III-11)
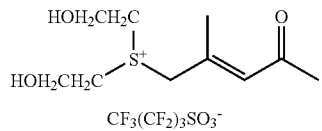
(III-12)
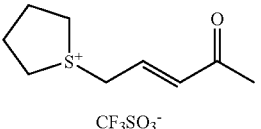
(III-13)
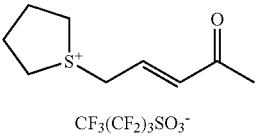
(III-14)
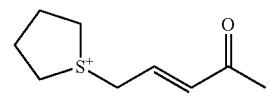
(III-15)
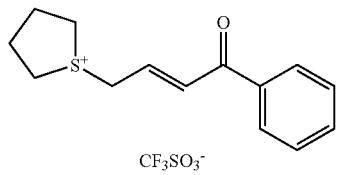
(III-16)
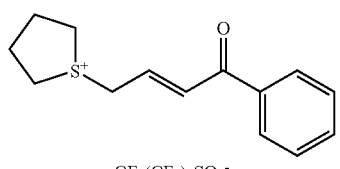
(III-17)
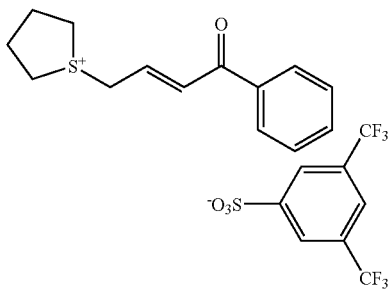
(III-18)
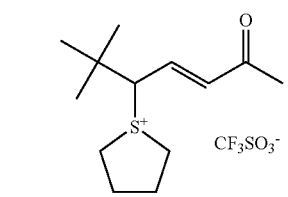
(III-19)
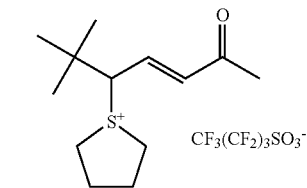
(III-20)
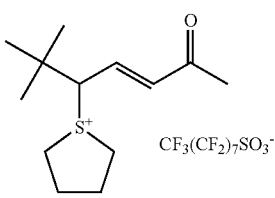
(III-21)

-continued
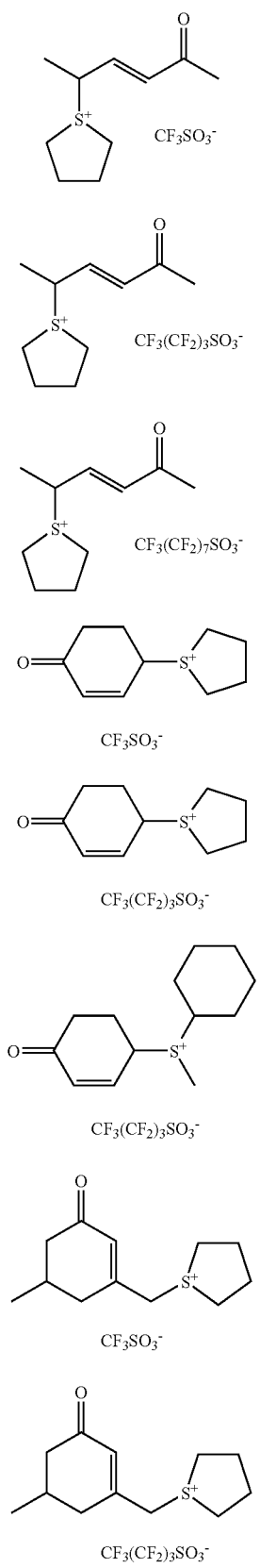
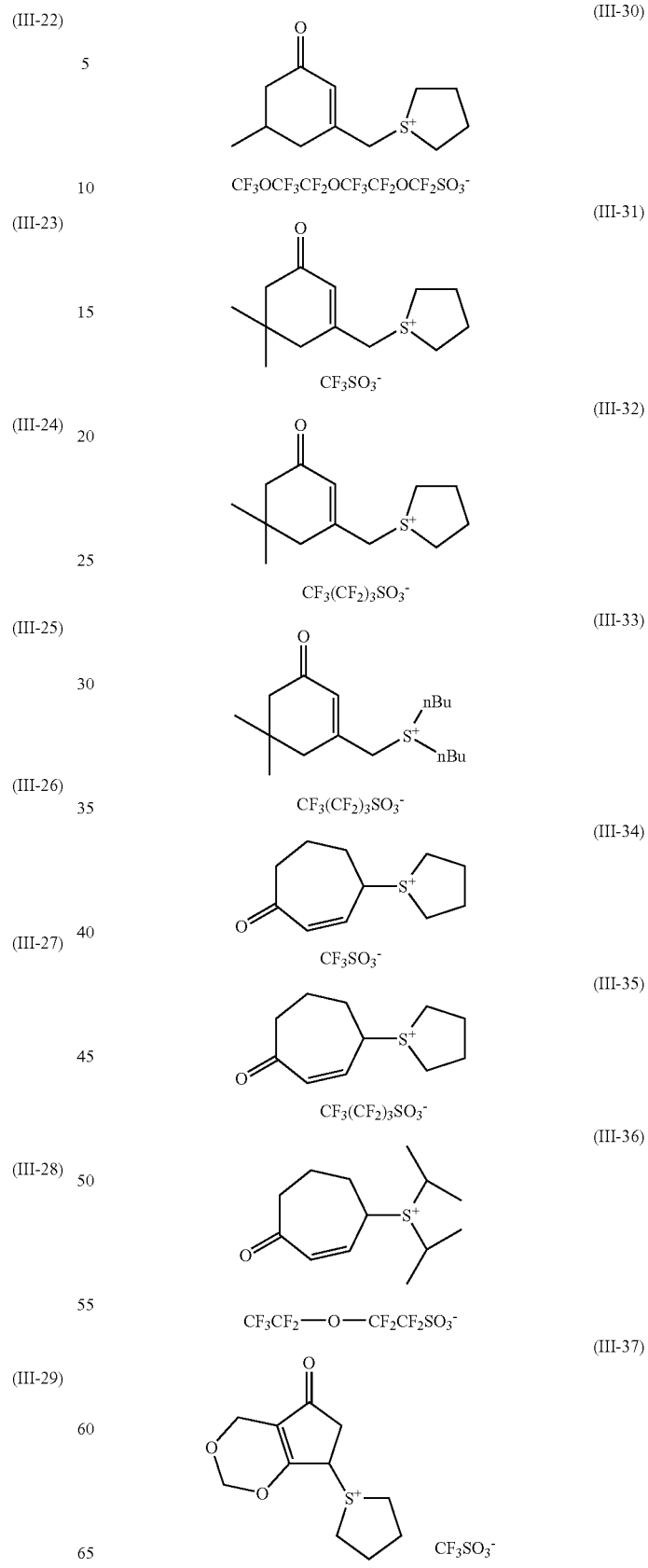

-continued
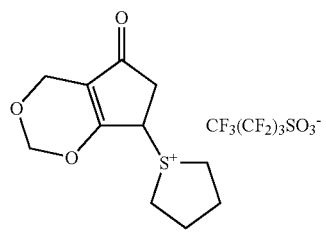
(III-38)
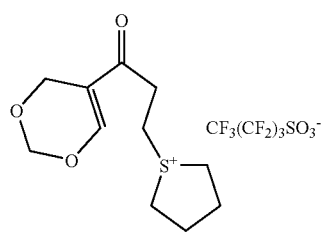
(III-39)
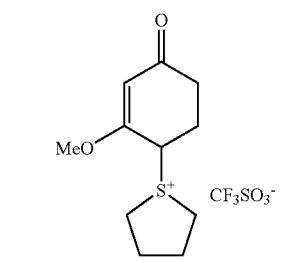
(III-40)
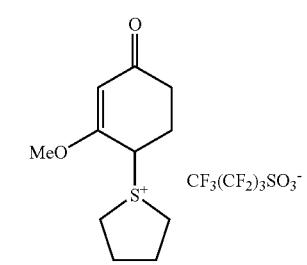
(III-41)
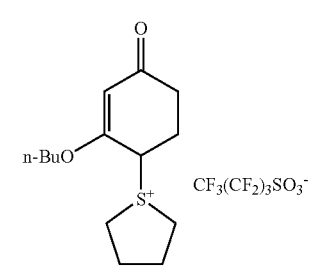
(III-42)
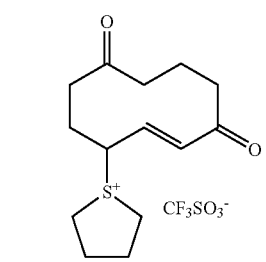
(III-43)
-continued
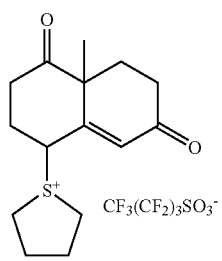
(III-44)
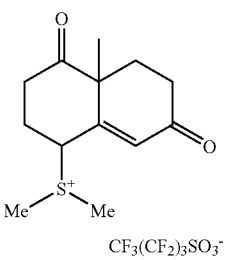
(III-45)
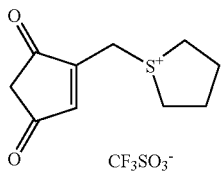
(III-46)
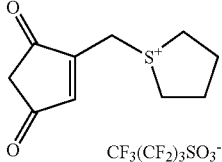
(III-47)
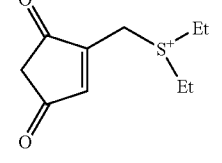
(III-48)
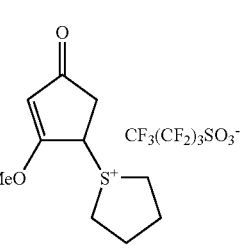
(III-49)
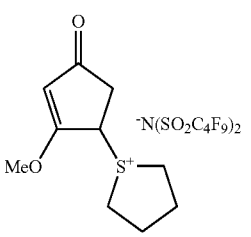
(III-50)

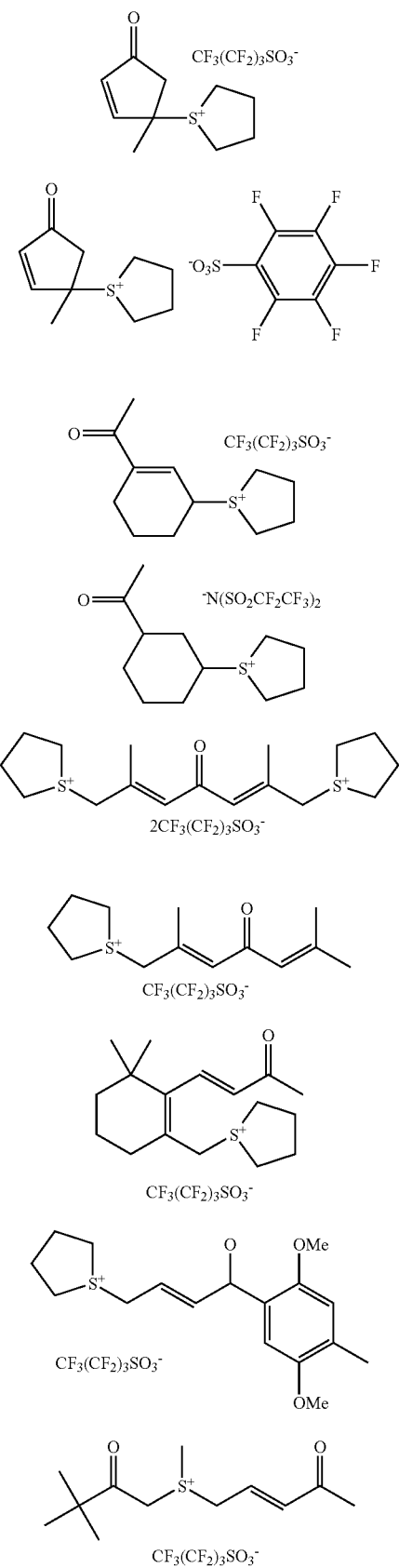

The compound defined by the formula (II) or (III) can be synthesized by silyl enol-etherifying a corresponding unsaturated ketone compound with trimethylsilyl chloride under basic condition, reacting the obtained compound with sulfoxide to convert to a sulfonium salt, and then salt-exchanging the sulfonium salt.

The compound defined by the formula (II) or (III) can be synthesized also by halogenating a corresponding unsaturated ketone compound with bromine or copper bromide at the α-position or the allyl position of the ketone to obtain α-halogen-substituted unsaturated ketone or the unsaturated ketone halogenated at the allyl-position, reacting the obtained compound with a sulfide compound in the presence of no catalyst or a silver catalyst to convert to a sulfonium salt, and then salt-exchanging the sulfonium salt.

Next, the compound defined by the formula (IV) will be described.

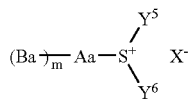

Formula (IV)

In the formula (IV), $Y^5$ and $Y^6$ independently represent an alkyl, an aryl, an aralkyl, a heteroring group, an oxoalkyl, or an oxoaralkyl; $Y^5$ and $Y^6$ may be bonded to each other to form a ring; Aa represents a single bond or an organic group; Ba represents a group having —CON(Ra)— bond or a group having —SO$_2$N(Ra)— bond; Ra represents a hydrogen atom or an alkyl; m represents an integer of 1 to 3; and X$^-$ represents a non-nucleophilic anion.

The alkyl represented by $Y^5$ and $Y^6$ is preferably an alkyl having 1 to 30 carbon atoms and examples are straight chain or branched alkyl groups such as methyl, ethyl, propyl, n-butyl, sec-butyl, and tert-butyl and cyclic alkyl groups such as cyclopropyl, cyclopentyl, cyclohexyl, adamantyl, norbonyl, and boronyl and they may further comprise substituent groups.

The aryl represented by $Y^5$ and $Y^6$ is preferably an aryl having 6 to 14 carbon atoms and phenyl, tolyl, and naphthyl can be exemplified and they may further comprise substituent groups.

The aralkyl represented by $Y^5$ and $Y^6$ is preferably an aralkyl having 7 to 12 carbon atoms and benzyl, phenethyl, and cumyl can be exemplified and they may further comprise substituent groups.

The heteroring group means an aromatic group having 4 to 14 carbon atoms such as aryl comprising a heteroatom such as a nitrogen atom, an oxygen atom, or a sulfur atom.

Preferable examples of the heteroring group represented by $Y^5$ and $Y^6$ are heterocyclic aromatic hydrocarbons such as furan, thiophene, pyrrole, pyridine, and indole.

The oxoalkyl represented by $Y^5$ and $Y^6$ is a group formed by bonding oxo group to any of the above-exemplified alkyl groups and 2-oxoalkyl is preferable.

The oxoaralkyl represented by $Y^5$ and $Y^6$ is a group formed by bonding oxo group to any of the above-exemplified aralkyl groups and 2-oxoaralkyl is preferable.

$Y^5$ and $Y^6$ may be bonded together with S$^+$ of the formula (IV) to form a ring. In this case, the group formed by bonding $Y^5$ and $Y^6$ may be alkylene group having 4 to 10 carbon atoms and preferable examples are butylene, pentylene, hexylene, and particularly preferably examples are butylene and pentylene.

The ring formed by bonding $Y^5$ and $Y^6$ together with S$^+$ of the formula (IV) may comprise a heteroatom.

The group may comprise two or more structures defined by the formula (IV) by forming a bond at Ba, $Y^5$ of $Y^6$ through a bonding group.

Aa represents a single bond or an organic group. (Ba)$_m$-Aa-means that Aa comprises, as substituent groups, Ba groups in number of m. In the case Aa is a single bond, m represents 1.

An organic group represented by Aa is preferably an organic group having 1 to 30 carbon atoms and more preferably an alkyl (preferably having 1 to 10 carbon atoms) or an aryl (preferably having 5 to 10 carbon atoms). Further, the alkyl may comprise an arylene (e.g. phenylene), ether bond, ester bond, or —C(=O)— in the bonding chain. The alkyl, aryl, and arylene may comprise substituent groups.

Examples of the substituent groups include an aryl (e.g. phenyl), a nitro group, a halogen atom, a carboxyl, a hydroxyl, an amino group, a cyano group, and an alkoxy (preferably having 1 to 5 carbon atoms). An alkyl group (preferably having 1 to 5 carbon atoms) can be exemplified on aryl and arylene group.

Ba represents a group having —CON(Ra)— bond or a group having —SO$_2$N(Ra)— bond. The bonding state of the group having —CON(Ra)— bond may include group —CONH—, —CON(Ra')—, —CONHCO—, and —CONHSO$_2$—. Ra' represents an alkyl.

Preferable examples of Ba are groups having 1 to 30 carbon atoms and particular examples are —CONH$_2$, —CONH(Rb), —CON(Ra)(Rb), —CONHCO(Rb), —CONHSO$_2$(Rb), —NHCO(Rb), —N(Ra'CO(Rb), —SO$_2$NH$_2$, —SO$_2$NH(Rb), —SO$_2$N(Ra')(Rb), —SO$_2$NHCO(Rb), and —SO$_2$N(Ra')CO(Rb).

Rb may be an alkyl or an aryl optionally having a substituent group.

The alkyl in Ra and Rb and the aryl in Rb are respectively same as those exemplified in $Y^5$ to $Y^6$.

Ra' and Rb may be bonded to each other to form a ring. The ring may comprise a heteroatom or an oxo group.

Examples of the non-nucleophilic anion represented by X$^-$ are sulfonic acid anion, carboxylic acid anion, bis(alkylsulfonyl)imido anion, tris(alkylsulfonyl)methyl anion, PF$_6^-$, and BF$_4^-$.

The non-nucleophilic anion is an anion with considerably low reactivity in nucleophilic reaction and thus capable of suppressing decomposition with lapse of time attributed to intermolecular nucleophilic reaction.

As the non-nucleophilic anion represented by X$^-$, sulfonic acid anion is preferable.

Examples of the sulfonic acid anion are alkylsulfonic acid anion, arylsulfonic acid anion, and camphor sulfonic acid anion.

Examples of the sulfonic acid anion are alkylcarboxylic acid anion, arylcarboxylic acid anion, and aralkylcarboxylic acid anion.

The alkyl in the alkylsulfonic acid anion is preferably an alkyl having 1 to 30 carbon atoms and methyl, ethyl, propyl, isopropyl, n-butyl, isobutyl, sec-butyl, pentyl, neopentyl, hexyl, heptyl, octyl, nonyl, decyl, undecyl, dodecyl, tridecyl, tetradecyl, pentadecyl, hexadecyl, heptadecyl, octadecyl, nonadecyl, eicosyl, cyclopropyl, cyclopentyl, cyclohexyl, adamantyl, norbonyl, and boronyl can be exemplified.

The aryl in the arylsulfonic acid anion is preferably an aryl having 6 to 14 carbon atoms and phenyl, tolyl, and naphthyl can be exemplified.

The above-mentioned alkyl and aryl in the allylsulfonic acid anion and the arylsulfonic acid anion may comprise substituent groups. As the substituent groups, a halogen atom, an alkyl, an alkoxy group, hydroxyl, a nitro group, and an alkoxycarbonyl can be exemplified.

The above-mentioned alkyl, alkoxyl, and alkoxycarbonyl may further comprise a halogen atom as a substituent.

As the halogen atom to be introduced as the above-mentioned substituent, a chlorine atom, a bromine atom, a fluorine atom, and an iodine atom can be exemplified.

As the alkyl to be introduced as the above-mentioned substituent group, an alkyl group having 1 to 15 carbon atoms such as methyl, ethyl, propyl, isopropyl, n-butyl, isobutyl, sec-butyl, pentyl, neopentyl, hexyl, heptyl, octyl, nonyl, decyl, undecyl, dodecyl, tridecyl, tetradecyl, pentadecyl, hexadecyl, heptadecyl, octadecyl, nonadecyl, and eicosyl can be preferably exemplified.

As the alkoxy group to be introduced as the above-mentioned substituent group, an alkoxy group having 1 to 5 carbon atoms such as methoxy, ethoxy, propoxy, and butoxy can be exemplified.

As the alkyl in the alkylcarboxylic acid anion, alkyl groups same as those exemplified for the alkylsulfonic acid anion can be exemplified.

As the aryl in the arylcarboxylic acid anion, aryl groups same as those exemplified for the arylsulfonic acid anion can be exemplified.

As the aralkyl in the aralkylcarboxylic acid anion, an aralkyl having 6 to 12 carbon atoms such as benzyl, phenethyl, naphthylmethyl, naphthylethyl, and naphthylmethyl can be exemplified.

The above-mentioned alkyl, aryl, and aralkyl in the alkylcarboxylic acid anion, arylcarboxylic acid anion, and the aralkylcarboxylic acid anion may comprise substituent groups. As the substituent groups, a halogen atom, an alkyl, an alkoxy group, hydroxyl, a nitro group, and an alkoxycarbonyl can be exemplified similarly to those in the case of the arylsulfonic acid anion.

The above-mentioned alkyl, alkoxyl, and alkoxycarbonyl may further comprise a halogen atom as a substituent.

As the alkyl in bis(alkylsulfonyl)imido anion and tris (alkylsulfonyl)methyl anion, an alkyl having 1 to 5 carbon atoms such as methyl, ethyl, propyl, isopropyl, n-butyl, isobutyl, sec-butyl, pentyl, and neopentyl can be exemplified.

These alkyl groups may comprise substituent groups and as the substituent groups, a halogen atom, an alkoxy group, and an alkylthio group can be exemplified.

As other non-nucleophilic anion, phosphorus fluoride, boron fluoride, and antimony fluoride can be exemplified.

As the non-nucleophilic anion represented by $X^-$, 1-fluorosulfonic acid anion is preferable and perfluoroalkanesulfonic acid anion is more preferable.

The compound defined by the formula (IV) in the invention is preferably any of the following compounds defined by the following formulae (IV-A) to (IV-C).

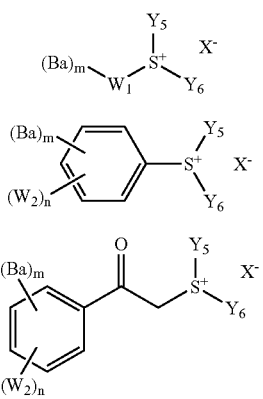

Formula (IV-A)

Formula (IV-B)

Formula (IV-C)

In the formulae (IV-A) to (IV-C), $Y^5$, $Y^6$, Ba, m, and $X^-$ are same as those exemplified in the above-mentioned formula (IV); $W^1$ represents an alkylene; $W^2$ independently represents a hydrogen atom, an alkyl, hydroxyl, an alkoxy group, a cyano group, and a halogen atom; n represents an integer of 0 to 4.

As the alkylene represented by $W^1$ may be straight chain, branched, or cyclic alkylene, an alkylene having 1 to 20 carbon atoms such as methylene, ethylene, propylene, and butylene can be preferably exemplified. The alkylene may further comprise a heteroatom and an oxo group.

The alkylene represented by $W^2$ may be same as the alkyl represented by $Y^5$ and $Y^6$.

As the alkoxy represented by $W^2$, an alkoxy having 1 to 8 carbon atoms such as methoxy, ethoxy, propoxy, and butoxy can be exemplified.

The compound defined by the formula (IV-A) of the invention is preferably a compound defined by the following formula (IV-a).

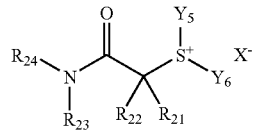

(IV-a)

In the formula (IV-a), $Y^5$, $Y^6$, and $X^-$ are same as those exemplified in the above-mentioned formula (IV); $R^{21}$ and $R^{22}$ independently represent a hydrogen atom, an alkyl, an aryl, or a cyano group; $R^{23}$ and $R^{24}$ independently represent a hydrogen atom, an alkyl, or an aryl; and at least two of $R^{21}$ to $R^{24}$ may be bonded to form a monocyclic group or polycyclic group and the formed cyclic group may optionally contain a hetero atom.

The alkyl represented by $R^{21}$ to $R^{24}$ is preferably a straight, branched, or cyclo-alkyl having 1 to 10 carbon atoms such as methyl, ethyl, propyl, n-butyl, sec-butyl, tert-butyl, cyclobutyl, pentyl, neopentyl, cyclopentyl, hexyl, cyclohexyl, heptyl, octyl, nonyl, and decyl and they may further comprise substituent groups.

The aryl represented by $R^{21}$ to $R^{24}$ is preferably an aryl having 6 to 14 carbon atoms such as phenyl, tolyl, and naphthyl and they may further comprises substituent groups.

At least two of $R^{21}$ to $R^{24}$ may be bonded to form a monocyclic or polycyclic group. In this case, the group formed by bonding at least two of $R^{21}$ to $R^{24}$ is preferably an alkylene group having 4 to 10 carbon atoms such as butylene, pentylene, or hexylene group.

The formed cyclic group may comprise a heteroatom.

The group may comprise two or more groups defined by the formulae (IV-a) by forming bonds through linking groups at the position of $R^{21}$ to $R^{24}$, $Y^4$, or $Y^5$ through bonding groups.

As the substituent groups, an alkyl, an aryl, a nitro group, a halogen atom, a carboxyl, hydroxyl, an amino group, a cyano group, an alkoxy group (preferably having 1 to 5 carbon atoms) can be exemplified.

Hereinafter, particularly preferable examples of the compounds defined by the formula (IV) are those (IV-1 to IV-35, IV-B-1 to IV-B-9, IV-C-1 to IV-C-3), however the compounds of the invention are not limited to the following examples.

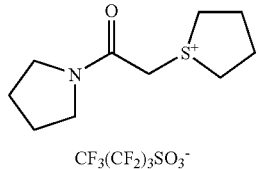

(IV-1)

CF$_3$(CF$_2$)$_3$SO$_3^-$

-continued
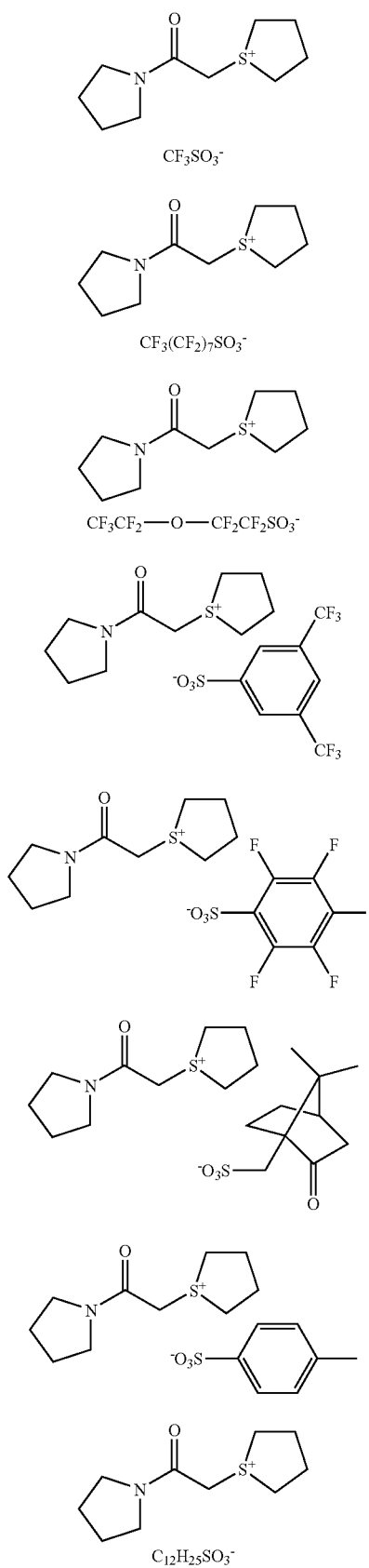
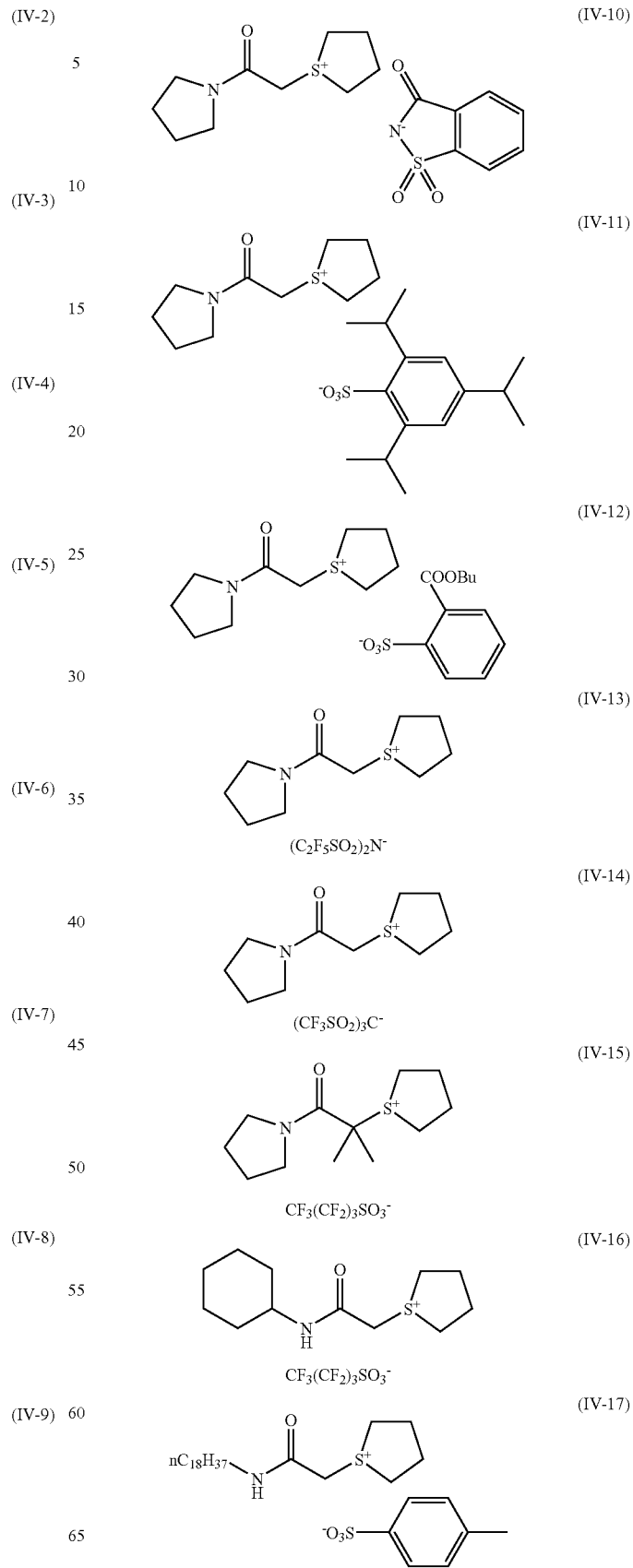

(IV-18)
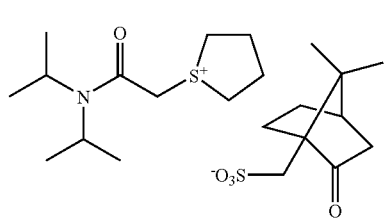
(IV-19)
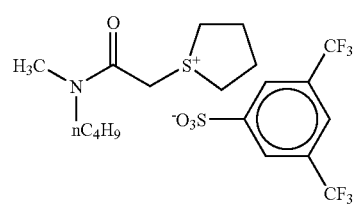
(IV-20)
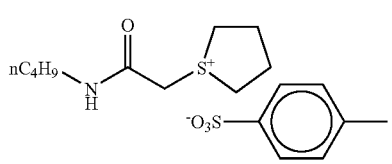
(IV-21)
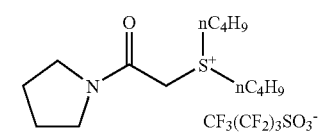
(IV-22)
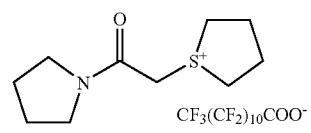
(IV-23)
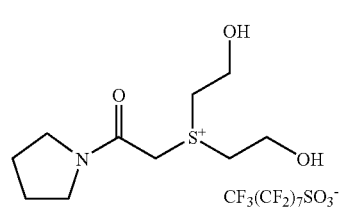
(IV-24)
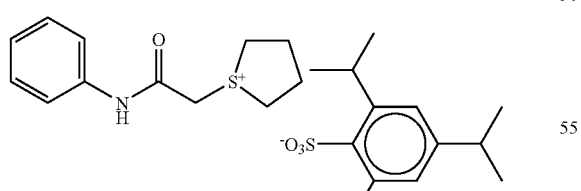
(IV-25)
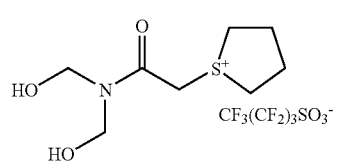
(IV-26)
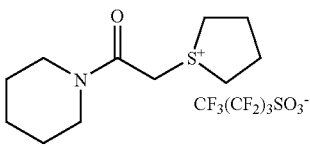
(IV-27)
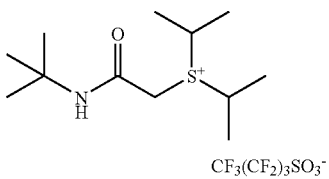
(IV-28)
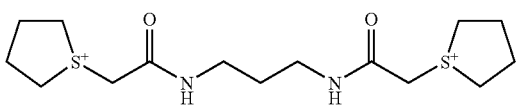
(IV-29)
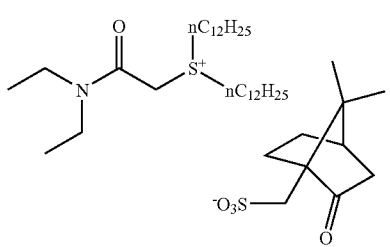
(IV-30)
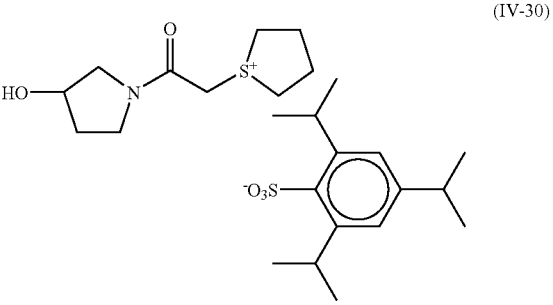
(IV-31)
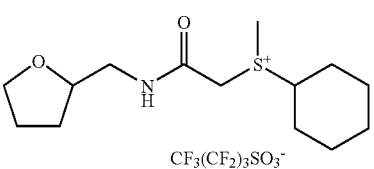
(IV-32)
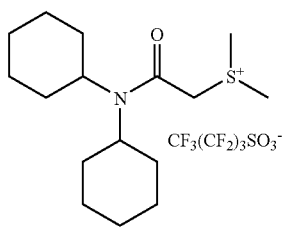

-continued (IV-33)
(IV-34)
(IV-35)
(IV-B-1)
(IV-B-2)
(IV-B-3)
(IV-B-4)
(IV-B-5)
(IV-B-6)
(IV-B-7)
(IV-B-8)
(IV-B-9)
(IV-C-1)

-continued

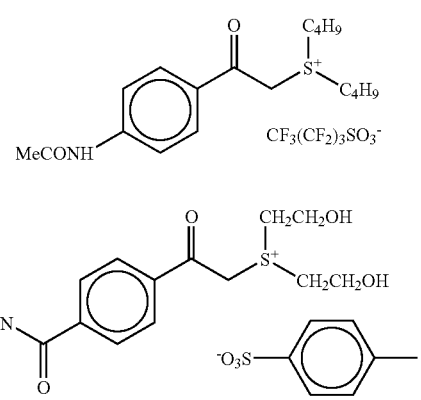

(IV-C-2)

(IV-C-3)

The compound defined by the formula (IV) is synthesized by causing reaction of a primary or secondary amine with 2-haloacetyl halogenide to obtain 2-halo-acetylamide derivative, synthesizing a sulfonium salt by causing reaction of the derivative with a corresponding sulfide compound in the absence or presence of a catalyst, and then effecting salt-exchanging of the sulfonium salt to the corresponding anion.

The specific compound (C) in the invention may be used alone or two or more of such compounds may be used in combination.

The specific compound (C) in the invention is added in an amount of preferably 1 to 50% by weight and more preferably 1 to 30% by weight in the total solid components in the photosensitive/heat sensitive layer. If the addition amount is too small, it becomes difficult to provide excellent development latitude and image contract, which are advantageous effects of the invention and if the addition amount is too much, the coating property of the film tends to be deteriorated.

Other Onium Salt Compound

In the invention, together with the compounds defined by the above-mentioned formula (I) to (VI), the following another onium salt compound may be used in combination to the extent that the effects of the invention are not deteriorated.

The amount of another onium salt compound to be used in combination in the invention may be generally (100/0) to (20/80), preferably (100/0) to (40/60), more preferably (100/0) to (50/50) by mole ratio of [the compound of the formula (I) to (IV)/another onium salt compound].

As the onium salt compound, an azonium salt, a phosphonium salt, a sulfonyl salt, an iodonium salt, an oxime-suflonate, a diazosulfone, a disulfone, and o-nitrobenzylsulfonate can be exemplified.

Compounds described in U.S. Pat. No. 3,849,137, German Patent No. 3,914,407, Japanese Patent Application Laid-Open Nos. 63-26653, 55-164824, 62-69263, 63-146038, 63-163452, 62-153853, and 63-146029 can be used as the compounds comprising those onium salts introduced to the main chains or side chains of a polymer.

Particularly preferable examples of the compounds are exemplified as follows.

(z1)

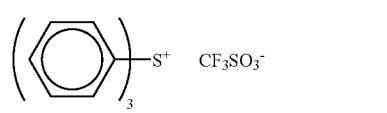

(z2)

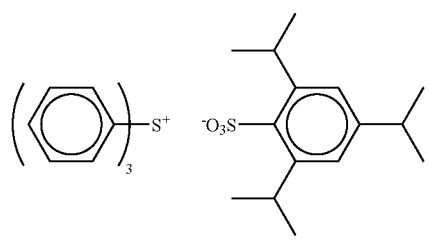

(z3)

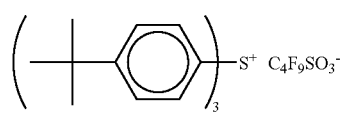

(z4)

(z5)

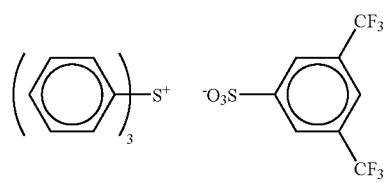

(z6)

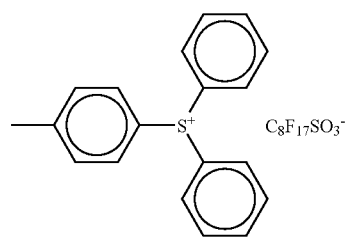

(z7)

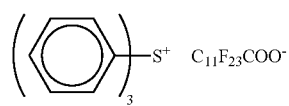

(z8)

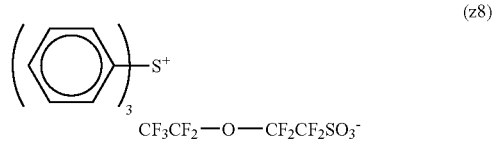

-continued
(z9) 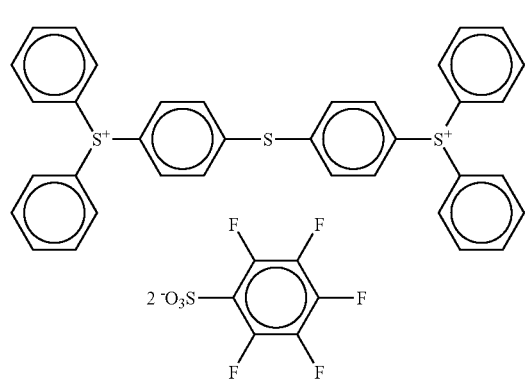
(z10) 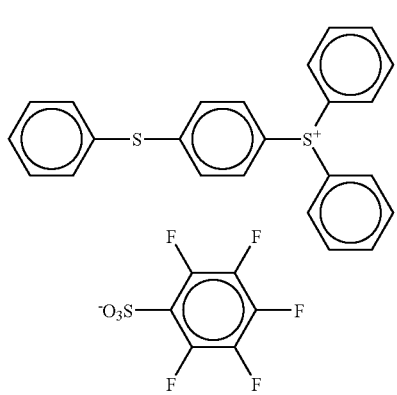
(z11) 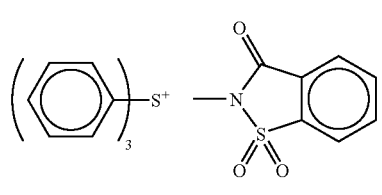
(z12) 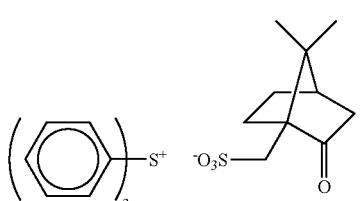
(z13) 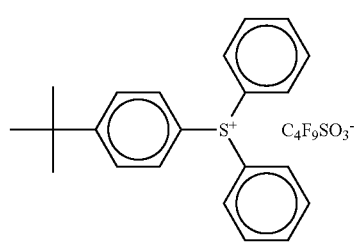
(z14) 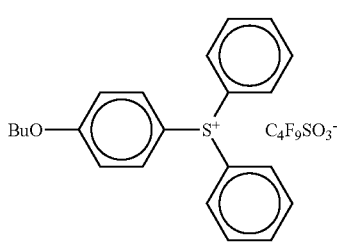
(z15) 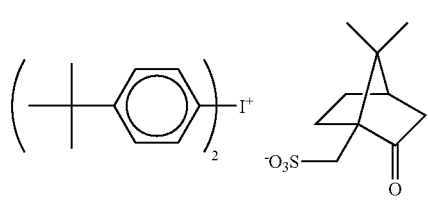
(z16) 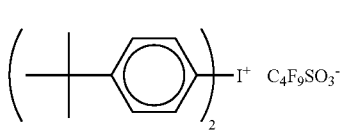
(z17) 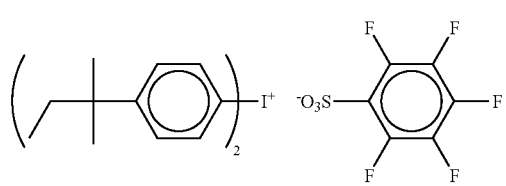
(z18) 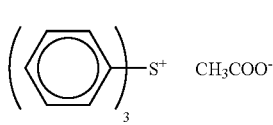
(z19) 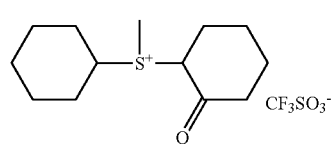
(z20) 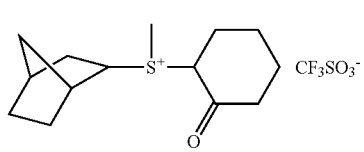
(z21) 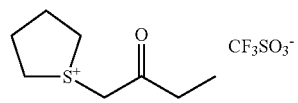
(z22) 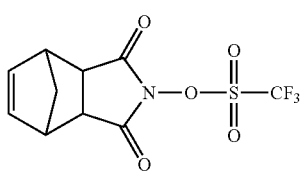

-continued
(z23)
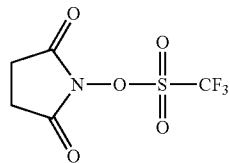
(z24)
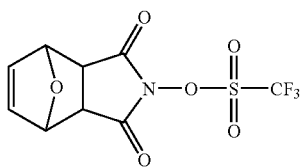
(z25)
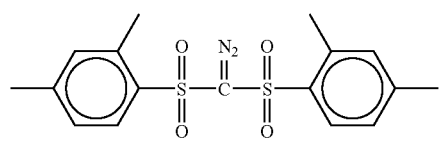
(z26)
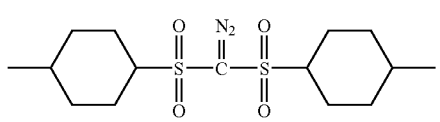
(z27)
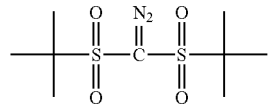
(z28)
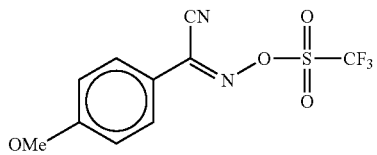
(z29)
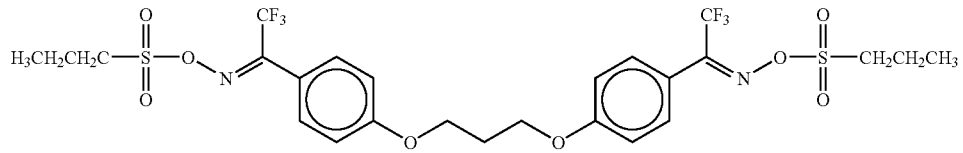
(z30)
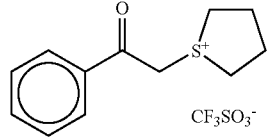
(z31)
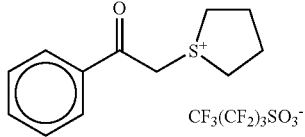
(z32)
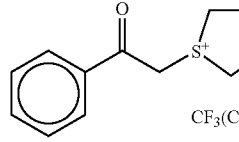
(z33)
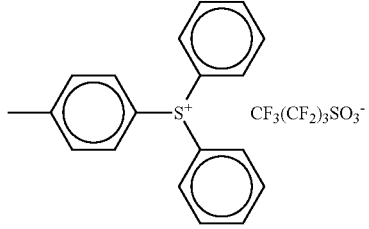
(z34)
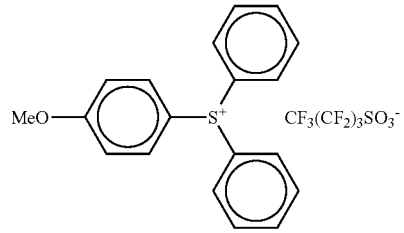
(z35)
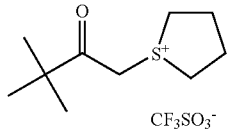
(z36)
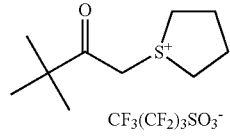
(z37)
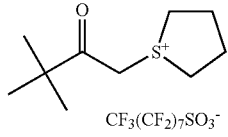
(z38)
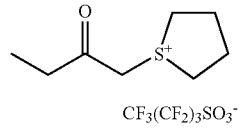
(z39)
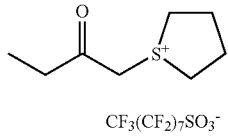

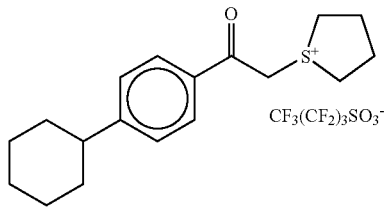 (z40)

CF$_3$(CF$_2$)$_3$SO$_3^-$

[(A) Alkali-Soluble Resin]

Examples of the alkali-soluble resin (A) to be used in the image recording material of the invention may include homopolymers containing acidic groups in the main chains and/or the side chains of the polymers, their copolymers, or their mixtures.

Among them, polymers having the following acidic groups (1) to (6) in the main chains and/or side chains are preferable in terms of the development resistance and the solubility to an aqueous alkaline solution:
(1) phenol (—Ar—OH),
(2) sulfone amide (—SO$_2$NH—R),
(3) substituted sulfoneamido based acid group (hereinafter, referred to as active imido group) [—SO$_2$NHCOR, —SO$_2$NHSO$_2$R, —CONHSO$_2$R]
(4) carboxylic acid group (—CO$_2$H),
(5) sulfonic acid group (—SO$_3$H), and
(6) phosphoric acid group (—OPO$_3$H$_2$)

Ar in the above-mentioned groups (1) to (6) represents a divalent aryl bonding group optionally comprising a substituent group and R represents a hydrocarbon group optionally comprising a substituent group.

Among the alkali-soluble resin comprising the acidic group selected from the above-mentioned (1) to (6), an alkali-soluble resin comprising (1) phenol, (2) sulfone amide, or (3) active imido group is preferable and an alkali-soluble resin comprising (1) phenol or (2) sulfone amide is more preferable in terms of assurance of the sufficient solubility in an alkaline developer, development latitude, and film strength.

As the alkali-soluble resin comprising the acidic group selected from the above-mentioned (1) to (6), the following can be exemplified.

(1) Examples of the alkali-soluble resin comprising phenol group may include novolak resin such as condensation polymers of phenol and formaldehyde; condensation polymers of m-cresol and formaldehyde, condensation polymers of p-cresol and formaldehyde, condensation polymers of m-/p-mixed cresol and formaldehyde, and condensation polymers of phenol, cresol (m-, p-, or m-/p-mixture) and formaldehyde; and condensation copolymers of pyrogallol and acetone. Further, copolymers obtained by copolymerizing compound comprising phenyl groups in the side chains can be exemplified. Or, copolymers obtained by copolymerizing compounds comprising phenyl groups in the side chains can also be used.

As the compounds comprising phenol group, acrylamide, methacrylamide, acrylic acid ester, methacrylic acid ester, or hydroxystyrene can be exemplified.

(2) Examples of the alkali-soluble resin comprising sulfoneamido group may include polymers obtained by using the minimum component units derived from compounds comprising sulfoneamido group as main constituent components. Examples of such compounds include those having at least one sulfoneamido group comprising at least one hydrogen atom bonded to the nitrogen atom and at least one polymerizable unsaturated group, in the molecules. Among them, low molecular weight compounds comprising acryloyl, allyl, or vinyloxy group as well as substituted or mono-substituted aminosulfonyl group or a substituted sulfonylimino group in molecules are preferable and the following compounds defined by the following (i) to (v) can be exemplified.

Examples thereof include compounds represented by any one of the following general formulae (i) to (v):

 General formula (i)

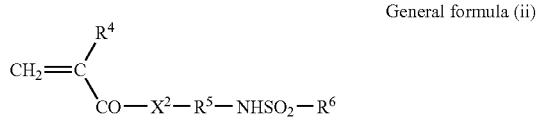 General formula (ii)

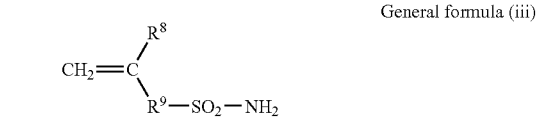 General formula (iii)

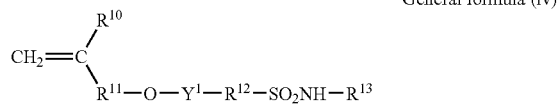 General formula (iv)

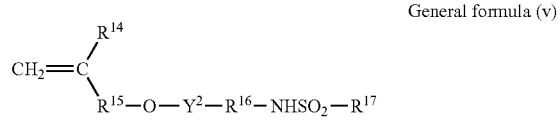 General formula (v)

In the general formulae (i) to (v), $X^1$ and $X^2$ each independently represent —O—, or —NR$^7$—; $R^1$ and $R^4$ each independently represent a hydrogen atom, or —CH$_3$; $R^2$, $R^5$, $R^9$, $R^{12}$ and $R^{16}$ each independently represent an alkylene, cycloalkylene, arylene or aralkylene group which may have a substituent and has 1 to 12 carbon atoms; $R^3$, $R^7$ and $R^{13}$ each independently represent a hydrogen atom, or an alkyl, cycloalkyl, aryl or aralkyl group which may have a substituent and has 1 to 12 carbon atoms; $R^6$ and $R^{17}$ each independently represent an alkyl, cycloalkyl, aryl or aralkyl group which may have a substituent and has 1 to 12 carbon atoms; $R^8$, $R^{10}$ and $R^{14}$ each independently represent a hydrogen atom or —CH$_3$; $R^{11}$ and $R^{15}$ each independently represent a single bond, or an alkylene, cycloalkylene, arylene or aralkylene group which may have a substituent and has 1 to 12 carbon atoms; and $Y^1$ and $Y^2$ each independently represent a single bond or —CO—.

Of the compounds represented by the represented by the general formulae (i) to (v), in particular, the following can preferably be used in the invention: m-aminosulfonylphenyl methacrylate, N-(p-aminosulfonylphenyl)methacrylamide and N-(p-aminosulfonylphenyl)acrylamide.

Examples of the monomer having an active imide group in the item (3) include compounds each having in the molecule thereof one or more active imide groups represented by the above-mentioned structural formula and one or more unsaturated groups which can be polymerized with the active imide group(s). Of these compounds, preferable are compounds each having in the molecule thereof one or more active imide groups represented by the following structural formula and one or more unsaturated groups which can be polymerized with the active imide group(s):

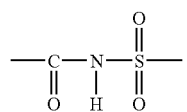

Specifically, N-(p-toluenesulfonyl)methacrylamide, N-(p-toluenesulfonyl)acrylamide and others can be preferably used.

Examples of the monomer having a carboxylic acid group in the item (4) include compounds each having in the molecule thereof one or more carboxylic acid groups and one or more unsaturated groups which can be polymerized with the carboxylic acid group(s).

Examples of the monomer having a sulfonic acid group in the item (5) include compounds each having in the molecule thereof one or more sulfonic acid groups and one or more unsaturated groups which can be polymerized with the sulfonic acid group(s).

Examples of the monomer having a phosphoric acid group in the item (6) include compounds each having in the molecule thereof one or more phosphoric acid group and one or more unsaturated groups which can be polymerized with the phophoric acid group(s).

The minimum constituent unit comprising acidic group selected from (1) to (6) composing an alkali-soluble resin to be used for the image recording material of the invention is not necessarily limited to one particular unit, but those obtained by copolymerizing two or more minimum constituent units comprising the same acidic group or two or more minimum constituent units comprising different acidic groups can also be used.

The above-mentioned copolymer contains the compound having the acidic group selected from (1) to (6) to be copolymerized in an amount preferably 10% by mole or more, more preferably 20% by mole or more. If it is less than 10% by mole, the development latitude tends to be improved insufficiently.

In the invention, in the case the compounds are copolymerized to use the obtained copolymer as the alkali-soluble resin, the compounds to be copolymerized may include other compounds without acidic group (1) to (6). Examples of the compounds without acidic group (1) to (6) inclue the following compounds (m1) to (m12), however they should not be limited to these examples. They are also useful for the copolymer components of the component (C).

(m1) Acrylic acid esters and methacrylic acid esters having aliphatic hydroxyl groups such as 2-hydroxyethyl acrylate or 2-hydroxyethyl methacrylate.

(m2) Alkyl acrylate such as methyl acrylate, ethyl acrylate, propyl acrylate, butyl acrylate, amyl acrylate, hexyl acrylate, octyl acrylate, benzyl acrylate, 2-chloroethyl acrylate, and glycidyl acrylate.

(m3) Alkyl methacrylate such as methyl methacrylate, ethyl methacrylate, propyl methacrylate, butyl methacrylate, amyl methacrylate, hexyl methacrylate, cyclohexyl methacrylate, benzyl methacrylate, 2-chloroethyl methacrylate, and glycidyl methacrylate.

(m4) Acrylamide or methacrylamide such as acrylamide, methacrylamide, N-methylol acrylamide, N-ethylacrylamide, N-hexylmethacrylamide, N-cyclohexylacrylamide, N-hydroxyethylacrylamide, N-phenylacrylamide, N-nitrophenylacrylamide, and N-ethyl-N-phenylacxrylamide.

(m5) Vinyl ethers such as ethyl vinyl ether, 2-chloroethyl vinyl ether, hydroxyethyl vinyl ether, propyl vinyl ether, butyl vinyl ether, octyl vinyl ether, and phenyl vinyl ether.

(m6) Vinyl esters such as vinyl acetate, vinyl chloroacetate, vinyl butylate, and vinyl benzoate.

(m7) Styrenes such as styrene, α-methylstyrene, methylstyrene, and chloromethylstyrene.

(m8) Vinyl ketones such as methyl vinyl ketone, ethyl vinyl ketone, propyl vinyl ketone, and phenyl vinyl ketone.

(m9) Olefins such as ethylene, propylene, isobutylene, butadiene, and isoprene.

(m10) N-vinylpyrrolidone, acrylonitrile, and methacrylonitrile.

(m11) Unsaturated imides such as maleimide, N-acryloylacrylamide, N-acetylmethacrylamide, N-propionylmethacrylamide, and N-(p-chlorobenzoyl)methacrylamide.

(m12) Unsaturated carboxylic acid such as acrylic acid, methacrylic acid, maleic anhydride, and itaconic acid.

As the alkali-soluble resin, in terms of the excellent image formability by exposure by infrared laser, it is preferable to comprise phenolic hydroxyl groups and preferable examples of the resin to be usable are novolak resins and pyrogallol acetone resins such as phenol formaldehyde resin, m-cresol formaldehyde resin, p-cresol formaldehyde resin, m-/p-mixed cresol formaldehyde resin, and phenol/cresol (either m-, p- or m-/p-mixed) mixed formaldehyde resin.

Also, as the alkali-soluble resin having phenolic hydroxyl groups, condensed copolymers of phenol and formaldehyde comprising alkyl having 3 to 8 carbon atoms such as tert-butylphenol formaldehyde resin and octylphenol formaldehyde resin as a substituent group can be exemplified as described in U.S. Pat. No. 4,123,279.

The alkali-soluble resin has a weight average molecular weight preferably 500 or higher and more preferably 1,000 to 700,000 in terms of the image formability and has a number average molecular weight preferably 500 or higher and more preferably 700 to 650,000. The dispersion (the weight average molecular weight/the number average molecular weight) is preferably 1.1 to 10.

These alkali-soluble resins are used alone and two or more of them may be used in combination. In the case of combination, as described in U.S. Pat. No. 4,123,279, condensed polymers of phenol comprising alkyl having 3 to 8 carbon atoms as a substituent group and formaldehyde such as condensed polymer of tert-butylphenol and formaldehyde, condensed polymer of octyl phenol and formaldehyde, and as described in Japanese Patent Application Laid-Open No. 2000-241972 previously applied by inventors, alkali-soluble resins having phenol structure having electron attractive group in an aromatic ring may be used in combination.

The total content of the alkali-soluble resins in the invention is preferably 30 to 98% by weight and more preferably 40 to 95% by weight in total solid components of the image recording material. It is preferable because the durability, the sensitivity, and the image formability are all excellent in the above-mentioned range.

[(B) Photothermal Conversion Substance]

The photothermal conversion substance used in the invention may be any infrared absorbent that absorbs light energy radiating rays to generate heat. The absorption wavelength of the infrared absorbent is not particularly limited. From the viewpoints of suitability to high-power lasers and being readily available, preferable examples thereof include infrared absorbing dyes and pigments having an absorption maximum in a wavelength range of 760 to 1200 nm.

The dyes may be commercially available ones and known ones described in publications such as "Dye Handbook" (edited by the Society of Synthesis Organic Chemistry, Japan, and published in 1970). Specific examples thereof include azo dyes, metal complex azo dyes, pyrazolone azo dyes, naphthoquinone dyes, anthraquinone dyes, phthalocyanine dyes, carbonium dyes, quinoneimine dyes, methine dyes, cyanine dyes, squalirium dyes, pyrylium dyes, metal thiolate complexes, oxonol dyes, diimonium dyes, aminium dyes, and croconium dyes.

Preferable examples of the dye include cyanine dyes described in JP-A Nos. 58-125246, 59-84356, 59-202829, and 60-78787; methine dyes described in JP-A Nos. 58-173696, 58-181690, and 58-194595; naphthoquinone dyes described in JP-A Nos. 58-112793, 58-224793, 59-48187, 59-73996, 60-52940, and 60-63744; squalirium dyes described in JP-A No. 58-112792; and cyanine dyes described in GB Patent No. 434,875.

Other preferable examples of the dye include near infrared absorbing sensitizers described in U.S. Pat. No. 5,156, 938; substituted arylbenzo(thio)pyrylium salts described in U.S. Pat. No. 3,881,924; trimethinethiapyrylium salts described in JP-A No. 57-142645 (U.S. Pat. No. 4,327,169); pyrylium type compounds described in JP-A Nos. 58-181051, 58-220143, 59-41363, 59-84248, 59-84249, 59-146063, and 59-146061; cyanine dyes described in JP-A No. 59-216146; pentamethinethiopyrylium salts described in U.S. Pat. No. 4,283,475; and pyrylium compounds described in Japanese Patent Application Publication (JP-B) Nos. 5-13514 and 5-19702.

Additional preferable examples of the dye include near infrared absorbing dyes represented by formulae (I) and (II) as described in U.S. Pat. No. 4,756,993.

Among these dyes, particularly preferable are cyanine dyes, phthalocyanine dyes, oxonol dyes, squalirium dyes, pyrylium salts, thiopyrylium dyes, and nickel thiolate complexes. Dyes represented by the following general formulae (a) to (e) are also preferable since such dyes are excellent in terms of photothermal conversion efficiency. The cyanine dyes represented by the following general formula (a) are most preferable for the following reason: when the dyes are used in the photosensitive composition of the invention, the dyes manifest a high degree of interaction with the alkali-soluble resin, and the dyes are also excellent in terms of stability and economy.

General formula (a)

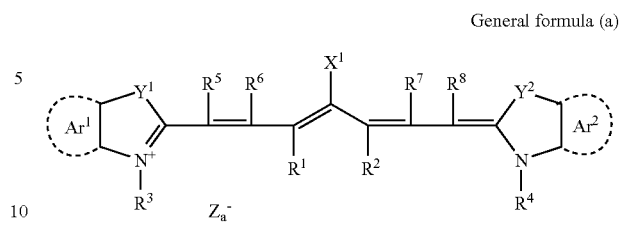

In general formula (a), $X^1$ represents a hydrogen atom, a halogen atom, —$NPh_2$, $X^2$-$L^1$ (wherein $X^2$ represents an oxygen atom or a sulfur atom, $L^1$ represents a hydrocarbon group having 1 to 12 carbon atoms, an aromatic cyclic group having a heteroatom, or a hydrocarbon group containing a heteroatom and having 1 to 12 carbon atoms, and the heteroatom referred to herein is N, S, O, a halogen atom, or Se), or a group represented by the following:

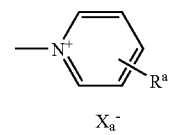

wherein $Xa^-$ has the same definition as $Za^-$, which will be described at a later time, and $R^a$ represents a substituent selected from a hydrogen atom, an alkyl group, an aryl group, a substituted or unsubstituted amino group, or a halogen atom;

$R^1$ and $R^2$ each independently represents a hydrocarbon group having 1 to 12 carbon atoms, and from the viewpoint of the storage stability of the photosensitive composition of the invention when it is used in a coating solution for forming a recording layer of a planographic printing plate precursor, it is preferable that $R^1$ and $R^2$ each independently represents a hydrocarbon group having 2 or more carbon atoms, and more preferably $R^1$ and $R^2$ are bonded to each other to form a 5-membered or 6-membered ring.

$Ar^1$ and $Ar^2$, which may be the same or different, each represent an aromatic hydrocarbon group which may have a substituent. Preferable examples of the aromatic hydrocarbon group include benzene and naphthalene rings. Preferable examples of the substituent include hydrocarbon groups having 12 or less carbon atoms, halogen atoms, and alkoxy groups having 12 or less carbon atoms.

$Y^1$ and $Y^2$, which may be the same or different, each represents a sulfur atom, or a dialkylmethylene group having 12 or less carbon atoms.

$R^3$ and $R^4$, which may be the same or different, each represents a hydrocarbon group which has 20 or less carbon atoms and may have a substituent. Preferable examples of the substituent include alkoxy groups having 12 or less carbon atoms, a carboxyl group, and a sulfo group. $R^5$, $R^6$, $R^7$ and $R^8$, which may be the same or different, each represents a hydrogen atom, or a hydrocarbon group having 12 or less carbon atoms, and since the raw materials thereof can easily be obtained, each preferably represents a hydrogen atom.

$Za^-$ represents a counter anion. However, in a case where the cyanine dye represented by general formula (a) has an anionic substituent in the structure thereof and there is accordingly no need to neutralize electric charges in the dye, $Za^-$ is not required. From the viewpoint of the storage stability of the recording layer coating solution, Za⁻ is preferably an ion of a halogen, perchlorate, tetrafluroborate, hexafluorophosphate, or sulfonate. Za⁻ is most preferably an ion of perchlorate, hexafluorophosphate, and arylsulfonic ion.

Specific examples of the cyanine dye represented by general formula (a), and which can be preferably used in the invention, include dyes in JP-A No. 2001-133969 (paragraphs [0017] to [0019]), JP-A No. 2002-40638 (paragraphs [0012] to [0038]), and JP-A No. 2002-23360 (paragraphs [0012] to [0023]), as well as dyes illustrated below.

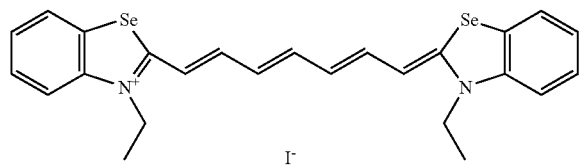

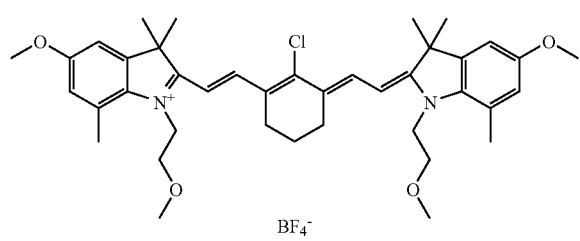

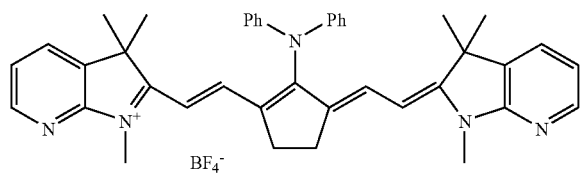

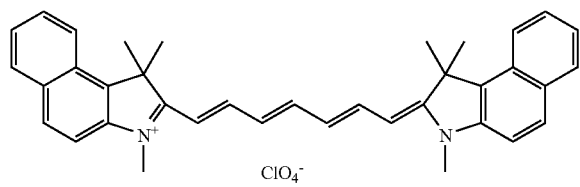

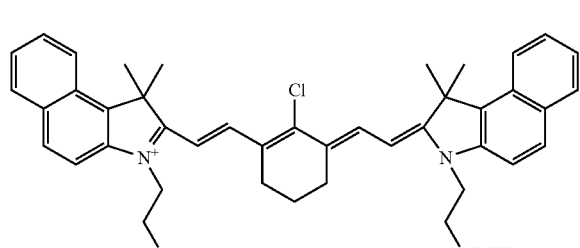

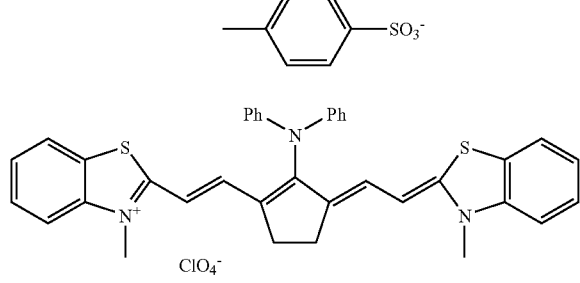

-continued

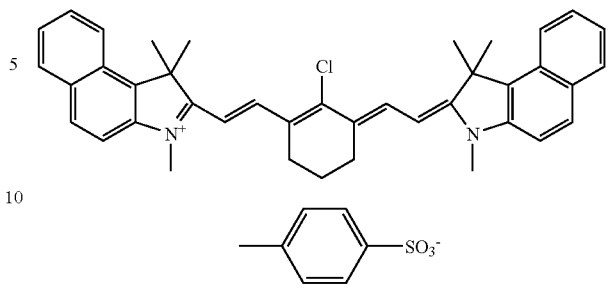

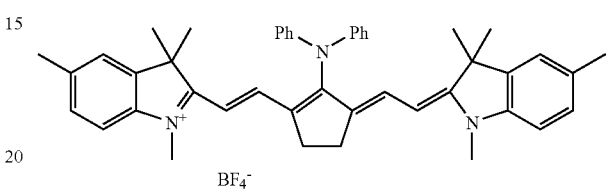

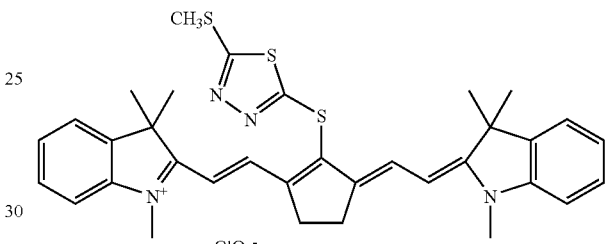

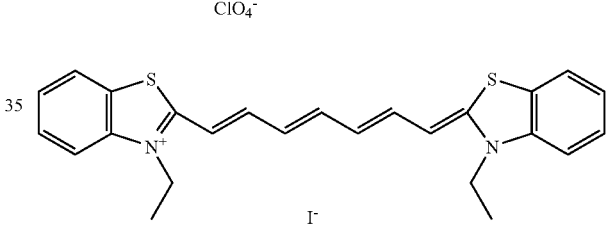

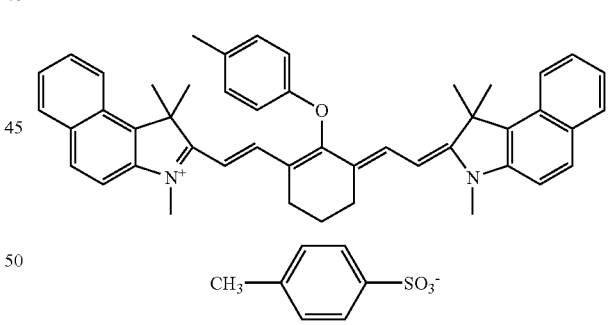

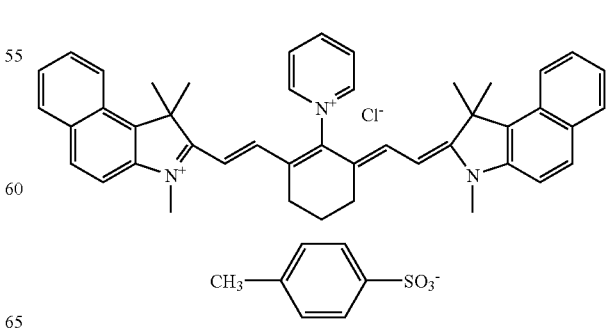

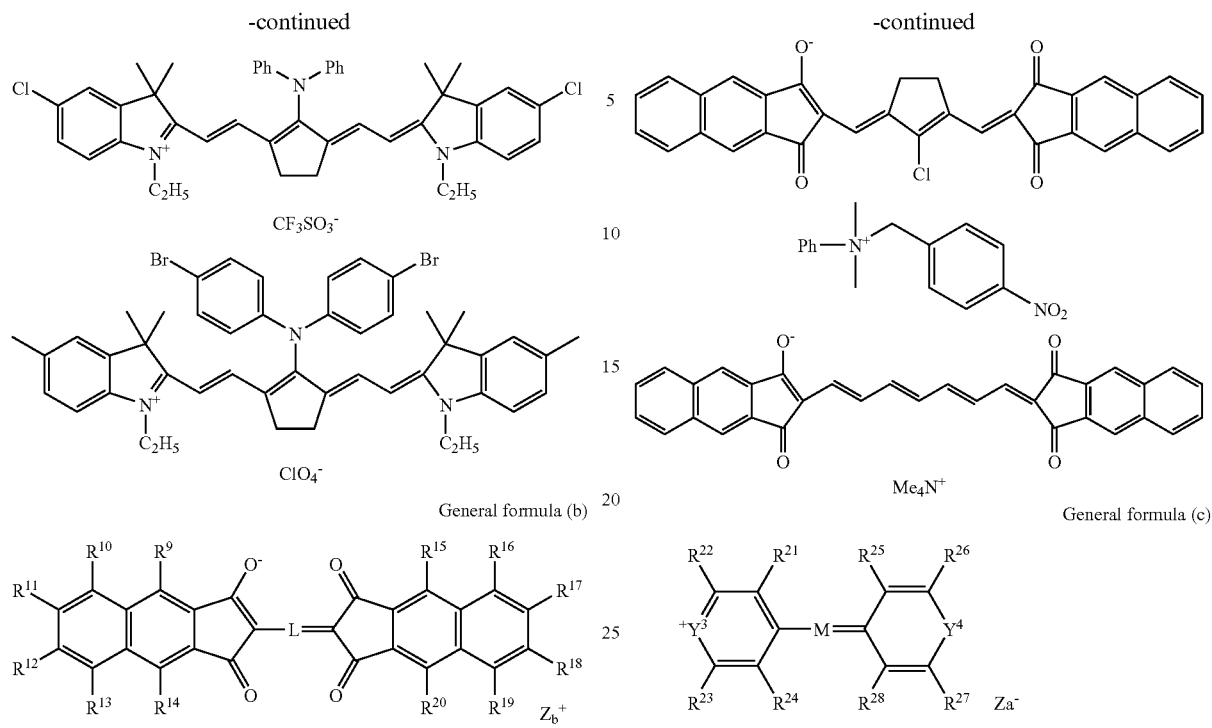

General formula (b)

General formula (c)

In general formula (b), L represents a methine chain having 7 or more conjugated carbon atoms, and the methine chain may have one or more substituent. The substituents may be bonded to each other to form a cyclic structure. $Z_b^+$ represents a counter cation. Preferable examples of the counter cation include ammonium, iodonium, sulfonium, phosphonium and pyridinium ions, and alkali metal cations (such as $Ni^+$, $K^+$ and $Li^+$).

$R^9$ to $R^{14}$ and $R^{15}$ to $R^{20}$ each independently represents a substituent selected from hydrogen atom, halogen atom, and cyano, alkyl, aryl, alkenyl, alkynyl, carbonyl, thio, sulfonyl, sulfinyl, oxy and amino groups; or a substituent obtained by combining two or three from among these substituents. Two or three out of $R^9$ to $R^{14}$ and $R^{15}$ to $R^{20}$ may be bonded to each other to form a cyclic structure.

A dye wherein L in general formula (b) represents a methine chain having 7 conjugated carbon atoms, and each of $R^9$ to $R^{14}$ and $R^{15}$ to $R^{20}$ represents a hydrogen atom, is preferable since such a dye can be easily obtained and exhibits advantageous effects.

Specific examples of the dye represented by general formula (b), and which can be preferably used in the invention, are illustrated below.

In general formula (c), $Y^3$ and $Y^4$ each independently represent an oxygen, sulfur, selenium or tellurium atom; M represents a methine chain having 5 or more conjugated carbon atoms; $R^{21}$ to $R^{24}$ and $R^{25}$ to $R^{28}$, which may be the same or different, each represents a hydrogen or halogen atom, or a cyano, alkyl, aryl, alkenyl, alkynyl, carbonyl, thio, sulfonyl, sulfinyl, oxy or amino group; and $Za^-$ represents a counter anion, and has the same meaning as $Za^-$ in general formula (a).

Specific examples of the dye which is represented by general formula (c) and which can be preferably used in the invention, are illustrated below.

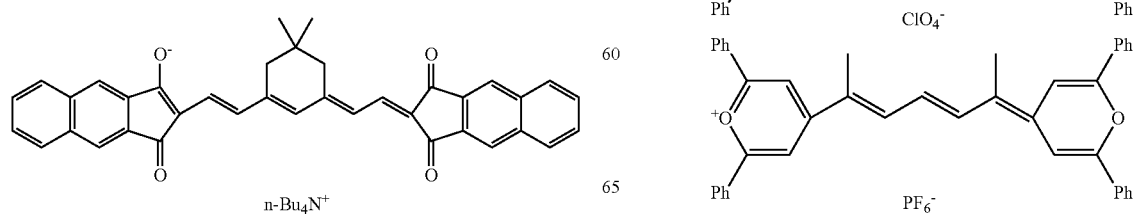

-continued

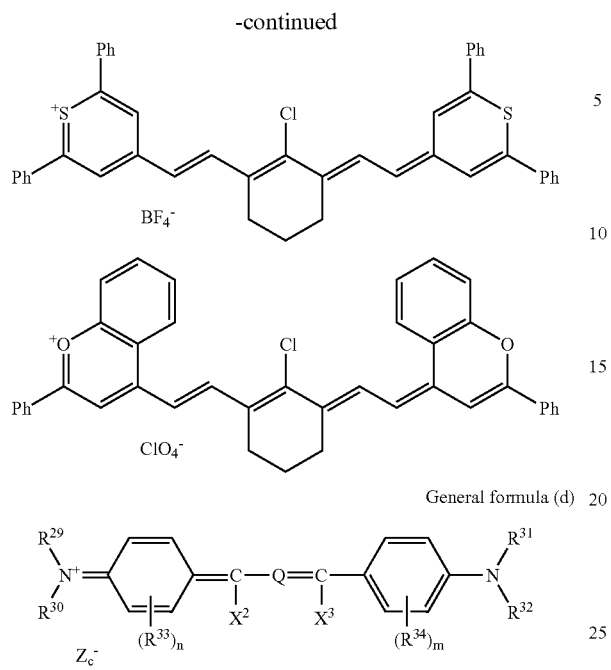

General formula (d)

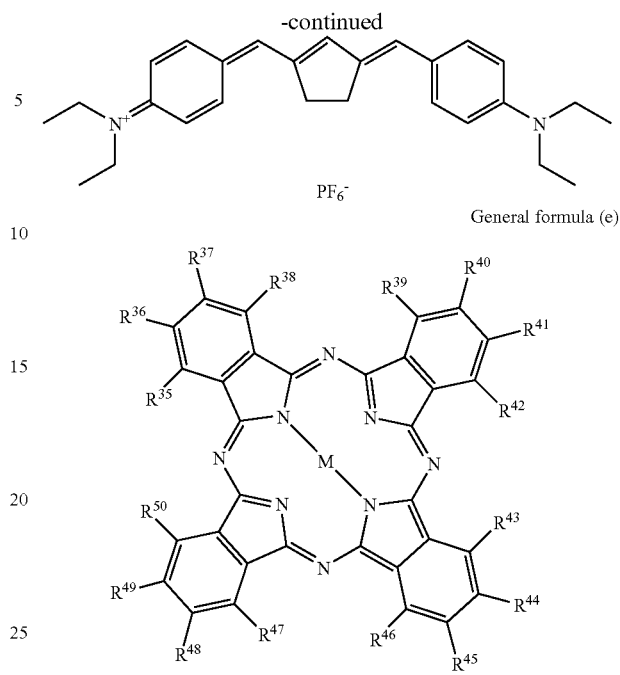

General formula (e)

In general formula (d), $R^{29}$ to $R^{31}$ each independently represents a hydrogen atom, an alkyl group or an aryl group; $R^{33}$ and $R^{34}$ each independently represents an alkyl group, a substituted oxy group, or a halogen atom; n and m each independently represents an integer of 0 to 4; and $R^{29}$ and $R^{30}$, or $R^{31}$ and $R^{32}$ may be bonded to each other to form a ring, or $R^{29}$ and/or $R^{30}$ may be bonded to $R^{33}$ to form a ring and $R^{31}$ and/or $R^{32}$ may be bonded to $R^{34}$ to form a ring. When plural $R^{33}$'s and $R^{34}$'s are present, $R^{33}$'s may be bonded to each other to form a ring, or $R^{34}$'s may be bonded to each other to form a ring.

$X^2$ and $X^3$ each independently represents a hydrogen atom, an alkyl group or an aryl group, and at least one of $X^2$ and $X^3$ represents a hydrogen atom or an alkyl group.

Q represents a trimethine group or a pentamethine group which may have a substituent, and may be combined with an bivalent linking group to form a cyclic structure. $Zc^-$ represents a counter anion and has the same meanings as $Za^-$ in general formula (a).

Specific examples of the dye represented by general formula (d) and which can be preferably used in the invention, are illustrated below.

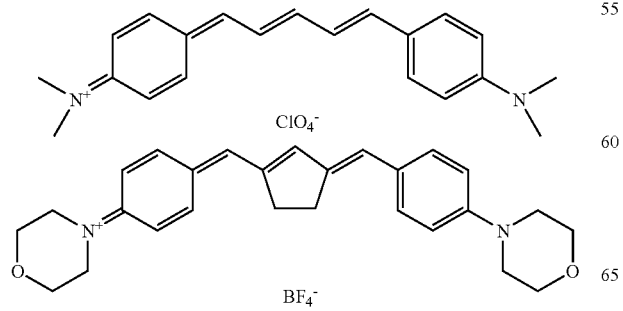

In general formula (e), $R^{35}$ to $R^{50}$ each independently represents a hydrogen or halogen atom, or a cyano, alkyl, aryl, alkenyl, alkynyl, hydroxyl, carbonyl, thio, sulfonyl, sulfinyl, oxy or amino group, or an onium salt structure, each of which may have a substituent; M represents two hydrogen atoms, a metal atom, a halo metal group, or an oxy metal group. Examples of the metal contained therein include atoms in IA, IIA, IIIB and IVB groups in the periodic table, transition metals in the first, second and third periods therein, and lanthanoid elements. Among these examples, preferable are copper, magnesium, iron, zinc, cobalt, aluminum, titanium, and vanadium.

Specific examples of the dye represented by general formula (e) and which can be preferably used in the invention, are illustrated below.

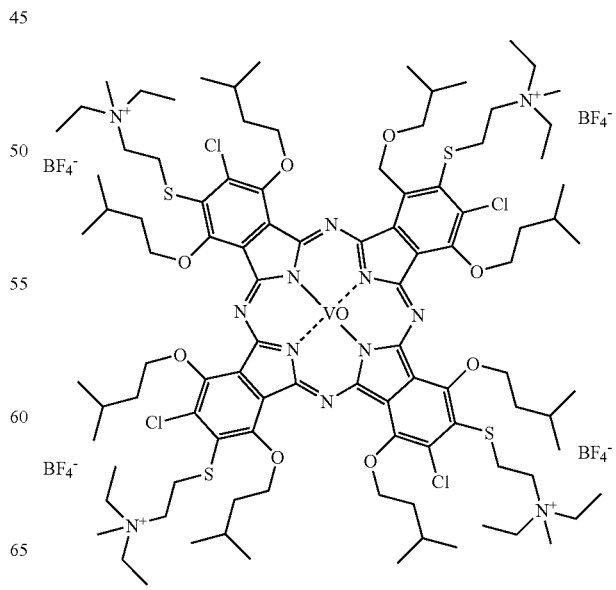

-continued

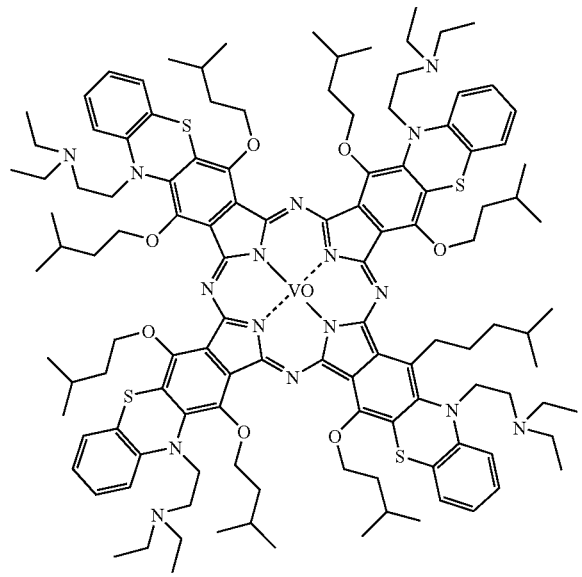

The pigment used as the infrared absorbent in the invention may be a commercially available pigment or a pigment described in publications such as Color Index (C.I.) Handbook, "Latest Pigment Handbook" (edited by Japan Pigment Technique Association, and published in 1977), "Latest Pigment Applied Technique" (by CMC Publishing Co., Ltd. in 1986), and "Printing Ink Technique" (by CMC Publishing Co., Ltd. in 1984).

Examples of the pigment include black pigments, yellow pigments, orange pigments, brown pigments, red pigments, purple pigments, blue pigments, green pigments, fluorescent pigments, metal powder pigments, and polymer-bonded dyes. Specifically, the following can be used: insoluble azo pigments, azo lake pigments, condensed azo pigments, chelate azo pigments, phthalocyanine pigments, anthraquinone pigments, perylene and perynone pigments, thioindigo pigments, quinacridone pigments, dioxazine pigments, isoindolinone pigments, quinophthalone pigments, dyeing lake pigments, azine pigments, nitroso pigments, nitro pigments, natural pigments, fluorescent pigments, inorganic pigments, and carbon black. Among these pigments, carbon black is preferable.

These pigments may be used with or without surface treatment. Examples of surface treatment include a method of coating the surface of the pigments with resin or wax; a method of adhering a surfactant onto the surface; and a method of bonding a reactive material (such as a silane coupling agent, an epoxy compound, or a polyisocyanate) to the pigment surface. The surface treatment methods are described in "Nature and Application of Metal Soap" (Saiwai Shobo), "Printing Ink Technique" (by CMC Publishing Co., Ltd. in 1984). And "Latest Pigment Applied Technique" (by CMC Publishing Co., Ltd. in 1986.

The particle size of the pigment is preferably from 0.01 to 10 μm, more preferably from 0.05 to 1 μm, and even more preferably from 0.1 to 1 μm. When a particle size is within the preferable range, a superior dispersion stability of the pigment in the photosensitive composition can be obtained, whereby, when the photosensitive composition of the invention is used for a recording layer of the photosensitive printing plate precursor, it is possible to form a homogeneous recording layer.

The method for dispersing the pigment may be a known dispersing technique used to produce ink or toner. Examples of a dispersing machine, which can be used, include an ultrasonic disperser, a sand mill, an attriter, a pearl mill, a super mill, a ball mill, an impeller, a disperser, a KD mill, a colloid mill, a dynatron, a three-roll mill, and a pressing kneader. Details are described in "Latest Pigment Applied Technique" (by CMC Publishing Co., Ltd. in 1986).

From the viewpoints of uniformity and durability of the recording film, the pigment or dye as the photothermal conversion substance can be added to the photosensitive/thermosensitive layer in a ratio of 0.01 to 50%, preferably 0.1 to 10%, and more preferably 0.5 to 10% (in the case of the dye) or 0.1 to 10% (in the case of pigment) by mass, relative to the total solid contents which constitute the photosensitive/thermosensitive layer.

In the case in which the pigment or dye as the photothermal conversion substance is used for the second layer (the top layer) of the multi-layered recording layer, the pigment or dye as the photothermal conversion substance can be added to the top layer in a ratio of 0.01 to 50%, preferably 0.1 to 40%, and more preferably 0.5 to 30%, relative to the total solid contents which constitute the top layer, because the top layer is free of the problem involved with developability at the interface with the support and there arises less restriction on the amount of addition than the second layer.

[Other Components]

The photosensitive/heat sensitive layer (recording layer) of the image recording material of the invention may contain a variety of additives, according to necessity, other than the above-mentioned components to the extent that the effects of the invention are not adversely affected.

Examples of the usable additives include so-called dissolution suppressing agents for improving the dissolution inhibiting function of alkaline water-soluble polymers (alkali-soluble resin) in a developer by addition, e.g. onium salts, aromatic sulfonic compounds, aromatic sulfonic acid ester compounds, polyfunctional amine compounds.

It is particularly preferable to add a substance which is thermally decomposable and lowers the solubility of the alkali-soluble resin substantially when not dissolved (i.e., a decomposable dissolution suppressor), such as an onium salt, o-quinonediazide compound or alkyl sulfonate, in terms of enhancing the dissolution-inhibiting function of image portions to the developer. Preferable examples of the decomposable dissolution suppressor include onium salts such as diazonium, iodonium, sulfonium, and ammonium salts; and o-quinonediazide compounds. The diazonium, iodonium, and sulfonium salts are more preferable.

Preferable examples of the onium salt used in the invention include diazonium salts described in S. I. Schlesinger, Photogr. Sci. Eng., 18, 387 (1974), T. S. Bal et al., Polymer, 21, 423 (1980), and JP-A No. 5-158230; ammonium salts described in U.S. Pat. Nos. 4,069,055 and 4,069,056, and JP-A No. 3-140140; phosphonium salts described in D. C. Necker et al., Macromolecules, 17, 2468 (1984), C. S. Wen et al., Teh, Proc. Conf. Rad. Curing ASIA, p478 Tokyo, Oct (1988), and U.S. Pat. Nos. 4,069,055 and 4,069,056; iodonium salts described in J. V. Crivello et al., Macromolecules, 10 (6), 1307 (1977), Chem. & Eng. News, Nov. 28, p31 (1988), EP No. 104,143, U.S. Pat. Nos. 5,041,358 and 4,491,628, and JP-A Nos. 2-150848 and 2-296514; sulfonium salts described in J. V. Crivello et al., Polymer J. 17,73 (1985), J. V. Crivello et al., J. Org. Chem., 43, 3055 (1978), W. R. Watt et al., J. Polymer Sci., Polymer Chem. Ed., 22, 1789 (1984), J. V. Crivello et al., Polymer Bull., 14, 279

(1985), J. V. Crivello et al., Macromolecules, 14 (5), 1141 (1981), J. V. Crivello et al., J. Polymer Sci., Polymer Chem. Ed., 17, 2877 (1979), EP Nos. 370,693, 233,567, 297,443 and 297,442, U.S. Pat. Nos. 4,933,377, 3,902,114, 5,041, 358, 4,491,628, 4,760,013, 4,734,444 and 2,833,827, and DE Patent Nos. 2,904,626, 3,604,580 and 3,604,581; selenonium salts described in J. V. Crivello et al., Macromolecules, 10 (6), 1307 (1977), J. V. Crivello et al., J. Polymer Sci., Polymer Chem. Ed., 17, 1047 (1979); arsonium salts described in C. S. Wen et al., and The Proc. Conf. Rad. Curing ASIA, p478, Tokyo, October (1988).

Among such onium salts, diazonium salts are particularly preferable from the viewpoints of both their capacity of hindering dissolution, and their thermal decomposability. The diazonium salts represented by general formula (I) in-the JP-A No. 5-158230 and the diazonium salts represented by general formula (1) in JP-A No. 11-143064 are more preferable, and diazonium salts represented by general formula (1) in the JP-A No. 11-143064, which have low absorption wavelength peaks within the visible ray range, are most preferable.

Examples of the counter ion of the onium salt include tetrafluoroboric acid, hexafluorophosphoric acid, triisopropylnaphthalenesulfonic acid, 5-nitro-o-toluenesulfonic acid, 5-sulfosalicylic acid, 2,5-dimethylbenzenesulfonic acid, 2,4,6-trimethylbenzenesulfonic acid, 2-nitrobenzenesulfonic acid, 3-chlorobenzenesulfonic acid, 3-bromobenzenesulfonic acid, 2-fluorocaprylnaphthalenesulfonic acid, dodecylbenzenesulfonic acid, 1-naphthol-5-sulfonic acid, 2-methoxy-4-hydroxy-5-benzoyl-benzenesulfonic acid, and p-toluenesulfonic acid. Among these examples, hexafluorophosphoric acid, and alkylaromatic sulfonic acids such as triisopropylnaphthalenesulfonic acid and 2,5-dimethylbezenesulfonic acid are particularly preferable.

The quinonediazide is preferably an o-quinonediazide compound. The o-quinonediazide compound used in the invention is a compound having at least one o-quinonediazide group and having an alkali-solubility increased by being thermally decomposed. The compound may be any one of compounds having various structures.

In other words, the o-quinonediazide compound assists the solubility of the photosensitive material both from the viewpoint of the effects of being thermally decomposed, and thereby losing the function of suppressing the dissolution of the binder, and the effect that the o-quinonediazide itself is changed into an alkali-soluble material.

Preferable examples of the o-quinonediazide compound used in the invention include compounds described in J. Coser, "Light-Sensitive Systems" (John Wiley & Sons. Inc.), pp. 339–352. Particularly preferable are sulfonic acid esters or sulfonamides of o-quinonediazide made to react with various aromatic polyhydroxy compounds or with aromatic amino compounds.

Further preferable examples include an ester made from benzoquinone-(1,2)-diazidesulfonic acid chloride or naphthoquinone-(1,2)-diazide-5-sulfonic acid chloride and pyrogallol-acetone resin, as described in JP-B No. 43-28403; and an ester made from benzoquinone-(1,2)-diazidesulfonic acid chloride or naphthoquinone-(1,2)-diazide-5-sulfonic acid chloride and phenol-formaldehyde resin.

Additional preferable examples include an ester made from naphthoquinone-(1,2)-diazide-4-sulfonic acid chloride and phenol-formaldehyde resin or cresol-formaldehyde resin; and an ester made from naphthoquinone-(1,2)-diazide-4-sulfonic acid chloride and pyrogallol-acetone resin.

Other useful o-quinonediazide compounds are reported in unexamined or examined patent documents, examples of which include JP-A Nos. 47-5303, 48-63802, 48-63803, 48-96575, 49-38701 and 48-13354, JP-B No. 41-11222, 45-9610 and 49-17481, U.S. Pat. Nos. 2,797,213, 3,454,400, 3,544,323, 3,573,917, 3,674,495 and 3,785,825, GB Patent Nos. 1,227,602, 1,251,345, 1,267,005, 1,329,888 and 1,330, 932, and DE Patent No. 854,890.

The amount of onium salt and/or o-quinonediazide compound added as the decomposable dissolution suppresser(s) is preferably from 1 to 10%, more preferably from 1 to 5%, and even more preferably from 1 to 2% by relative to the total solid contents of the recording layer. The onium salts and the o-quinonediazide compounds may be used either independently or in the form of mixtures of two or more thereof.

The amount of additives other than the o-quinonediazide compound added is preferably from 0.1 to 5%, more preferably from 0.1 to 2%, and even more preferably from 0.1 to 1.5% by mass. The additives and the binder used in the invention are preferably incorporated into the same layer.

A dissolution suppresser having no decomposability may be used in combination. Preferable examples thereof include sulfonic acid esters, phosphoric acid esters, aromatic carboxylic acid esters, aromatic disulfones, carboxylic acid anhydrides, aromatic ketones, aromatic aldehydes, aromatic amines, and aromatic ethers, details of which are described in JP-A No. 10-268512; acidic color-developable dyes which have a lactone skeleton, an N,N-diarylamide skeleton or a diarylmethylimino skeleton and also function as a coloring agent, details of which are described in JP-A No. 11-190903; and nonionic surfactants described, details of which-are described in JP-A No. 2000-105454.

In order to enhance sensitivity, the photosensitive composition may also contain a cyclic acid anhydride, a phenolic compound, or an organic acid.

Examples of cyclic acid anhydride include phthalic anhydride, tetrahydrophthalic anhydride, hexahydrophthalic anhydride, 3,6-endooxy-Δ4-tetrahydrophthalic anhydride, tetrachlorophthalic anhydride, maleic anhydride, chloromaleic anhydride, α-phenylmaleic anhydride, succinic anhydride, and pyromellitic anhydride which are described in U.S. Pat. No. 4,115,128.

Examples of phenolic compound include bisphenol A, p-nitrophenol, p-ethoxyphenol, 2,4,4'-trihydroxybenzophenone, 2,3,4-trihydroxybenzophenone, 4-hydroxybenzophenone, 4,4',4"-trihydroxytriphenylmethane, 4,4',3",4"-tetrahydroxy-3,5,3',5'-tetramethyltriphenylmethane.

Examples of the organic acid include sulfonic acids, sulfonic acids, alkylsulfuric acids, phosphonic acids, phosphates, and carboxylic acids, which are described in JP-A No. 60-88942 or 2-96755. Specific examples thereof include p-toluenesulfonic acid, dodecylbenzenesulfonic acid, p-toluenesulfinic acid, ethylsulfuric acid, phenylphosphonic acid, phenylphosphinic acid, phenyl phosphate, diphenyl phosphate, benzoic acid, isophthalic acid, adipic acid, p-toluic acid, 3,4-dimethoxybenzoic acid, phthalic acid, terephthalic acid, 4-cyclohexene-1,2-dicarboxylic acid, erucic acid, lauric acid, n-undecanoic acid, and ascorbic acid.

When the cyclic acid anhydride, the phenol or the organic acid is added to a recording layer of a planographic printing plate precursor, the ratio thereof in the recording layer is preferably from 0.05 to 20%, more preferably from 0.1 to 15%, and even more preferably from 0.1 to 10% by mass.

Besides the above-mentioned agents, epoxy compounds, vinyl ethers, and phenol compounds having hydroxymethyl groups as described in Japanese Patent Application Laid-Open No. 8-276558, phenol compounds having alkoxymethyl group and crosslinking compounds having the function of inhibiting dissolution in alkaline solution as described in Japanese Patent Application Laid-Open No. 11-160860 proposed by inventors may be added.

When the recording layer according to the invention is formed, in order to enhance stability in processes which are affected by developing conditions, the following can be added to the coating solution therefor: nonionic surfactants as described in JP-A Nos. 62-251740 and 3-208514; amphoteric surfactants as described in JP-A Nos. 59-121044 and 4-13149; siloxane compounds as described in EP No. 950517; and copolymers made from a fluorine-containing monomer as described in JP-A No. 11-288093.

Specific examples of nonionic surfactants include sorbitan tristearate, sorbitan monopalmitate, sorbitan trioleate, monoglyceride stearate, and polyoxyethylene nonyl phenyl ether. Specific examples of amphoteric surfactants include alkyldi(aminoethyl)glycine, alkylpolyaminoethylglycine hydrochloride, 2-alkyl-N-carboxyethyl-N-hydroxyethylimidazolinium betaine and N-tetradecyl-N,N'-betaine type surfactants (trade name: "Amolgen K", manufactured by Daiichi Kogyo Seiyaku Co., Ltd.).

The siloxane compounds are preferably block copolymers made from dimethylsiloxane and polyalkylene oxide. Specific examples thereof include polyalkylene oxide modified silicones (trade names: DBE-224, DBE-621, DBE-712, DBE-732, and DBE-534, manufactured by Chisso Corporation; trade name: Tego Glide 100, manufactured by Tego Co., Ltd.).

The content of the nonionic surfactant and/or the amphoteric surfactant in the photosensitive composition is preferably from 0.05 to 15% by mass, and more preferably from 0.1 to 5% by mass.

To the photosensitive composition of the invention may be added a printing-out agent for obtaining a visible image immediately after the photosensitive composition of the invention has been heated by exposure to light, or a dye or pigment as an image coloring agent.

A typical example of a printing-out agent is a combination of a compound which is heated by exposure to light, thereby emitting an acid (an optically acid-generating agent), and an organic dye which can form salts (salt formable organic dye).

Specific examples thereof include combinations of an o-naphthoquinonediazide-4-sulfonic acid halogenide with a salt-formable organic dye, described in JP-A Nos. 50-36209 and 53-8128; and combinations of a trihalomethyl compound with a salt-formable organic dye, described in each of JP-A Nos. 53-36223, 54-74728, 60-3626, 61-143748, 61-151644 and 63-58440.

The trihalomethyl compound is classified into an oxazol compound or a triazine compound. Both of the compounds provide excellent in stability over the passage of time and produce a vivid printed-out image.

As the image coloring agent, a dye different from the above-mentioned salt-formable organic dye may be used. Preferable examples of such a dye, and of the salt-formable organic dye, include oil-soluble dyes and basic dyes.

Specific examples thereof include Oil yellow #101, Oil Yellow #103, Oil Pink #312, Oil Green BG, Oil Blue BOS, Oil Blue #603, Oil Black BY, Oil Black BS, and Oil Black T-505 (each of which is manufactured by Orient Chemical Industries Ltd.); Victoria Pure Blue, Crystal Violet (CI42555), Methyl Violet (CI42535), Ethyl Violet, Rhodamine B (CI 145170B), Malachite Green (CI42000), and Methylene Blue (CI52015).

Dyes described in JP-A No. 62-293247 are particularly preferable. These dyes may be added to the photosensitive composition at a ratio of 0.01 to 10% by mass, and preferably 0.1 to 3% by mass, relative to the total solid contents therein.

Whenever necessary, a plasticizer may be added to the photosensitive composition of the invention to give flexibility to a coating film made from the composition. Examples of the plasticizer include oligomers and polymers of butyl phthalyl, polyethylene glycol, tributyl citrate, diethyl phthalate, dibutyl phthalate, dihexyl phthalate, dioctyl phthalate, tricresyl phosphate, tributyl phosphate, trioctyl phosphate, tetrahydrofurfuryl olete, and acrylic acid and methacrylic acid.

[Formation of Image Recording Material]

To form an image recording material of the invention, the recording material layer coating solution containing the respective components to be added to the above-mentioned recording layer in a solvent may be applied to a proper support. The recording layer may have either a monolayer structure composed of only a photosensitive/heat sensitive layer sensitive to infrared laser or a multi-layer structure composed, for example, of an alkaline developer-soluble first layer (an under layer) and an infrared laser sensitive second layer (a top layer) laminated in this order on the support. In the case the material has the multi-layer (double) layer structure, the component (C), which is an indispensable component of the invention, may be contained in either one or both of the under layer and the top layer and is preferably contained at least in the under layer in terms of the improvement of the image quality (resolution).

The image recording material of the invention may further comprise a protection layer, an undercoat layer, and a back coat layer depending on the purpose, other than the recording layers.

The solvents to be used in such cases may be ethylene dichloride, cyclohexanone, methyl ethyl ketone, methanol, ethanol, propanol, ethylene glycol monomethyl ether, 1-methoxy-2-propanol, 2-methoxyethyl acetate, 1-methoxy-2-propyl acetate, dimethoxyethane, methyl lactate, ethyl lactate, N,N-dimethylacetamide, N,N-dimethylformamide, tetramethylurea, N-methylpyrrolidone, dimethyl sulfoxide, sulfolane, γ-butyrolactone, and toluene, however the solvents should not be limited to these examples. These solvents may be used alone or in form of mixtures.

The concentration of the above-mentioned components (the solid components including the additives) in the solvent is preferable 1 to 50% by weight.

The coating amount (solid components) of the recording layer on the support after drying differs depending on the application. In the case of application for the planographic printing plate precursor, it is generally preferably 0.5 to 5.0 g/m² if it has monolayer structure. The less coating amount is, the larger apparent sensitivity is obtained, although the more deterioration in the coating property of the recording layer is resulted.

A variety of methods as the coating method can be employed, and bar coater coating, spin coating, spray coating, curtain coating, dip coating, air knife coating, blade coating, and roll coating can be exemplified.

Next, the case that the photosensitive/heat sensitive layer of the invention has a multiple (double) layer structure will be described. The recording layer having the double layer structure is composed of an alkaline solution-soluble first layer (an under layer) and a second layer (a top layer) of which solubility in the alkaline developer is increased following infrared laser exposure, and it is required to add the specific compound (C) of the invention in at least one layer of the first and the second layers.

In the case of the recording layer with such a structure, with respect to the image portions, in the state that the upper layer is unexposed, since the portions have good film formability and alkali-resistance, the surface of the image portions have high alkali-resistance. In contrast, in the exposed portions, that is non-image portions, the development resistance by the development suppressing agent is quickly cancelled, and when the upper layer is removed by development, the alkaline developer-soluble under layer having high developability is exposed. As the under layer has high solubility to an aqueous alkaline by itself, it is removed quickly to expose the hydrophilic support, whereby excellent images free from stains in the non image portions are formed.

The second (top) layer whose solubility in the alkaline developer is increased by infrared laser exposure will be described below. The top layer may have the same structure as the above-mentioned photosensitive/heat sensitive layer except that the specific compound (C) is not essential. The preferable components for the second layer is same as those for the photosensitive/heat sensitive layer. The top layer may contain the specific compound (C) or may not contain it if the under layer, which will be described later, contains the specific compound (C).

Next the under layer will be described.

The under layer of the invention is required to be soluble in the alkaline developer and in terms of the solubility, it is preferable to contain an alkali-soluble resin as a main component. As the alkali-soluble resin to be used for the under layer, examples of the alkali-soluble resin (A) described in the above-mentioned photosensitive/heat sensitive layer are preferable. Among them, in terms of the sensitivity and the image formability, resins which exhibits less interactive reaction than the alkali-soluble resin to be used for the top layer and thus is more excellent in the solubility to the alkaline developer are preferably selected. Preferable examples thereof include polyamide resin, epoxy resin, acetal resin, acrylic resin, methacrylic resin, styrene resin, and urethane resin.

The alkali-soluble resin to be used for the under layer is preferably selected from resins having low solvent solubility and not dissolved in the coating solvent at the time of the application of the top layer. Undesired compatibility in the interlayer between two layers can be suppressed by selecting such a resin. From such a viewpoint, among the above-mentioned resins, acetal resin, acrylic resin, and urethane resin are particularly preferable.

The content of the alkali-soluble resin in the under layer components of the invention is about 40 to 95% by weigh, preferably about 50 to 90% by weight, in the total solid components.

The under layer may contain a variety of additives such as an infrared ray absorbent in addition to the alkali-soluble resin. Further, the under layer is preferable to contain the specific compound (C) in terms of the effects.

In the case of addition to the under layer, the specific compound (C) of the invention is added in an amount of preferably 1 to 50% by weight, particularly preferably 1 to 30% by weight, in the total solid components in the under layer. Also, the specific compound (C) may be added to the top layer, and in such a case, the addition amount is preferably 1 to 50% by weight, particularly preferably 1 to 30% by weight, to the total solid components in the top layer.

The under layer and the top layer are preferably formed basically separately.

A method for forming the two layers separately may be a method based on the difference in the solvent solubility of the components contained in the under layer and components contained in the top layer or a method involving quickly drying out and removing the solvent after the top layer is applied.

In the case the recording layer has a multi-layer (double) layer structure, the coating amount of the under layer to be applied to the support is preferably in a range of 0.05 to 1.5 $g/m^2$, more particularly preferably in a range of 0.1 to 1.0 $g/m^2$ after drying. If it is in the above-mentioned range, excellent effects on the printing durability improvement and good image reproducibility can be achieved and high sensitive recording is made possible.

Also, the coating amount of the top layer is preferably in a range of 0.05 to 3.5 $g/m^2$, more particularly preferably in a range of 0.1 to 1.5 $g/m^2$ after drying. If the coating amount is in the above-mentioned range, high sensitive recording is made possible and excellent effects on the printing durability improvement can be achieved.

The coating amount of the total of the under layer and the top layer is preferably in a range of 0.5 to 5.0 $g/m^2$, more particularly preferably in a range of 1.0 to 3.0 $g/m^2$ after drying.

The coating solutions for the recording layers of the invention may contain a surfactant for improving the coatability, for example fluorine type surfactants described in Japanese Patent Application Laid-Open No. 62-170950. The addition amount is preferably 0.01 to 1% by weight and more preferably 0.05 to 0.5% by weight in the total solid components in the recording layer.

[Support]

The support used in the planographic printing plate precursor is a plate having dimensional stability. A plate satisfying required physical properties such as strength and flexibility can be used without any restriction. Examples thereof include paper, plastic (such as polyethylene, polypropylene or polystyrene)-laminated papers, metal plates (such as aluminum, zinc and copper plates), plastic films (such as cellulose biacetate, cellulose triacetate, cellulose propionate, cellulose lactate, cellulose acetate lactate, cellulose nitrate, polyethylene terephthalate, polyethylene, polystyrene, polypropylene, polycarbonate, and polyvinyl acetate films), and papers or plastic films on which, as described above, a metal is laminated or vapor-deposited.

The support is preferably a polyester film or an aluminum plate, and more preferably an aluminum plate, since an aluminum plate is superior in terms of dimensional stability and is also relatively inexpensive.

Preferable examples of the aluminum plate include a pure aluminum plate and alloy plates made of aluminum as a main component with a very small amount of other elements. A plastic film on which aluminum is laminated or vapor-deposited may also be used.

Examples of other elements contained in the aluminum alloys include silicon, iron, manganese, copper, magnesium, chromium, zinc, bismuth, nickel, and titanium. The content by percentage of different elements in the alloy is at most 10% by mass. A particularly preferable aluminum plate in the invention is a pure aluminum plate; however, since from the viewpoint of refining a completely pure aluminum cannot be easily produced, a very small amount of other elements may also be contained in the plate.

The aluminum plate used as the support is not specified in terms of the composition thereof. Thus, aluminum plates which are conventionally known can be appropriately used. The thickness of the aluminum plate used in the invention is from about 0.1 to 0.6 mm, preferably from 0.15 to 0.4 mm, and more preferably from 0.2 to 0.3 mm.

If necessary, prior to the surface-roughening treatment, the aluminum plate may optionally be subjected to degreasing treatment, in order to remove rolling oil or the like on the surface, with a surfactant, an organic solvent, an aqueous alkaline solution or the like.

The surface-roughening treatment of the aluminum surface can be performed by various methods such as a mechanical surface-roughening method, a method of dissolving and roughening the surface electrochemically, and a method of dissolving the surface selectively in a chemical manner.

Mechanical surface-roughening methods which can be used may be known methods, such as a ball polishing method, a brush polishing method, a blast polishing method or a buff polishing method. An electrochemical surface-roughening method may be a method of performing surface-roughening in an electrolyte of hydrochloric acid or nitric acid, by use of an alternating current or a direct current. As disclosed in JP-A No. 54-63902, a combination of the two kinds of methods may be used.

An aluminum plate whose surface is roughened as described above is if necessary subjected to alkali-etching treatment and neutralizing treatment. Thereafter, an anodizing treatment is optionally applied in order to improve the water holding capacity and wear resistance of the surface.

The electrolyte used in the anodizing treatment of the aluminum plate is any one selected from various electrolytes which can form a porous oxide film. Among which in general use are electrolytes of sulfuric acid, phosphoric acid, oxalic acid, chromic acid, or a mixed acid thereof. The concentration of the electrolyte may be appropriately decided depending on the kind of electrolyte selected.

Treatment conditions for anodization cannot be specified as a general rule since conditions vary depending on the electrolyte used; however, the following range of conditions are generally suitable: an electrolyte concentration of 1 to 80% by mass, a solution temperature of 5 to 70° C., a current density of 5 to 60 A/dm$^2$, a voltage of 1 to 100 V, and an electrolyzing time of 10 seconds to 5 minutes. If the amount of anodic oxide film is less than 1.0 g/m$^2$, printing resistance is inadequate or non-image portions of the planographic printing plate tend to become easily damaged and the so-called "blemish stains", resulting from ink adhering to damaged portions at the time of printing, are easily generated.

After the anodizing treatment, the surface of the aluminum is if necessary subjected to treatment for obtaining hydrophilicity. This securance of hydrophilicity treatment may be an alkali metal silicate (for example, an aqueous sodium silicate solution) method, as disclosed in U.S. Pat. Nos. 2,714,066, 3,181,461, 3,280,734, and 3,902,734. In this method, the support is subjected to an immersing treatment or an electrolyzing treatment with an aqueous sodium silicate solution.

In addition, the following methods may also be used: a method of treating the support with potassium fluorozirconate, as disclosed in JP-B No. 36-22063, or with polyvinyl phosphonic acid, as disclosed in U.S. Pat. Nos. 3,276,868, 4,153,461, and 4,689,272.

The planographic printing plate precursor to which the invention is applied is a precursor wherein a positive type recording layer is formed on a support. If necessary, an undercoat layer may be formed therebetween.

As components of the undercoat layer, various organic compounds can be used. Examples thereof include carboxymethylcellulose, dextrin, gum arabic, phosphonic acids having an amino group, such as 2-aminoethylphosphonic acid, organic phosphonic acids which may have a substituent, such as phenyl phosphonic acid, naphthylphosphonic acid, alkylphosphonic acid, glycerophosphonic acid, methylenediphosphonic acid and ethylenediphosphonic acid, organic phosphoric acids which may have a substituent, such as phenylphosphoric acid, naphthylphosphoric acid, alkylphosphonic acid and glycerophosphoric acid, organic phosphinic acids which may have a substituent, such as phenylphosphinic acid, naphthylphosphinic acid, alkylphosphinic acid and glycerophosphinic acid, amino acids such as glycine and β-alanine, and hydrochlorides of amines having a hydroxyl group, such as a hydrochloride of triethanolamine. These organic compounds may be used alone or in the form of a mixture made up of two or more thereof.

This organic undercoat layer may be formed by methods which can be described as follows: a method of applying onto the aluminum plate a solution wherein the above-mentioned organic compound is dissolved in water, or an organic solvent such as methanol, ethanol or methyl ethyl ketone, or a mixed solvent thereof and then drying the resultant aluminum plate, or a method of immersing the aluminum plate into a solution wherein the above-mentioned organic compound is dissolved in water, or an organic solvent such as methanol, ethanol or methyl ethyl ketone, or a mixed solvent thereof so as to adsorb the compound, washing the aluminum plate with water or the like, and then drying the resultant aluminum plate.

In the former method, the solution of the organic compound having a concentration of 0.005 to 10% by mass may be applied in various ways. In the latter method, the concentration of the organic compound in the solution is from 0.01 to 20%, preferably from 0.05 to 5%, the temperature for the immersion is from 20 to 90° C., preferably from 25 to 50° C., and the time taken for immersion is from 0.1 second to 20 minutes, preferably from 2 seconds to 1 minute.

The pH of the solution used in the above-mentioned methods can be adjusted into a range of 1 to 12 with a basic material such as ammonia, triethylamine or potassium hydroxide, or an acidic material such as hydrochloric acid or phosphoric acid. Moreover, a yellow dye may be added to the solution, in order to improve the tone reproducibility of the recording layer.

The amount of organic undercoat layer applied is suitably from 2 to 200 mg/m$^2$, preferably from 5 to 100 mg/m$^2$. When the amount applied is within the aforementioned ranges, a good effect of enhancing printing durability can be obtained.

The image recording material of the invention produced in above manner is used preferably for a planographic printing plate precursor and generally subjected to image-wise exposure and development. Hereinafter, an image recording method in the case of using the image recording material of the invention for a planographic printing plate precursor will be described.

As an exposure condition, the exposure light energy density is preferably higher than 5 kW/cm$^2$ to 10 kW/cm$^2$ in terms of the effective utilization of the heat in the image formation, and by exposure under such a condition, desirable sensitivity can be achieved. The higher the exposure energy density is, the more advantageous in terms of the sensitivity. However, in the case the exposure power density exceeds 50 kW/cm², abrasion is easily caused, which sometimes results in a trouble such as stains in optical system.

With respect to the exposure light wavelength, presently, from the viewpoint of an economic efficiency of high power laser, it is preferable to use laser in a range from near infrared rays to infrared rays. As an exposure light source, solid laser, semiconductor laser are preferable in terms of the economic efficiency and the life of the light source.

As the developer and replenisher for the planographic printing plate of the invention, aqueous solutions of a conventional alkali agent can be used.

Examples of the alkali agent include inorganic alkali salts such as sodium silicate, potassium silicate, trisodium phosphate, tripotassium phosphate, triammonium phosphate, disodium hydrogenphosphate, dipotassium hydrogenphosphate, diammonium hydrogenphosphate, sodium carbonate, potassium carbonate, ammonium carbonate, sodium hydrogencarbonate, potassium hydrogencarbonate, ammonium hydrogen carbonate, sodium borate, potassium borate, ammonium borate, sodium hydroxide, ammonium hydroxide, potassium hydroxide and lithium hydroxide; and organic alkali agents such as monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, ethyleneimine, ethylenediamine, and pyridine. These alkali agents may be used alone or in combinations of two or more thereof.

Among these alkali agents, silicates such as sodium silicate and potassium silicate are particularly preferable for the developer. This is because the developing capacity of the developer can be controlled by adjusting the ratio between silicon oxide ($SiO_2$) and alkali metal oxide ($M_2O$), which are components of any one of the silicates, and by adjusting the concentrations thereof. For example, alkali metal silicates as described in JP-A No. 54-62004 or JP-B No. 57-7427 can be effectively used.

In a case where an automatic developing machine is used to perform development, an aqueous solution having a higher alkali intensity than that of the developer (or, replenisher) can be added to the developer. It is known that this makes it possible to treat a great number of photosensitive plates without recourse to replacing the developer in the developing tank over a long period of time. This replenishing manner is also preferably used in the invention.

If necessary, various surfactants or organic solvents can be incorporated into the developer and the replenisher in order to promote and suppress development capacity, disperse development scum, and enhance the ink-affinity of image portions of the printing plate.

Preferable examples of the surfactant include anionic, cationic, nonionic and amphoteric surfactants. If necessary, the following may be added to the developer and the replenisher: a reducing agent (such as hydroquinone, resorcin, a sodium or potassium salt of an inorganic acid such as sulfurous acid or hydrogen sulfite acid), an organic carboxylic acid, an antifoaming agent, and a water softener.

The printing plate developed with the developer and replenisher described above is subsequently subjected to treatments with washing water, a rinse solution containing a surfactant and other components, and a desensitizing solution containing gum arabic and a starch derivative. For after treatment following use of the photosensitive composition of the invention as a planographic printing plate precursor, various combinations of these treatments may be employed.

In recent years, automatic developing machines for printing plate precursors have been widely used in order to rationalize and standardize plate-making processes in the plate-making and printing industries. These automatic developing machines are generally made up of a developing section and a post-processing section, and include a device for carrying printing plate precursors, various treating solution tanks, and spray devices. These machines are machines for spraying respective treating solutions, which are pumped up, onto an exposed printing plate through spray nozzles, for development, while the printing plate is transported horizontally.

Recently, a method has also attracted attention in which a printing plate precursor is immersed in treating solution tanks filled with treating solutions and conveyed by means of in-liquid guide rolls. Such automatic processing can be performed while replenishers are being replenished into the respective treating solutions in accordance with the amounts to be treated, operating times, and other factors.

A so-called use-and-dispose processing manner can also be used, in which treatments are conducted with treating solutions which in practice have yet been used.

In cases where unnecessary image portions (for example, a film edge mark of an original picture film) are present on a planographic printing plate obtained by exposing imagewise to light a planographic printing plate precursor to which the invention is applied, developing the exposed precursor, and subjecting the developed precursor to water-washing and/or rinsing and/or desensitizing treatment(s), unnecessary image portions can be erased.

The erasing is preferably performed by applying an erasing solution to unnecessary image portions, leaving the printing plate as it is for a given time, and washing the plate with water, as described in, for example, JP-B No. 2-13293. This erasing may also be performed by a method of radiating active rays introduced through an optical fiber onto the unnecessary image portions, and then developing the plate, as described in JP-A No. 59-174842.

The planographic printing plate obtained as described above is, if desired, coated with a desensitizing gum, and subsequently the plate can be made available for a printing step. When it is desired to make a planographic printing plate have a higher degree of printing resistance, burning treatment is applied to the planographic printing plate.

In a case where the planographic printing plate is subjected to the burning treatment, it is preferable that before the burning treatment takes place the plate is treated with a surface-adjusting solution as described in JP-B No. 61-2518, or JP-A Nos. 55-28062, 62-31859 or 61-159655.

This method of treatment is, for example, a method of applying the surface-adjusting solution onto the planographic printing plate with a sponge or absorbent cotton infiltrated with the solution, a method of immersing the planographic printing plate in a vat filled with the surface-adjusting solution, or a method of applying the surface-adjusting solution to the planographic printing plate with an automatic coater. In a case where after application the amount of solution applied is made uniform with a squeegee or a squeegee roller, a better result can be obtained.

In general, the amount of surface-adjusting solution applied is suitably from 0.03 to 0.8 g/m² (dry mass). If necessary the planographic printing plate onto which the surface-adjusting solution is applied can be dried, and then the plate is heated to a high temperature by means of a burning processor (for example, a burning processor (BP-1300) sold by Fuji Photo Film Co., Ltd.) or the like. In this case the heating temperature and the heating time, which depend on the kind of components forming the image, are preferably from 180 to 300° C. and from 1 to 20 minutes, respectively. By means of this treatment, the recording layer related to the invention can manifest a superior burning printing resistance.

If necessary, a planographic printing plate subjected to burning treatment can be subjected to treatments which have been conventionally conducted, such as a water-washing treatment and gum coating. However, in a case where a surface-adjusting solution containing a water soluble polymer compound or the like is used, the so-called desensitizing treatment (for example, gum coating) can be omitted. The planographic printing plate obtained as a result of such treatments is applied to an offset printing machine or to some other printing machine, and is used for printing on a great number of sheets.

EXAMPLES

Hereinafter, the present invention will be described in more details along with Examples, however the invention is not limited to these Examples. In the Examples, image recording materials of the invention were evaluated by being used as planographic printing plate precursors. These evaluations were used as evaluations of the image recording materials of the invention.

[Production of Supporting Bodies]

A support is produced by treating JIS-A-1050 aluminum sheets with 0.3 mm thickness by a combination of the following processes.

(a) Mechanical Surface Roughening Treatment

While a suspension containing a polishing agent (silica sand) with a specific gravity of 1.12 and water is supplied as a polishing slurry to a surface of each aluminum sheet, and mechanical surface roughening is carried out by rotating roller type nylon brushes. The average particle size of the polishing agent is 8 µm and maximum particle size 50 µm. The material of the nylon brushes is 6-10 nylon and hair length and hair diameters are 50 mm and 0.3 mm, respectively. The nylon brushes are produced by implanting the hairs densely in holes formed in stainless cylinders with a diameter of 300 mm. Three rotating brushes are used. Two supporting rollers (200 mm diameter) are placed below the brushes with a separation of 300 mm. The brush rollers are pushed until the load of the driving motor for rotating the brushes is increased by 7 kW or more from the load before pushing the brush rollers against the aluminum sheet. The rotation direction of the brushes is the same as the moving direction of the aluminum sheet. The rotation speed of the brushes is 200 rpm.

(b) Alkaline Etching Treatment

Etching treatment is carried out by spraying an aqueous NaOH solution (concentration 26% by weight and an aluminum ion concentration 6.5% by weight) at 70° C. to the obtained aluminum sheet in order to dissolve an amount of 6 g/m² aluminum sheet. After that, the aluminum sheet is washed with water by spraying.

(c) Desmut Treatment

Desmut treatment is carried out by spraying an aqueous solution of 1% by weight nitric acid (containing an aluminum ion concentration of 0.5% by weight) at 30° C. and then the resulting aluminum sheet is washed with water. As the aqueous nitric acid solution used for desmut, waste solution from a process of electrochemical surface roughening in an aqueous nitric acid solution by AC (alternate current) can be used.

(d) Electrochemical Surface Roughening Treatment

Electrochemical surface roughening treatment can be carried out continuously by using 60 Hz AC voltage. The electrolytic solution used in this case is an aqueous solution of nitric acid 10.5 g/L (aluminum ion 5 g/L) at 50° C. The electrochemical surface roughening can be carried out using an AC power waveform which is a trapezoidal rectangular waveform, with the time TP from a zero current value to a peak being 0.8 msec and Duty ratio 1:1, and employing a carbon electrode as an opposed electrode. Ferrite is used as an auxiliary anode. A radial cell type electrolytic bath is used.

The current density is 30 A/dm² at the peak value of the current and the total electricity quantity is 220 C/dm² when aluminum sheet is used as an anode. Five percent of the electric current flowing from the electric power was shunted through the auxiliary anode.

After that, the resulting aluminum sheet is washed with a water spray.

(e) Alkali Etching Treatment

Etching treatment can be carried out on the aluminum sheet at 32° C. by spraying a solution with sodium hydroxide concentration 26% by weight and aluminum ion concentration 6.5% by weight. By doing this 0.2 g/m² of the aluminum sheet is dissolved so as to remove the smut component of mainly aluminum hydroxide produced when carrying out the electrochemical surface roughening by using alternating current in the prior step. It also has the effect of dissolving the edge parts of formed pits so as to smooth the edge parts. After that, the aluminum sheet is washed by water spray.

(f) Desmut Treatment

Desmut treatment is carried out by spraying an aqueous solution of 15% by weight nitric acid (containing aluminum ion 4.5% by weight) at 30° C. and then the resulting aluminum sheet is washed by water spray. For the aqueous nitric acid solution used for the desmut, waste solution from the process of electrochemical surface roughening in an aqueous nitric acid solution by AC can be used.

(g) Electrochemical Surface Roughening Treatment

Electrochemical surface roughening treatment can be carried out continuously by using 60 Hz AC voltage. The electrolytic solution used in this case is an aqueous solution of hydrochloric acid 7.5 g/L (containing aluminum ion 5 g/L) at 35° C. The AC power waveform is a rectangular waveform and a carbon electrode is used as an opposed electrode for the electrochemical surface roughening treatment. Ferrite is used as an auxiliary anode. A radial cell type electrolytic bath was used.

The current density is 25 A/dm² at the peak value of the current and the total electricity quantity was 50 C/dm² when aluminum sheet is used as an anode.

After that, the resulting aluminum sheet is washed with a water spray.

(h) Alkali Etching Treatment

Etching treatment is carried out at 32° C. for aluminum sheet by spraying a solution, of sodium hydroxide concentration 26% by weight and aluminum ion concentration 6.5% by weight, to dissolve 0.10 g/m² of the aluminum sheet. This removes the smut, of which the main is component aluminum hydroxide, produced when the electrochemical surface is roughened by using alternating current in the prior step. Also it dissolves the edge parts of formed pits so as to smooth the edge parts. After that, the aluminum sheet is washed by water spray.

(i) Desmut Treatment

Desmut treatment is carried out by spraying with an aqueous solution of 25% by weight sulfuric acid (containing aluminum ion 0.5% by weight) at 60° C. and then washing the resulting aluminum sheet by water spray.

(j) Anodization Treatment

As an electrolytic solution, sulfuric acid is used. The electrolytic solution contains sulfuric acid 170 g/L (aluminum ion 0.5% by weight) and should be at 43° C. Then the aluminum sheet is washed with a water spray.

The electric current density is about 30 A/dm². Final oxide film thickness is about 2.7 g/m².

The above-mentioned processes (a) to (j) are carried out in succession and the amount of etching in process (e) is adjusted to be 3.4 g/m² to produce the supporting bodies.

Supporting bodies obtained in the above way are then successively subjected to hydrophilic and undercoating treatments as described below.

(k) Alkali Metal Silicate Treatment

Aluminum supporting bodies obtained by anodization are immersed in a treatment bath of an aqueous solution containing No. 3 sodium silicate 1% by weight for 10 seconds at 30° C. to carry out alkali metal silicate treatment (silicate treatment). After that, the support is washed by water spray. The silicate deposition is about 3.6 mg/m² at this time.

(Undercoat Layer Treatment)

Aluminum supporting bodies, after the alkali metal silicate treatment carried out as described above, are coated with an undercoat solution with the following composition and dried at 80° C. for 15 seconds. The coating amount after the drying is 15 mg/m².

<Undercoat Solution Composition>

| The following polymer compound | 0.3 g |
| Methanol | 100 g |
| Water | 1.0 g |

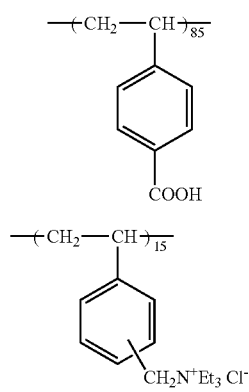

Molecular weight 28,000

Examples 1 to 5 and Comparative Examples 1 and 2

Supporting bodies thus obtained were coated with the following coating solution 1 for an image recording layer and dried at 150° C. for 1 minute in an oven to obtain a planographic printing plate precursor having a positive type image recording layer having a thickness of 2.1 g/m² when dry.

<Coating Solution 1 for Image Recording Layer>

| (C) Specific compound or comparative compound | The compound and amount described in Table 1 |
|---|---|
| m, p-cresol novolak (m/p ratio = 6/4, weight average molecular weight 7,700, containing unreacted cresol 0.5% by weight) | 0.10 g |
| methacrylic acid-n-butyl methacrylic acid copolymer (mole ratio 73:27, weight average molecular weight 51,000) | 0.06 g |
| the following infrared ray absorbent (cyanine dye A) | 0.03 g |
| 2,4,6-tris(hexyloxy)benzenediazonium 2-hydroxy-4-methoxybenzophenone-5-sulfonate | 0.01 g |
| p-toluenesulfonic acid | 0.002 g |
| Dye obtained by using 1-naphthalenesulfonic acid anion as a pair anion in Victoria Pure Blue BOH | 0.015 g |
| fluoro surfactant (Megafac F-780, manufactured Dainippon Ink and Chemicals, Inc.) | 0.02 g |
| methyl ethyl ketone | 17 g |
| 1-methoxy-2-propanol | 5 g |

Cyanine dye A

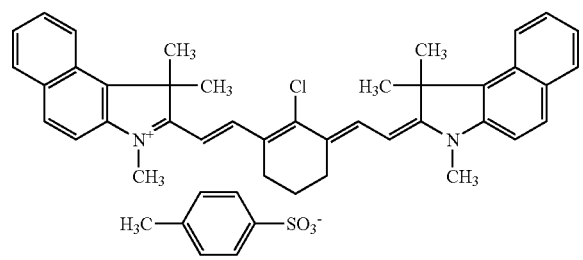

[Evaluation of Development Latitude]

Obtained planographic printing plate precursors were stored at 25° C. and 50% relative humidity for 5 days and then a test pattern was drawn as an image using a beam intensity of 9.0 W and drum rotation speed 150 rpm with a Trendsetter 3244 manufactured by Creo Inc.

After that development was carried out for 20 seconds at a constant 30° C., using a PS processor 900 H manufactured by Fuji Photo Film Co., Ltd. It was loaded with an alkaline developer of compositions A or B, as described below, and having conductivities which were adjusted by changing the dilution ratio by varying the amount of water. When doing this the development latitude was evaluated based on the difference between the highest conductivity and the lowest conductivity, wherein the highest and lowenst conductivity developers were ones which: did not cause dissolution of image portions; gave images with excellent contrast; gave images free from stains and coloration attributable to film remaining from the recording layer because of improper development. If the difference is wide, better development latitude is obtained and images with excellent contrast can be obtained. The results are shown in Table 1.

<Alkaline Developer A Composition>

| | |
|---|---|
| SiO$_2$—K$_2$O [K$_2$O/SiO$_2$ = 1/1 (mole ratio)] | 4.0% by weight |
| citric acid | 0.5% by weight |
| polyethylene glycol lauryl ether | 0.5% by weight |
| (weight average molecular weight 1,000) | |
| water | 95.0% by weight |

<Alkaline Developer B Composition>

| | |
|---|---|
| D sorbitol | 2.5% by weight |
| sodium hydroxide | 0.85% by weight |
| polyethylene glycol lauryl ether | 0.5% by weight |
| (weight average molecular weight 1,000) | |
| water | 96.15% by weight |

[Evaluation of Sensitivity]

On obtained planographic printing plate precursor, a test pattern was drawn as an image by a Trendsetter 3244 manufactured by Creo Inc. and the energy of the radiation was varied. Development was carried out using an alkaline developer having a conductivity of the mean value of the highest conductivity and the lowest conductivity (in development latitude evaluation) wherein the highest conductivity developers and the lowest conductivity developers are ones which: do not cause dissolution of the image portions; gave images with excellent contrast; and give images free from stains and coloration attributable to film remaining from the recording layer because of improper development. The exposure light quantity (the beam intensity in the case of a 150 rpm drum rotation speed) with which non-image portions could be developed using the above-mentioned developer, was measured to evaluate the sensitivity. Where the resulting numeral value is small, the sensitivity is evaluated as being high.

[Evaluation of the Image Resolution]

With the test pattern used in the above-mentioned sensitivity evaluation: dots with a surface area coverage of 0.5% were exposed at a power output of 7.5 W; these were developed; the image reproducibility was observed by observing the shape using a microscope; and the image density was measured to confirm the reproducibility of the image.

Here, a reproducibility of 100% means all of the dots were reproduced, without skipping, and a reproducibility of 0% means all of the dots were removed by the development process. Accordingly, as reproducibility gets nearer to 100%, an image with a higher contrast is obtained and the resolution is evaluated to be higher.

TABLE 1

| | (C) Specific compound/Addition amount (g) | Developer | Development latitude (mS/cm) | Sensitivity (W) | Resolution (%) |
|---|---|---|---|---|---|
| Example 1 | I - 5/0.02 | A | 7 | 6 | 98 |
| Example 2 | I - 7/0.01 | B | 5 | 5.5 | 95 |
| Example 3 | II - 16/0.005 | A | 6 | 6 | 96 |
| Example 4 | III - 18/0.015 | A | 6 | 6 | 96 |
| Example 5 | IV - 8/0.01 | B | 6 | 6 | 98 |
| Comparative Example 1 | None | A | 2 | 7.5 | 92 |
| Comparative Example 2 | None | B | 2 | 7.5 | 92 |
| Comparative Example 3 | p-acetylphenol | A | 3 | 7 | 90 |

As is clear from Table 1, the planographic printing plate precursors of Examples 1 to 5 comprising photosensitive/heat sensitive layers containing the specific compounds (C) of the invention were found to be excellent in development latitude and sensitivity, having high image resolution, and giving images with excellent contrast in both cases of using silicate type developers and non-silicate type developers.

On the other hand, the planographic printing plate precursors of Comparative Examples 1 and 2, comprising photosensitive/heat sensitive layers, containing none of the specific compounds of the invention, were found to be inferior in both development latitude and sensitivity, and gave lower resolution than those of the Examples. Also, the planographic printing plate precursor containing p-acetylphenol as an additive in place of the specific compound (C) was found to have improved sensitivity and development latitude as compared with those of Comparative Example 1 containing no additive. However the sensitivity and latitude were still at an unsatisfactory low level for practical use and the resolution was even found to be lowered.

Examples 6 to 10 and Comparative Example 4

The coating solution for an under layer with the following composition was applied to supporting bodies having undercoat layers the same as those used in Examples 1 to 5 by a wire bar with a wet coating amount of 28 ml/m$^2$ and the coating amount was adjusted to 0.8 g/m$^2$ and the resulting supporting bodies were dried at 150° C. for 60 seconds.

A coating solution 2 for an image recording layer (a top layer), with a composition as set out below, was applied to the obtained undercoat layer-bearing supporting bodies by a wire bar with a wet coating amount of 11 ml/m$^2$—giving a coating total amount of 1.0 g/m$^2$. After coating, the resulting supporting bodies were dried at 140° C. for 70 seconds in a drying oven to obtain positive type planographic printing plate precursors.

<Coating Solution for Undercoating Layer>

| | |
|---|---|
| (C) Specific compound | the compound and amount as described in Table 2 |
| copolymer of N-(p-aminosulfonylphenyl)methacrylamide, methyl methacrylate, and acrylonitrile (mole ratio 37:33:30, weight average molecular weight 64,000) | 2.133 g |
| Cyanine dye A (of a structure as defined before) | 0.098 g |
| cyclohexanedicarboxylic anhydride | 0.100 g |
| bis(hydroxymethyl)-p-cresol | 0.090 g |
| p-toluenesulfonic acid | 0.05 g |
| Dye obtained by using 6-hydroxynaphthalenesulfonic acid anion as a pair anion in Ethyl Violet | 0.100 g |
| 3-methoxy-4-diazodiphenylamine hexafluorophosphate (thermally decomposable compound) | 0.03 g |
| fluoro surfactant (Megafac F-780, manufactured by Dainippon Ink and Chemicals, Inc.) | 0.035 g |
| methyl ethyl ketone | 26.6 g |
| 1-methoxy-2-propanol | 13.6 g |
| N,N-dimethylacetamide | 13.8 g |

<Coating Solution 2 for Image Recording Layer (Top Layer)>

| | |
|---|---|
| isobutyl methacrylate-methacrylic acid copolymer (mole ratio 73:27, weight average molecular weight 49,000) | 0.040 g |
| cresol novolak resin (PR-54046, manufactured by Sumitomo Bakelite Co., Ltd.) | 0.32 g |
| Cyanine dye B (with the structure set out below) | 0.008 g |
| tetrabutylammonium bromide | 0.030 g |
| fluoro surfactant (Megafac F-780, manufactured by Dainippon Ink and Chemicals, Inc.) | 0.035 g |
| 1-methoxy-2-propanol | 40.2 g | cyanine dye B

[Evaluation of the Development Latitude and Sensitivity]

Exposure and development was carried out for planographic printing plate precursors obtained in the same manner as Examples 1 to 5, except in that the developer was changed to a diluted developer DT-1 manufactured by Fuji Photo Film Co., Ltd. and the development time was changed to be 14 seconds. The development latitude, the sensitivity, and the resolution were evaluated. The results are shown in Table 2.

TABLE 2

| | (C) Specific compound/ Addition amount (g) | Development latitude (mS/cm) | Sensitivity (W) | Resolution (%) |
|---|---|---|---|---|
| Example 6 | I - 57/0.15 | 7 | 4.5 | 95 |
| Example 7 | II - 63/0.26 | 6 | 5 | 97 |
| Example 8 | III - 50/0.03 | 6 | 5 | 95 |
| Example 9 | IV - 12/0.4 | 5 | 5 | 98 |
| Example 10 | IV - 30/0.09 | 6 | 4.5 | 98 |
| Comparative Example 4 | None | 3 | 6 | 90 |

It is clear from Table 2, that the planographic printing plate precursors of Examples 6 to 10, comprising the photosensitive/heat sensitive layers containing the specific compounds (C) of the invention, were found to: have excellent development latitude and sensitivity; give images with high resolution and excellent contrast. Therefore, it was confirmed that even if the recording layer had a double layer structure, the same effects can be achieved as those with monolayer structures. Also, in the case of the double layer structure, the planographic printing plate precursor of Comparative Example 4, comprising a photosensitive/heat sensitive layer containing no specific compound (C) of the invention, was found to be inferior in development latitude and sensitivity, and also resolution was found to be lower compared to the Examples.

Examples 11 to 13 and Comparative Example 5

The coating solution 3 for an image recording layer with the following composition was applied to supporting bodies, having undercoat layers the same as those used for Examples 1 to 5, by a wire bar with a wet coating amount of 19 cc/m². The resulting supporting bodies were then dried to obtain planographic printing plate precursors.

<Coating Solution 3 for Image Recording Layer>

| | |
|---|---|
| (C) Specific compound | the compound and amount described in Table 3 |
| copolymer of N-(p-aminosulfonylphenyl)methacrylamide, methyl methacrylate, and acrylonitrile (mole ratio 37:33:30, weight average molecular weight 64,000) | 2.370 g |
| cresol novolak | 0.300 g |
| poly(o-hydroxystyrene) (Mw = 20,000) (PR-54046, manufactured by Sumitomo Bakelite Co., Ltd.) | 0.2 g |
| Cyanine dye A (with a structure as defined before) | 0.109 g |
| tetrahydrophthalic anhydride | 0.190 g |
| p-toluenesulfonic acid | 0.008 g |
| Dye obtained by using a 6-hydroxynaphthalenesulfonic acid anion as the pair anion in Ethyl Violet | 0.100 g |
| dimyristyl 3,3'-thoidipropionate | 0.030 g |
| di-n-dodecyl 3,3'-thiodipropionate | 0.030 g |
| fluoro surfactant (Megafac F-780, manufactured by Dainippon Ink and Chemicals, Inc.) | 0.035 g |
| fluoro surfactant (Defensa MCF-312, manufactured by Dainippon Ink and Chemicals, Inc.) | 0.035 g |
| methyl ethyl ketone | 26.6 g |
| 1-methoxy-2-propanol | 13.6 g |
| N,N-dimethylacetamide | 13.8 g |

[Evaluation of the Development Latitude and Sensitivity]

Exposure and development was carried out in the same manner as Examples 1 to 5 with the obtained planographic printing plate precursors. The development latitude, sensitivity, and resolution were then evaluated. The results are shown in Table 3.

TABLE 3

| (C) Specific compound/ Addition amount (g) | Development latitude (mS/cm) | Sensitivity (W) | Resolution (%) |
| --- | --- | --- | --- |
| Example 11 | I - 12/0.15 | 6 | 4.5 | 96 |
| Example 12 | III - 46/0.02 | 5 | 5 | 98 |
| Example 13 | IV - 2/0.07 | 7 | 5 | 95 |
| Comparative Example 5 | None | 3 | 6.5 | 90 |

It is clear from Table 3 that the planographic printing plate precursors of Examples 11 to 13, comprising the photosensitive/heat sensitive layers containing the specific compounds (C) of the invention, were found to be excellent in development latitude, sensitivity, and resolution—even if acrylic polymers were used as main components of the alkali-soluble resins.

As described, according to the Examples, the image recording materials of the invention were found usable as planographic printing plate precursors.

Also, in the comparisons in Tables 1 to 3, even if the recording layers has double layer structures, similarly to cases of single layer structures, the image recording materials were found: excellent in development latitude and sensitivity; to give images with high resolution and excellent contrast. Further in cases where the recording layers were constructed with double layer structures, and the specific compounds (C) were added to the under layer, the sensitivity and the resolution were further improved. In such embodiments, the effects of the invention were found to be remarkable.

What is claimed is:

1. A positive image recording material for use with an infrared laser comprising:
a support; and, formed on the support
a photosensitive/heat sensitive layer exhibiting increased solubility to an alkaline developer following exposure with an infrared laser and containing (A) an alkali-soluble resin, (B) a photothermal conversion substance, and (C) at least one compound selected from a group of compounds defined by the formulae (I), (II), (III), and (IV)

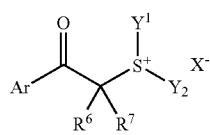

Formula (I)

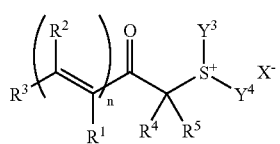

Formula (II)

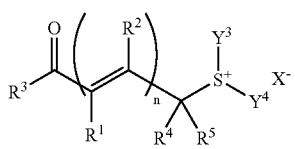

Formula (III)

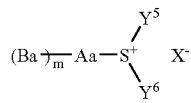

Formula (IV)

wherein, in the formula (I): Ar represents an aryl group or an aromatic group containing a hetero atom; $R^6$ represents a hydrogen atom, a cyano group, an alkyl group, or an aryl group; $R^7$ represents an alkyl group or an aryl group; $Y^1$ and $Y^2$ may be the same as or different from each other and independently represent an alkyl, an aryl, an aralkyl, or an aromatic group containing a hetero atom; $Y^1$ and $Y^2$ may be bonded to each other to form a ring; Ar may be bonded with at least one of $Y^1$ and $Y^2$ to form a ring; Ar and $R^6$ may be bonded together to form a ring; $X^-$ represents a non-nucleophilic anion; and the compound may comprise two or more groups defined by the formula (I) bonded together through linking groups at the positions Ar, $R^6$ or $R^7$ or at the positions of $Y^1$ or $Y^2$; and in the formulae (II) and (III): $R^1$ to $R^3$ may be same as or different from one another and independently represent a hydrogen atom, an alkyl, an alkenyl, an aryl, or an alkoxy group; $R^4$ and $R^5$ may be the same as or different from each other and independently represent a hydrogen atom, a cyano group, an alkyl, an aryl, or an alkoxy; $Y^3$ and $Y^4$ may be the same as or different from each other and independently represent an alkyl, an aryl, an aralkyl, or an aromatic group containing a hetero atom; n represents an integer of 1 to 4; if n is 2 or higher, a plurality of groups represented by $R^1$ and $R^2$ may be respectively the same as or different from each other; two or more groups represented by $R^1$ to $R^5$, $Y^3$ and $Y^4$ may be bonded to form a ring structure; $X^-$ represents a non-nucleophilic anion; and the compound may comprise two or more groups defined by the formulae (II) and (III) bonded together through linking groups at the position of $R^1$ to $R^5$, $Y^3$ or $Y^4$; and in the formula (IV): $Y^5$ and $Y^6$ independently represent an alkyl, an aryl, an aralkyl, a heterocyclic group, an oxoalkyl, or an oxoaralkyl group; $Y^5$ and $Y^6$ may be bonded to each other to form a ring; Aa represents a single bond or an organic group; Ba represents a group having a —CON(Ra)— bond or a group having a —SO$_2$N(Ra)— bond; Ra represents a hydrogen atom or an alkyl; m represents an integer of 1 to 3; and $X^-$ represents a non-nucleophilic anion.

2. A positive image recording material for use with an infrared laser according to claim 1, wherein the compound defined by the formula (I) is a compound defined by the following formula (Ia):

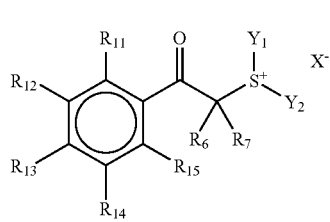

Formula (Ia)

wherein $R^{11}$ to $R^{15}$ may be the same as or different from one another and independently represent a hydrogen atom, a nitro group, a halogen atom, an alkyl, an alkoxy, an alkyloxycarbonyl, an aryl or an acylamino group; two or more of $R^{11}$ to $R^{15}$ may be bonded together to form a ring structure; $R^6$ represents a hydrogen atom, a cyano group, an alkyl, or an aryl; $R^7$ represents an alkyl or an aryl; $Y^1$ and $Y^2$ may be the same as or different from each other and independently represent an alkyl, an aryl, an aralkyl, or an aromatic group containing a hetero atom; $Y^1$ and $Y^2$ may be bonded to each other to form a ring; at least one of $R^{11}$ to $R^{15}$ may be bonded with at least one of $Y^1$ and $Y^2$ to form a ring; at least one of $R^{11}$ to $R^{15}$ may be bonded with $R^6$ to form a ring; $X^-$ represents a non-nucleophilic anion; and the compound may comprise two or more groups defined by the formula (Ia) bonded together through linking groups at the position of $R^{11}$ to $R^{15}$, $R^6$ or $R^7$ or at the position of $Y^1$ or $Y^2$.

3. A positive image recording material for use with an infrared laser according to claim 1, wherein the non-nucleophilic anion represented by $X^-$ of the compound defined by the formula (I), (II), (III), or (IV) has an anion structure selected from the group consisting of sulfonic acid anion, carboxylic acid anion, sulfonylimido anion, bis(alkylsulfonyl)imido anion, and tris(alkylsulfonyl)methyl anion.

4. A positive image recording material for use with an infrared laser according to claim 1, wherein the non-nucleophilic anion represented by $X^-$ of the compound defined by the formula (I), (II), (III), or (IV) has an anion structure selected from the group consisting of an alkanesulfonic acid anion having a fluorine atom as a substituent at α-position of the sulfonic acid, an arylsulfonic acid anion having a fluorine atom or a group comprising a fluorine as a substituent, a bis(alkylsulfonyl)imido anion having a fluorine atom as a substituent for the alkyl, and a tris(alkylsulfonyl) methide anion having a fluorine atom as a substituent for the alkyl.

5. A positive image recording material for use with an infrared laser according to claim 1, wherein the compound defined by the formula (IV) is one of the following compounds defined by the formulae (IV-A) to (IV-C)

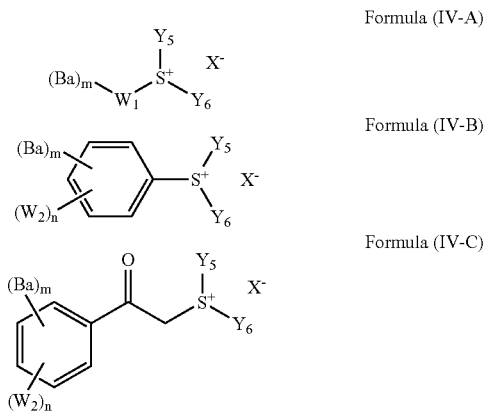

wherein, in the formulae (IV-A) to (IV-C): $Y^5$, $Y^6$, Ba, m and X—represent the same entities as described in the formula (IV); $W^1$ represents an alkylene group; each $W^2$ independently represents a hydrogen atom, an alkyl, a hydroxyl group, an alkoxy group, a cyano group, or a halogen atom; n represents an integer of 0 to 4; the alkylene group represented by $W^1$ may be a straight chain, a branched chain or a cyclic group, optionally comprising a hetero atom or an oxo group, and is an alkylene group having 1 to 20 carbon atoms such as methylene, ethylene, propylene, butylene; the alkyl group represented by $W^2$ is an alkyl group from among the possibilities for groups represented by $Y^5$ and $Y^6$; the alkoxy group represented by $W^2$ is one which comprises 1 to 8 carbon atoms such as a methoxy, ethoxy, propoxy, or butoxy group.

6. A positive image recording material for use with an infrared laser according to claim 5, wherein the compound defined by the formula (IV-A) is a compound defined by the formulae (IV-a).

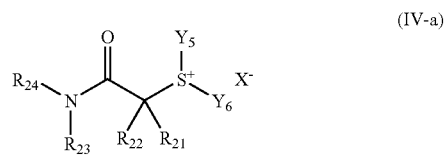

wherein, in the formula (IV-a): $Y^5$, $Y^6$, and $X^-$ represent the same entities as described in the formula (IV); $R^{21}$ and $R^{22}$ independently represent a hydrogen atom, an alkyl, an aryl or a cyano group; $R^{23}$ and $R^{24}$ independently represent a hydrogen atom, an alkyl, or an aryl; two or more of $R^{21}$ and $R^{24}$ may be bonded together to form a monocyclic group or polycyclic group, optionally containing a hetero atom; the alkyl represented by $R^{21}$ to $R^{24}$ may be a straight, branched, or cyclo-alkyl preferably having 1 to 10 carbon atoms such as methyl, ethyl, propyl, n-butyl, sec-butyl, tert-butyl, cyclobutyl, pentyl, neopentyl, cyclopentyl, hexyl, cyclohexyl, heptyl, octyl, nonyl, and decyl groups and the like, optionally comprising substituent groups; the aryl represented by $R^{21}$ to $R^{24}$ is an aryl group having 6 to 14 carbon atoms such as phenyl, tolyl, and naphthyl and the like, optionally comprising substituent groups; two or more of $R^{21}$ to $R^{24}$ may be bonded together to form a monocyclic or polycyclic group, the group formed by bonding two or more groups represented by $R^{21}$ to $R^{24}$ is an alkylene group having 4 to 10 carbon atoms such as butylene, pentylene, or hexylene groups and the like, and optionally having a hetero atom; and the compound may comprise two or more groups defined by the formulae (IV-a) bonded together through linking groups at the position of $R^{21}$ to $R^{24}$, $Y^5$, or $Y^6$.

7. A positive image recording material for use with an infrared laser comprising:
a support;
a first alkaline developer-soluble layer formed on the support; and
a second layer formed on the first layer, exhibiting improved solubility to an alkaline developer following exposure with an infrared laser,
wherein at least one of the first and second layers contains at least one compound selected from a group of compounds defined by the formulae (I), (II), (III), and (IV).

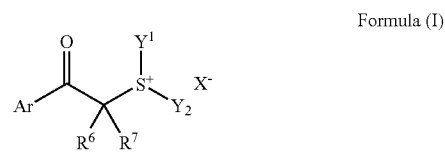

-continued

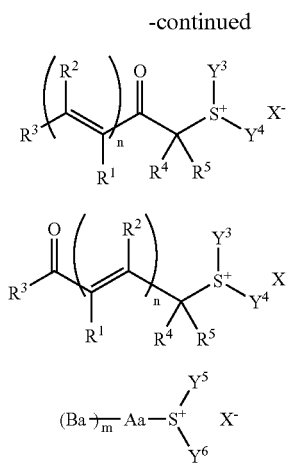

Formula (II)

Formula (III)

Formula (IV)

wherein, in the formula (I): Ar represents an aryl or an aromatic group containing a hetero atom; $R^6$ represents a hydrogen atom, a cyano group, an alkyl, or an aryl; $R^7$ represents an alkyl or an aryl; $Y^1$ and $Y^2$ may be the same as or different from each other, and independently represent an alkyl, an aryl, an aralkyl, or an aromatic group containing a hetero atom; $Y^1$ and $Y^2$ may be bonded to each other to form a ring; Ar may be bonded with at least one of $Y^1$ and $Y^2$ to form a ring; Ar and $R^6$ may be bonded together to form a ring; $X^-$ represents a non-nucleophilic anion; and the compound may comprise two or more groups defined by the formula (I) bonded together through linking groups at the position of Ar, $R^6$ or $R^7$ or at the position of $Y^1$ or $Y^2$; and in the formulae (II) and (III): $R^1$ to $R^3$ may be the same as or different from one another and independently represent a hydrogen atom, an alkyl, an alkenyl, an aryl, or an alkoxy group; $R^4$ and $R^5$ may be same as or different from each other and independently represent a hydrogen atom, a cyano group, an alkyl, an aryl, or an alkoxy group; $Y^3$ and $Y^4$ may be the same as or different from each other and independently represent an alkyl, an aryl, an aralkyl, or an aromatic group containing a hetero atom; n represents an integer of 1 to 4; if n is 2 or higher, a plurality of groups represented by $R^1$ and $R^2$ may be respectively the same or different from each other; two or more groups represented by $R^1$ to $R^5$, $Y^3$ and $Y^4$ may be bonded together to form a ring structure; $X^-$ represents a non-nucleophilic anion; and the compound may comprise two or more groups defined by the formulae (II) and (III) bonded together through linking groups at the position of $R^1$ to $R^5$, $Y^3$ or $Y^4$; and in the formula (IV): $Y^5$ and $Y^6$ independently represent an alkyl, an aryl, an aralkyl, a heteroring group, an oxoalkyl, or an oxoaralkyl group; $Y^5$ and $Y^6$ may be bonded to each other to form a ring; Aa represents a single bond or an organic group; Ba represents a group having a —CON(Ra)— bond or a group having a —SO$_2$N(Ra)— bond; Ra represents a hydrogen atom or an alkyl; m represents an integer of 1 to 3; and $X^-$ represents a non-nucleophilic anion.

8. A positive image recording material for use with an infrared laser according to claim 7, wherein the first alkaline developer-soluble layer contains at least one compound selected from a group of compounds defined by the formulae (I), (II), (III), and (IV).

9. A positive image recording material for use with an infrared laser according to claim 7, wherein the compound defined by the formula (I) is a compound defined by the following formula (Ia)

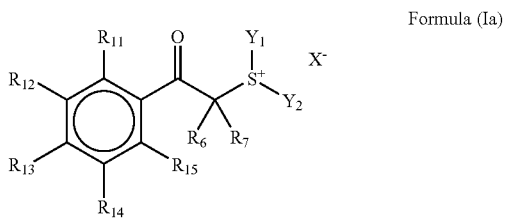

Formula (Ia)

wherein: $R^{11}$ to $R^{15}$ may be the same as or different from one another and independently represent a hydrogen atom, a nitro group, a halogen atom, an alkyl, an alkoxy group, an alkyloxycarbonyl group, an aryl or an acylamino group; two or more of $R^{11}$ to $R^{15}$ may be bonded together to form a ring structure; $R^6$ represents a hydrogen atom, a cyano group, an alkyl, or an aryl; $R^7$ represents an alkyl or an aryl; $Y^1$ and $Y^2$ may be the same as or different from each other and independently represent an alkyl, an aryl, an aralkyl, or an aromatic group containing a hetero atom; $Y^1$ and $Y^2$ may be bonded to each other to form a ring; at least one of $R^{11}$ to $R^{15}$ may be bonded together with at least one of $Y^1$ and $Y^2$ to form a ring; at least one of $R^{11}$ to $R^{15}$ may be bonded to $R^6$ to form a ring; $X^-$ represents a non-nucleophilic anion; and the compound may comprise two or more groups defined by the formula (Ia) bonded together through linking groups at the positions of $R^{11}$ to $R^{15}$, $R^6$ or $R^7$ or at the positions of $Y^1$ or $Y^2$.

10. A positive image recording material for use with an infrared laser according to claim 7, wherein the non-nucleophilic anion represented by $X^-$ of the compound defined by the formula (I), (II), (III), or (IV) has an anion structure selected from the group consisting of sulfonic acid anion, carboxylic acid anion, sulfonylimido anion, bis(alkylsulfonyl)imido anion, and tris(alkylsulfonyl)methyl anion.

11. A positive image recording material for use with an infrared laser according to claim 7, wherein the non-nucleophilic anion represented by $X^-$ of the compound defined by the formula (I), (II), (III), or (IV) has an anion structure selected from the group consisting of an alkanesulfonic acid anion having a fluorine atom as a substituent at α-position of the sulfonic acid, an arylsulfonic acid anion having a fluorine atom or a group comprising a fluorine as a substituent, a bis(alkylsulfonyl)imido anion having a fluorine atom as a substituent for the alkyl, and a tris(alkylsulfonyl) methide anion having a fluorine atom as a substituent for the alkyl.

12. A positive image recording material for use with an infrared laser according to claim 7, wherein the compound defined by the formula (IV) is one of the compounds defined by the formula (IV-A) to (IV-C) of claim 5.

13. A positive image recording material for use with an infrared laser according to claim 12, wherein the compound defined by the formula (IV-A) is the compound defined by the formula (IV-a) of claim 6.

14. A positive image recording material for use with an infrared laser according to claim 8, wherein the compound defined by the formula (I) is the compounds defined by the formula (Ia) of claim 2.

15. A positive image recording material for use with an infrared laser according to claim 8, wherein the non-nucleophilic anion represented by $X^-$ of the compound defined by the formula (I), (II), (III), or (IV) has an anion structure selected from the group consisting of sulfonic acid anion, carboxylic acid anion, sulfonylimido anion, bis(alkylsulfonyl)imido anion, and tris(alkylsulfonyl)methyl anion.

16. A positive image recording material for use with an infrared laser according to claim 8, wherein the non-nucleophilic anion represented by $X^-$ of the compound defined by the formula (I), (II), (III), or (IV) has an anion structure selected from the group consisting of an alkanesulfonic acid anion having a fluorine atom as a substituent at α-position of the sulfonic acid, an arylsulfonic acid anion having a fluorine atom or a group comprising a fluorine as a substituent, a bis(alkylsulfonyl)imido anion having a fluorine atom as a substituent for the alkyl, and a tris(alkylsulfonyl) methide anion having a fluorine atom as a substituent for the alkyl.

17. A positive image recording material for use with an infrared laser according to claim 8, wherein the compound defined by the formula (IV) is one of the compounds defined by the formula (IV-A) to (IV-C) of claim 5.

18. A positive image recording material for use with an infrared laser according to claim 17, wherein the compound defined by the formula (IV-A) is the compound defined by the formula (IV-a) of claim 6.

19. A positive image recording material for use with an infrared laser according to claim 7, wherein at least one of the first or second layers further contains a photothermal conversion substance.

* * * * *